(12) United States Patent
Hatakeyama et al.

(10) Patent No.: US 9,029,064 B2
(45) Date of Patent: May 12, 2015

(54) PATTERNING PROCESS AND RESIST COMPOSITION

(75) Inventors: Jun Hatakeyama, Joetsu (JP);
Masayoshi Sagehashi, Joetsu (JP);
Takeru Watanabe, Joetsu (JP);
Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 147 days.

(21) Appl. No.: 13/350,153

(22) Filed: Jan. 13, 2012

(65) Prior Publication Data

US 2012/0183903 A1 Jul. 19, 2012

(30) Foreign Application Priority Data

Jan. 14, 2011 (JP) ................................. 2011-005442
Aug. 30, 2011 (JP) ................................. 2011-186781

(51) Int. Cl.
*G03F 7/004* (2006.01)
*G03F 7/20* (2006.01)
*G03F 7/32* (2006.01)

(52) U.S. Cl.
CPC .............. *G03F 7/004* (2013.01); *G03F 7/2037* (2013.01); *G03F 7/325* (2013.01); *G03F 7/20* (2013.01)

(58) Field of Classification Search
None
See application file for complete search history.

(56) References Cited

U.S. PATENT DOCUMENTS

| | | | |
|---|---|---|---|
| 6,448,420 B1 | 9/2002 | Kinsho et al. | |
| 7,537,880 B2 | 5/2009 | Harada et al. | |
| 7,642,034 B2 | 1/2010 | Hatakeyama et al. | |
| 7,670,750 B2 | 3/2010 | Harada et al. | |
| 7,759,047 B2 | 7/2010 | Hatakeyama et al. | |
| 7,771,913 B2 | 8/2010 | Kaneko et al. | |
| 8,017,298 B2 | 9/2011 | Tsubaki | |
| 8,071,272 B2 | 12/2011 | Tsubaki | |
| 2001/0003640 A1* | 6/2001 | Takechi et al. | 430/270.1 |
| 2006/0051702 A1* | 3/2006 | Endo et al. | 430/270.1 |
| 2008/0090172 A1 | 4/2008 | Hatakeyama et al. | |
| 2008/0153030 A1 | 6/2008 | Kobayashi et al. | |
| 2008/0261150 A1* | 10/2008 | Tsubaki et al. | 430/270.1 |
| 2009/0208886 A1* | 8/2009 | Takemura et al. | 430/326 |
| 2010/0151388 A1* | 6/2010 | Yang et al. | 430/285.1 |

(Continued)

FOREIGN PATENT DOCUMENTS

| | | | |
|---|---|---|---|
| JP | 6-35199 A | 2/1994 | |
| JP | 9-73173 A | 3/1997 | |

(Continued)

OTHER PUBLICATIONS

S. Nakao et al., "0.12 μm Hole Pattern Formation by KrF Lithography for Giga Bit DRAM", IEEE, 1996, pp. 3.2.1-3.2.4.

(Continued)

*Primary Examiner* — Cynthia H Kelly
*Assistant Examiner* — Alyssa L Cepluch
(74) *Attorney, Agent, or Firm* — Westerman, Hattori, Daniels & Adrian, LLP

(57) ABSTRACT

A pattern is formed by applying a resist composition comprising a polymer comprising recurring units having a nitrogen atom bonded to an acid labile group, an acid generator, and an organic solvent onto a substrate, prebaking to form a resist film, exposing the resist film to high-energy radiation, baking, and developing the exposed film with an organic solvent developer to form a negative pattern wherein the unexposed region of film is dissolved and the exposed region of film is not dissolved.

17 Claims, 12 Drawing Sheets

(56) References Cited

U.S. PATENT DOCUMENTS

| | | | |
|---|---|---|---|
| 2010/0203457 A1* | 8/2010 | Hatakeyama | 430/326 |
| 2010/0323305 A1 | 12/2010 | Tsubaki et al. | |
| 2011/0033803 A1* | 2/2011 | Hatakeyama et al. | 430/285.1 |
| 2011/0183264 A1* | 7/2011 | Hashimoto et al. | 430/270.1 |
| 2012/0171612 A1* | 7/2012 | Satou et al. | 430/270.1 |
| 2012/0183904 A1* | 7/2012 | Sagehashi et al. | 430/285.1 |
| 2012/0282548 A1 | 11/2012 | Enomoto et al. | |

FOREIGN PATENT DOCUMENTS

| | | | |
|---|---|---|---|
| JP | 2000-327633 A | 11/2000 | |
| JP | 2000-330270 A | 11/2000 | |
| JP | 3790649 B2 | 6/2006 | |
| JP | 2007-297590 A | 11/2007 | |
| JP | 2008-003569 A | 1/2008 | |
| JP | 2008-081716 A | 4/2008 | |
| JP | 2008-111089 A | 5/2008 | |
| JP | 2008-111103 A | 5/2008 | |
| JP | 2008-122932 A | 5/2008 | |
| JP | 2008-158339 A | 7/2008 | |
| JP | 2008-309878 A | 12/2008 | |
| JP | 2008-309879 A | 12/2008 | |
| JP | 2010-3386 A | 1/2010 | |
| JP | 2010-111461 A | 5/2010 | |
| JP | 2010-214563 A | 9/2010 | |
| JP | 4554665 B2 | 9/2010 | |
| WO | WO 2010029907 A1 * | 3/2010 | |
| WO | WO 2011037246 A1 * | 3/2011 | |

OTHER PUBLICATIONS

H. Nakamura et al., "Contact Hole Formation by Multiple Exposure Technique in Ultra-low k1 Lithography", Proc. of SPIE, 2004, vol. 5377, pp. 255-263.

D. C. Owe-Yang et al., "Double exposure for the contact layer of the 65-nm mode", Proc. of SPIE, 2005, vol. 5753, pp. 171-180.

V. Truffert et al., "Ultimate contact hole resolution using immersion lithography with line/space imaging", Proc. of SPIE, 2009, vol. 7274, pp. 72740N-1-72740N-12.

Japanese Office Action dated Sep. 9, 2014, issued in corresponding Japanese Patent Application No. 2012-001753 (5 pages).

* cited by examiner

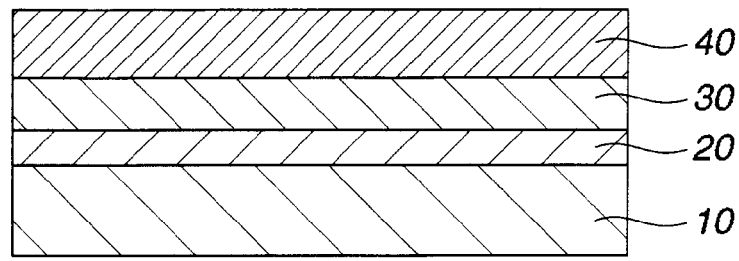
FIG.1A PHOTORESIST COATING
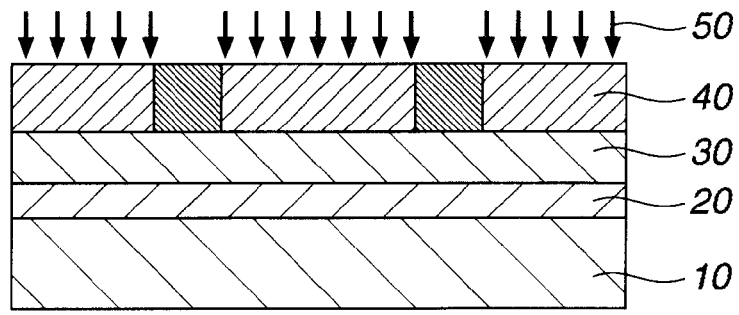
FIG.1B PHOTORESIST EXPOSURE
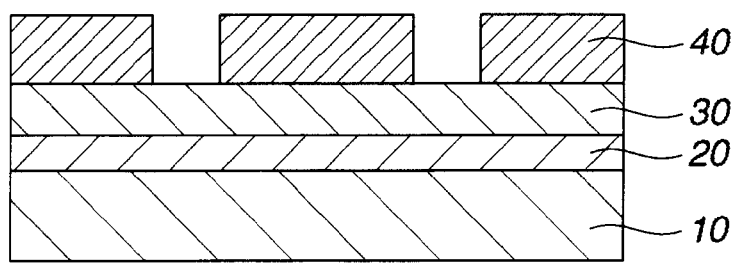
FIG.1C ORGANIC SOLVENT DEVELOPMENT

PATTERNING PROCESS AND RESIST COMPOSITION

CROSS-REFERENCE TO RELATED APPLICATION

This non-provisional application claims priority under 35 U.S.C. §119(a) on Patent Application Nos. 2011-005442 and 2011-186781 filed in Japan on Jan. 14, 2011 and Aug. 30, 2011, respectively, the entire contents of which are hereby incorporated by reference.

TECHNICAL FIELD

This invention relates to a pattern forming process involving formation of a resist film from a resist composition comprising a polymer comprising recurring units having acid labile group-bonded nitrogen, exposure of resist film, deprotection reaction with the aid of acid and heat, and development with an organic solvent to form a negative tone pattern in which the unexposed region is dissolved and the exposed region is not dissolved, and a resist composition for use in the process.

BACKGROUND ART

In the recent drive for higher integration densities and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the development of $F_2$ lithography was abandoned and instead, the ArF immersion lithography was introduced.

In the ArF immersion lithography, the space between the projection lens and the wafer is filled with water having a refractive index of 1.44. The partial fill system is compliant with high-speed scanning and when combined with a lens having a NA of 1.3, enables mass production of 45-nm node devices.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line edge or width roughness (LER, LWR) of resist film, defect-free MoSi laminate mask, reduced aberration of reflection mirror, and the like.

Another candidate for the 32-nm node lithography is high refractive index liquid immersion lithography. The development of this technology was abandoned because LUAG, a high refractive index lens candidate had a low transmittance and the refractive index of liquid did not reach the goal of 1.8.

The process that now draws attention under the above-discussed circumstances is a double patterning process involving a first set of exposure and development to form a first pattern and a second set of exposure and development to form a pattern between the first pattern features. A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

As compared with the line pattern, the hole pattern is difficult to reduce the feature size. In order for the prior art method to form fine holes, an attempt is made to form fine holes by under-exposure of a positive resist film combined with a hole pattern mask. This, however, results in the exposure margin being extremely narrowed. It is then proposed to form holes of greater size, followed by thermal flow or RELACS® method to shrink the holes as developed. However, there is a problem that control accuracy becomes lower as the pattern size after development and the size after shrinkage differ greater and the quantity of shrinkage is greater. With the hole shrinking method, the hole size can be shrunk, but the pitch cannot be narrowed.

It is then proposed in Proc. SPIE, Vol. 5377, p. 255 (2004) that a pattern of X-direction lines is formed in a positive resist film using dipole illumination, the resist pattern is cured, another resist material is coated thereon, and a pattern of Y-direction lines is formed in the other resist film using dipole illumination, leaving a lattice-like line pattern, interstices of which provide a hole pattern. Although a hole pattern can be formed at a wide margin by combining X and Y lines and using dipole illumination featuring a high contrast, it is difficult to etch vertically staged line patterns at a high dimensional accuracy. It is proposed in IEEE IEDM Tech. Digest 61 (1996) to form a hole pattern by exposure of a negative resist film through a Levenson phase shift mask of X-direction lines combined with a Levenson phase shift mask of Y-direction lines. However, the crosslinking negative resist film has the drawback that the resolving power is low as compared with the positive resist film, because the maximum resolution of ultrafine holes is determined by the bridge margin.

A hole pattern resulting from a combination of two exposures of X- and Y-direction lines and subsequent image reversal into a negative pattern can be formed using a high-contrast line pattern of light. Thus holes having a narrow pitch and fine size can be opened as compared with the prior art. This process, however, requires two exposures with mask exchange, leaving the problems of reduced throughputs and misalignment between two exposures.

Proc. SPIE Vol. 7274, p. 72740N (2009) reports three methods for forming hole patterns via image reversal. The three methods are: method (1) involving subjecting a positive resist composition to two double-dipole exposures of X and Y lines to form a dot pattern, depositing a $SiO_2$ film thereon by LPCVD, and effecting $O_2$-RIE for reversal of dots into holes; method (2) involving forming a dot pattern by the same steps as in (1), but using a resist composition designed to turn alkali-soluble and solvent-insoluble upon heating, coating a phenol-base overcoat film thereon, effecting alkaline development for image reversal to form a hole pattern; and method (3) involving double dipole exposure of a positive resist composition and organic solvent development for image reversal to form holes. This process also suffers from the problem of two exposures.

The formation of negative pattern through organic solvent development is a traditional technique. A resist composition comprising cyclized rubber is developed using an alkene such as xylene as the developer. An early chemically amplified resist composition comprising poly(t-butoxycarbonyloxystyrene) is developed with anisole as the developer to form a negative pattern.

Recently a highlight is put on the organic solvent development again. It would be desirable if a very fine hole pattern, which is not achievable with the positive tone, is resolvable through negative tone exposure. To this end, a positive resist composition featuring a high resolution is subjected to organic solvent development to form a negative pattern. An attempt to double a resolution by combining two developments, alkali development and organic solvent development is under study.

As the ArF resist composition for negative tone development with organic solvent, positive ArF resist compositions of the prior art design may be used. One typical pattern forming process is JP 4554665.

It is described in this and other patent documents that a negative tone pattern is formed by coating a resist material containing lactone as adhesive group and adapted to turn alkali soluble under the action of acid and effecting organic solvent development. Further, JP-A 2008-309878 discloses a process for forming a pattern through organic solvent development in which a protective film is applied onto a resist film. JP-A 2008-309879 discloses a topcoatless process for forming a pattern through organic solvent development in which an additive is added to a resist composition so that the additive may segregate at the resist film surface after spin coating to provide the surface with improved water repellency.

CITATION LIST

Patent Document 1: JP 4554665
Patent Document 2: JP-A 2008-309878
Patent Document 3: JP-A 2008-309879
Non-Patent Document 1: Proc. SPIE Vol. 5377, p. 255 (2004)
Non-Patent Document 2: IEEE IEDM Tech. Digest 61 (1996)
Non-Patent Document 3: Proc. SPIE Vol. 7274, p. 72740N (2009)

DISCLOSURE OF INVENTION

As compared with the positive resist system which becomes dissolvable in alkaline developer as a result of acidic carboxyl or analogous groups generating through deprotection reaction, the organic solvent development provides a low dissolution contrast. The alkaline developer provides an alkaline dissolution rate that differs by a factor of 1,000 or more between the unexposed and exposed regions whereas the organic solvent development provides a dissolution rate difference of only about 20 times. While Patent Documents 1 to 3 describe conventional photoresist compositions of the alkaline aqueous solution development type, there is a demand for a novel material which can offer a significant dissolution contrast upon organic solvent development.

When holes are formed by negative development, regions surrounding the holes receive light so that excess acid is generated therein. It is then important to control acid diffusion because the holes are not opened if the acid diffuses inside the holes.

If the acid in the exposed region evaporates during PEB and deposits on the unexposed region, the positive pattern following alkaline development suffers from such drawbacks as rounded top of its profile and film thickness loss. An inverse phenomenon occurs on negative development with organic solvent, that is, holes are not opened or the opening size of holes at the top is reduced.

Coverage of a photoresist film with a protective film is effective for preventing evaporation of acid during PEB and for avoiding any hole opening failure following negative development, but still insufficient. The problem of hole opening failure following negative development is more serious when a photoresist film is not covered with a protective film than when covered.

An object of the invention is to provide a photoresist composition capable of controlling acid diffusion and enhancing a dissolution contrast during organic solvent development, and a pattern forming process for forming a hole pattern via positive/negative reversal using a mask bearing a lattice-like pattern for forming a hole pattern through a single set of exposure and development.

The inventors have found that better results are obtained using a polymer comprising recurring units having an acid labile group-substituted amino group and preferably recurring units having a carboxyl or hydroxyl group copolymerized therewith. Specifically, the dissolution contrast during organic solvent development is improved, and acid diffusion is controlled, whereby a hole pattern can be formed via positive/negative reversal which is improved in sensitivity, resolution, focus margin, and dimensional uniformity.

In one aspect, the invention provides a pattern forming process comprising the steps of applying a resist composition comprising a polymer comprising recurring units having a nitrogen atom bonded to an acid labile group, an acid generator, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved.

Typically, the nitrogen atom bonded to an acid labile group constitutes a carbamate group.

Preferably the polymer comprises recurring units (a1) and/or (a2) represented by the general formula (1):

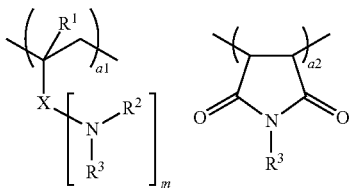
(1)

wherein $R^1$ is hydrogen or methyl, $R^2$ is hydrogen, an acid labile group or a straight, branched or cyclic $C_1$-$C_{16}$ alkyl group, or may bond with X to form a non-aromatic ring which may contain carbonyl, $R^3$ is an acid labile group, X is a single bond, phenylene, naphthylene, —C(=O)—, or —C(=O)—O—$R^4$—, $R^4$ is a straight, branched or cyclic $C_1$-$C_{10}$ alkylene group or a trivalent form of the alkylene group with one hydrogen eliminated, which may contain an ether moiety, ester moiety, —N= or —S—, or $R^4$ is a naphthylene group or a trivalent form of the naphthylene group with one hydrogen eliminated, m is 1 or 2, a1 and a2 are numbers in the range: $0 \le a1 < 1.0$, $0 \le a2 < 1.0$, and $0 < a1+a2 \le 1.0$.

In a preferred embodiment, the polymer comprises recurring units having an acid labile group-substituted carboxyl group and/or an acid labile group-substituted hydroxyl group, in addition to the recurring units having a nitrogen atom bonded to an acid labile group.

In another preferred embodiment, the composition comprises another polymer comprising recurring units having an acid labile group-substituted carboxyl group and/or an acid labile group-substituted hydroxyl group, in addition to the polymer comprising recurring units having a nitrogen atom bonded to an acid labile group.

Preferably the recurring units having an acid labile group-substituted carboxyl group or an acid labile group-substituted hydroxyl group are recurring units (b) or (c) represented by the general formula (2):

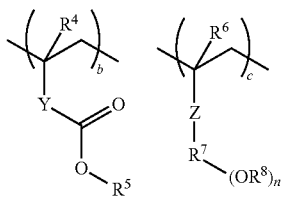
(2)

wherein $R^4$ and $R^6$ each are hydrogen or methyl, $R^5$ and $R^8$ each are an acid labile group, Y is a single bond or —C(=O)—O—$R^9$—, $R^9$ is a straight, branched or cyclic $C_1$-$C_{10}$ alkylene group which may contain an ether or ester moiety, or a naphthylene group, Z is a single bond or —C(=O)—O—, $R^7$ is a straight, branched or cyclic $C_1$-$C_{15}$ alkylene group or a trivalent form of the alkylene group with one hydrogen eliminated, which may contain an ether or ester moiety, or a naphthylene group or a trivalent form of the naphthylene group with one hydrogen eliminated, n is 1 or 2, b and c are numbers in the range: $0 \le b < 1.0$, $0 \le c < 1.0$, and $0 < b+c < 1.0$.

Preferably, the developer comprises at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Typically, the step of exposing the resist film to high-energy radiation includes ArF excimer laser lithography of 193 nm wavelength or EUV lithography of 13.5 nm wavelength.

Typically, the pattern formed by development is a trench pattern.

Preferably, in the ArF excimer laser lithography of 193 nm wavelength, a mask bearing a dotted light-shielding pattern is used, whereby a pattern of holes is formed at the dots after development.

Also preferably, in the ArF excimer laser lithography of 193 nm wavelength, a mask bearing a lattice-like light-shielding pattern is used, whereby a pattern of holes is formed at the intersections between gratings of the pattern.

More preferably, the mask bearing a dotted or lattice-like pattern is a halftone phase shift mask having a transmittance of 3 to 15%.

In a preferred embodiment, the mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed.

In a preferred embodiment, the mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

A modified embodiment is a pattern forming process as defined above, comprising the steps of applying the resist composition onto a substrate, heat treating the composition to form a resist film, forming a protective film on the resist film, exposing the resist film to high-energy radiation to define exposed and unexposed regions, heat treating, and applying a developer to the coated substrate to dissolve away the protective film and to form a negative pattern wherein the unexposed region of resist film is dissolved and the exposed region of resist film is not dissolved.

In another aspect, the invention provides a resist composition comprising a polymer, an acid generator, and an organic solvent, said polymer comprising recurring units (a1) and/or (a2) having a nitrogen atom bonded to an acid labile group, represented by the general formula (1):

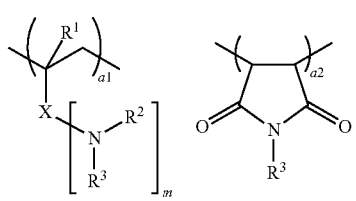
(1)

wherein $R^1$ is hydrogen or methyl, $R^2$ is hydrogen, an acid labile group or a straight, branched or cyclic $C_1$-$C_{16}$ alkyl group, or may bond with X to form a non-aromatic ring which may contain carbonyl, $R^3$ is an acid labile group, X is a single bond, phenylene, naphthylene, —C(=O)—, or —C(=O)—O—$R^4$—, $R^4$ is a straight, branched or cyclic $C_1$-$C_{10}$ alkylene group or a trivalent form of the alkylene group with one hydrogen eliminated, which may contain an ether moiety, ester moiety, —N= or —S—, or $R^4$ is a naphthylene group or a trivalent form of the naphthylene group with one hydrogen eliminated, m is 1 or 2, a1 and a2 are numbers in the range: $0 \leq a1 < 1.0$, $0 \leq a2 < 1.0$, and $0 < a1+a2 \leq 1.0$. The resist composition is to form a resist film which is subject to exposure and development with at least one developer selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

Advantageous Effects of Invention

In the process of image formation via positive/negative reversal by organic solvent development, a resist film comprising a polymer comprising recurring units having a nitrogen atom bonded to an acid labile group and an acid generator is characterized by a high dissolution contrast between the unexposed region of promoted dissolution and the exposed region of inhibited dissolution, and an effective control of acid diffusion. By subjecting this resist film to exposure through a mask bearing a dot or lattice-like pattern and organic solvent development, a fine hole pattern can be formed at a high precision of dimensional control.

BRIEF DESCRIPTION OF DRAWINGS

FIG. 1 schematically illustrates in cross-sectional views the pattern forming process of the invention, FIG. 1A shows a resist film formed on a substrate, FIG. 1B shows the resist film being exposed, and FIG. 1C shows the resist film being developed with organic solvent.

DESCRIPTION OF EMBODIMENTS

Figure 2:
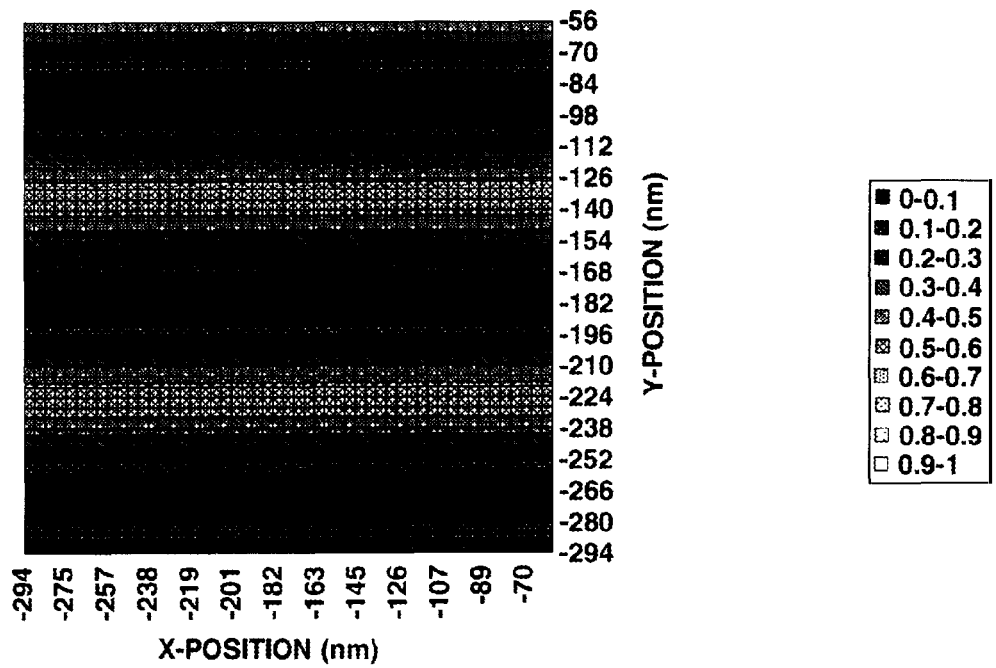
FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

The terms "a" and an herein do not denote a limitation of quantity, but rather denote the presence of at least one of the referenced item.

"Optional" or "optionally" means that the subsequently described event or circumstance may or may not occur, and that the description includes instances where the event occurs and instances where it does not.

As used herein, the notation ($C_n$-$C_m$) means a group containing from n to m carbon atoms per group.

The abbreviations and acronyms have the following meaning.

Mw: weight average molecular weight
Mn: number average molecular weight
Mw/Mn: molecular weight distribution or dispersity
GPC: gel permeation chromatography
PEB: post-exposure baking
DOF: depth of focus
PGMEA: propylene glycol monomethyl ether acetate The invention is directed to a process for forming a pattern via positive/negative reversal. Specifically the process includes the steps of applying a photoresist composition based on a polymer comprising recurring units having a nitrogen atom bonded to an acid labile group, for example, recurring units having an acid labile group-substituted amino group, onto a substrate, prebaking the composition to remove the unnecessary solvent and form a resist film, exposing the resist film to high-energy radiation through a lattice-like mask pattern, baking (PEB), and developing the exposed film with an organic solvent developer to form a negative pattern.

Preferably the recurring units having a nitrogen atom bonded to an acid labile group are recurring units (a1) and/or (a2) represented by the general formula (1).

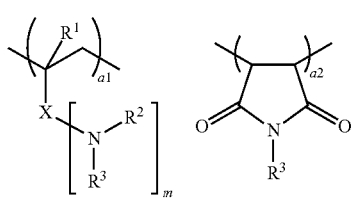

(1)

Herein $R^1$ is hydrogen or methyl. $R^2$ is hydrogen, an acid labile group or a straight, branched or cyclic $C_1$-$C_{16}$ alkyl group, or may bond with X to form a non-aromatic ring which may contain carbonyl. $R^3$ is an acid labile group. X is a single bond, phenylene, naphthylene, —C(=O)—, or —C(=O)—O—$R^4$— wherein $R^4$ is a straight, branched or cyclic $C_1$-$C_{10}$ alkylene group or a trivalent form of the alkylene group with one hydrogen eliminated, which may contain an ether moiety, ester moiety, —N= or —S—, or $R^4$ is a naphthylene group or a trivalent form of the naphthylene group with one hydrogen eliminated. The subscript m is 1 or 2, a1 and a2 are numbers in the range: 0≤a1<1.0, 0≤a2<1.0, and 0<a1+a2≤1.0.

Examples of suitable monomers from which recurring units (a1) and (a2) are derived are shown below wherein $R^1$, $R^2$, and $R^3$ are as defined above.

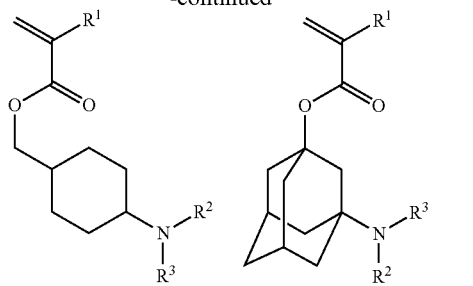

-continued

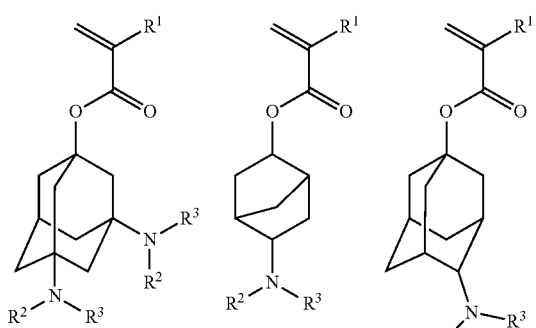

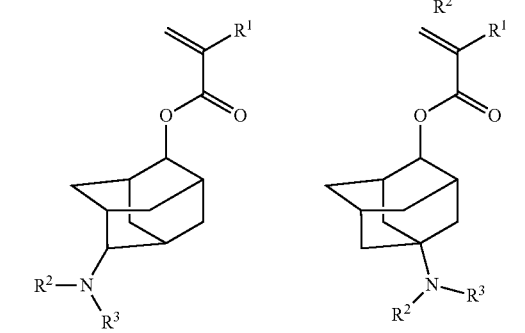

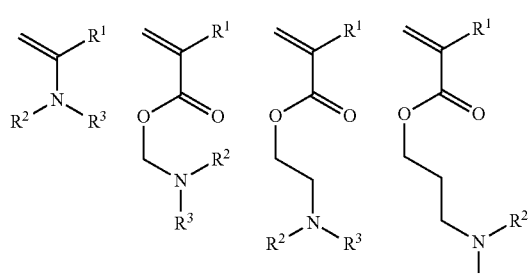

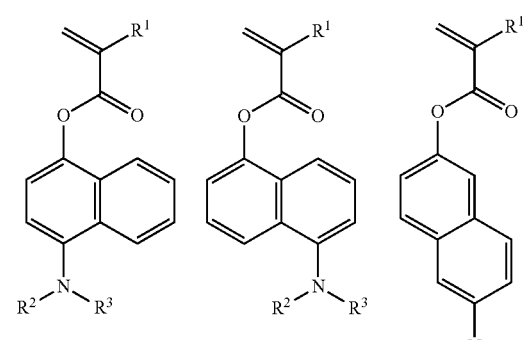

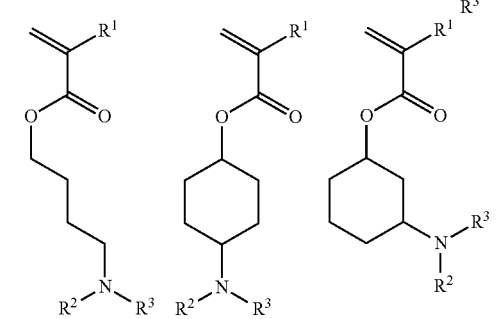

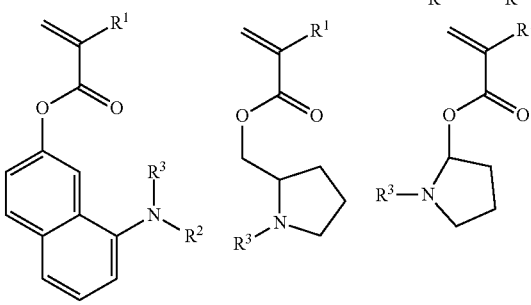

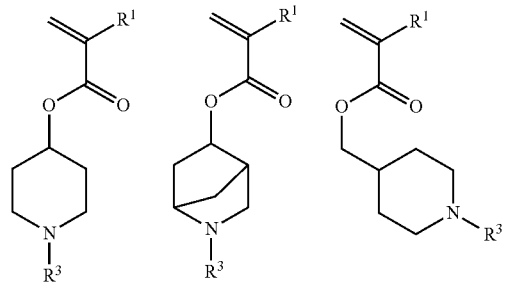

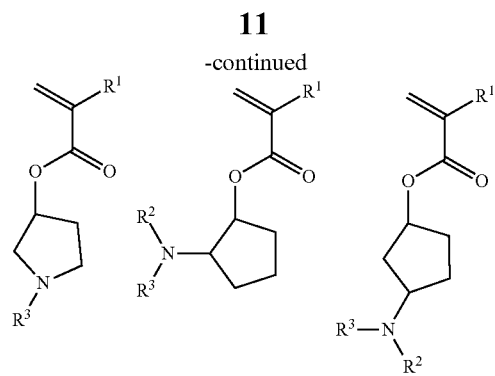
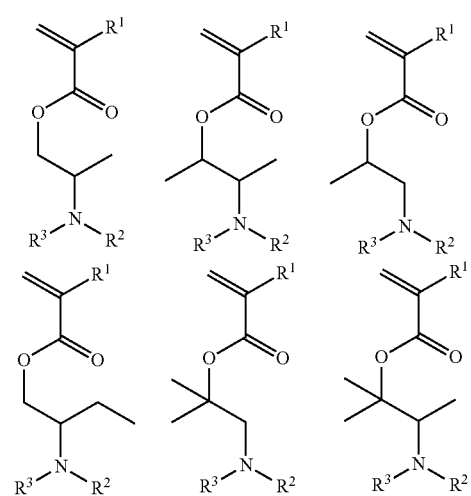
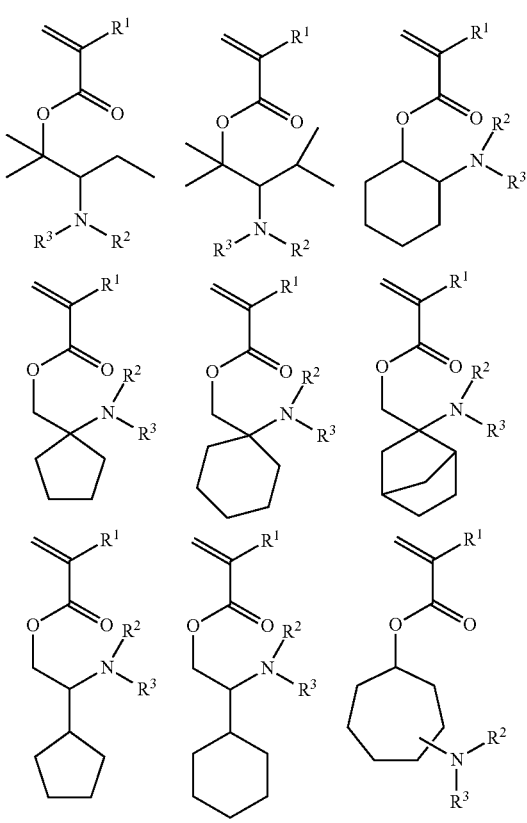
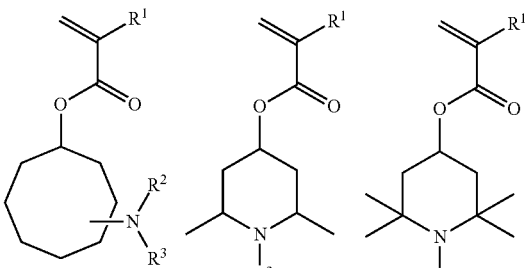
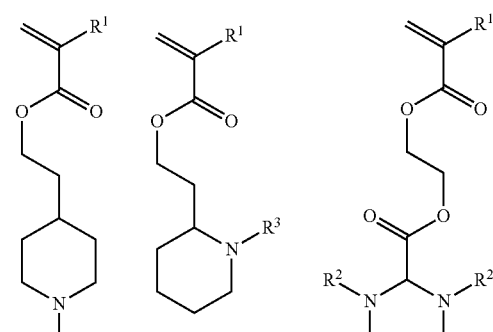
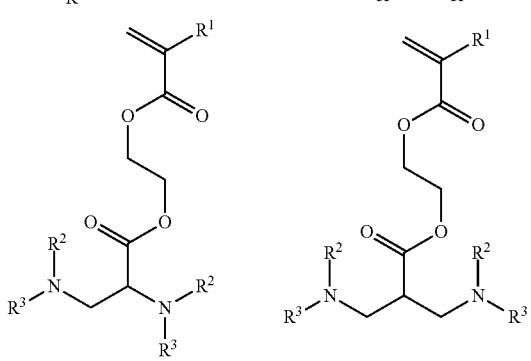
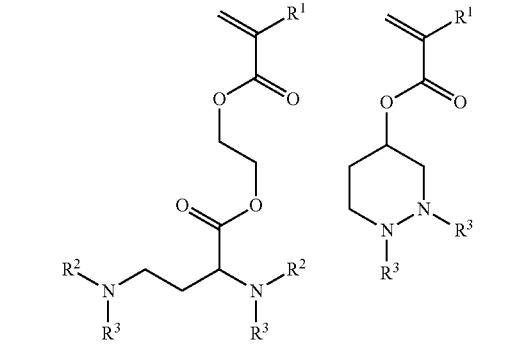
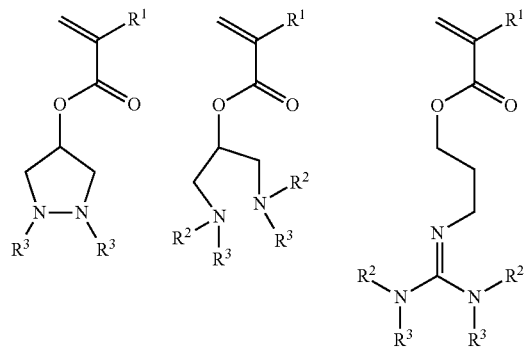

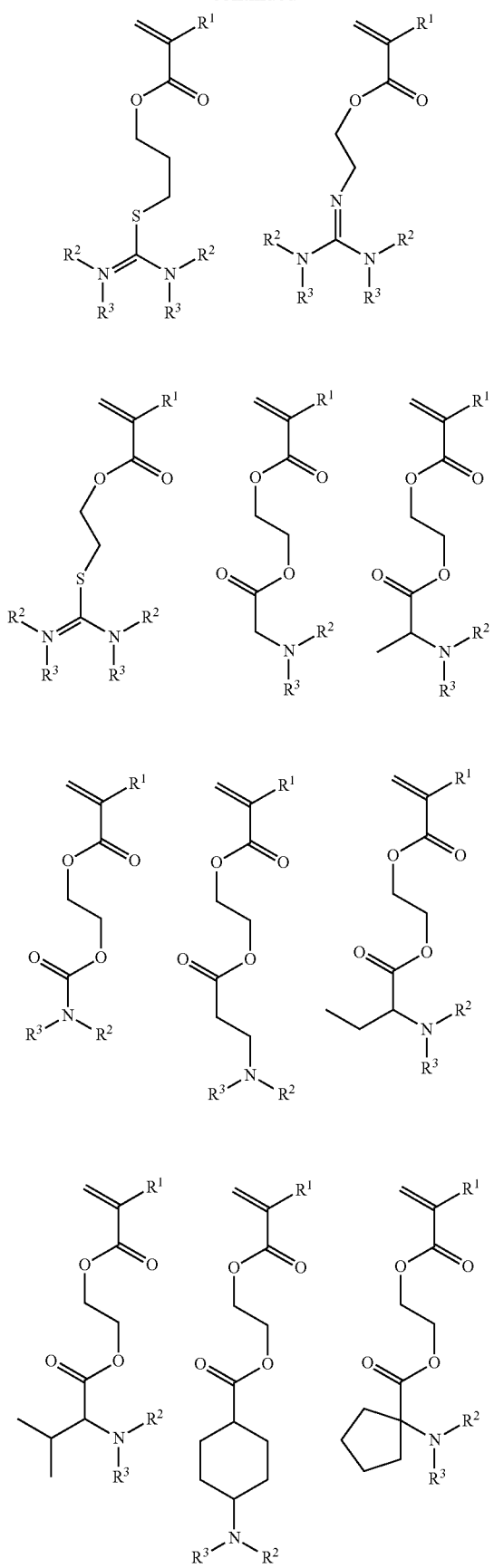
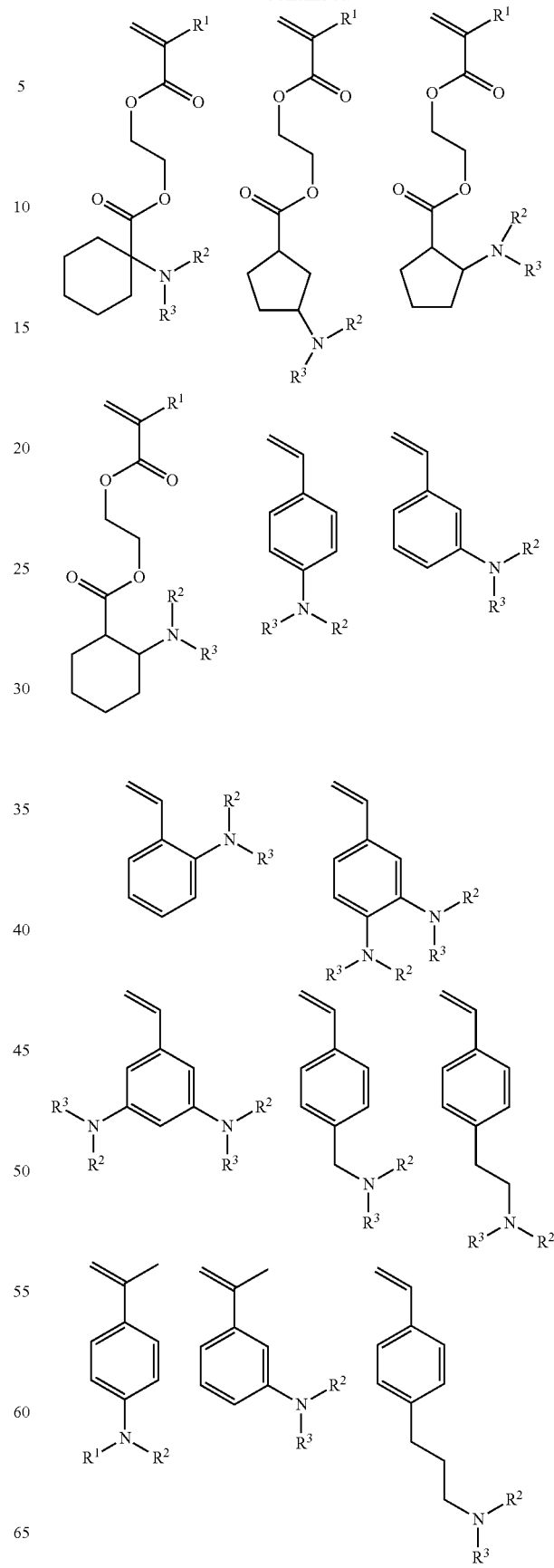

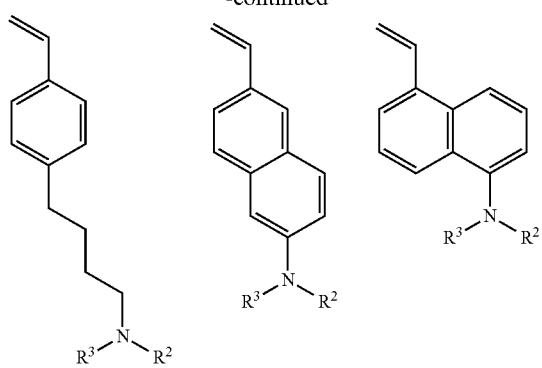
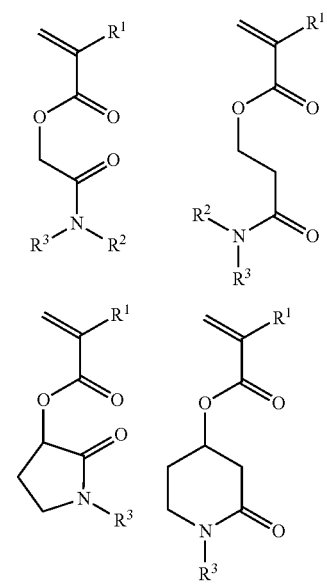
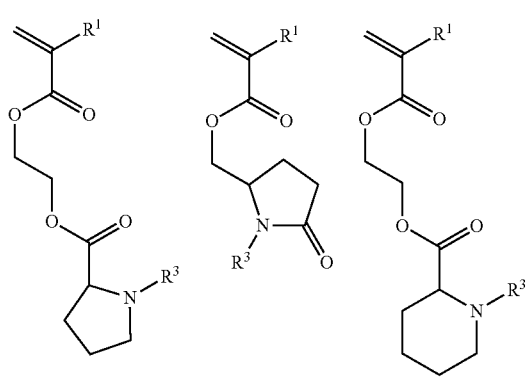
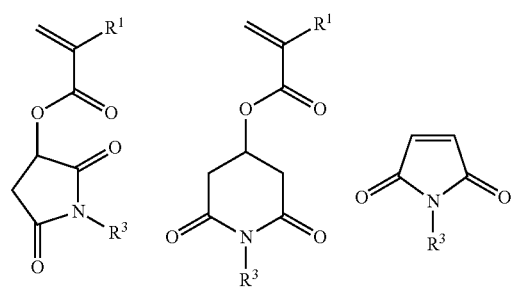
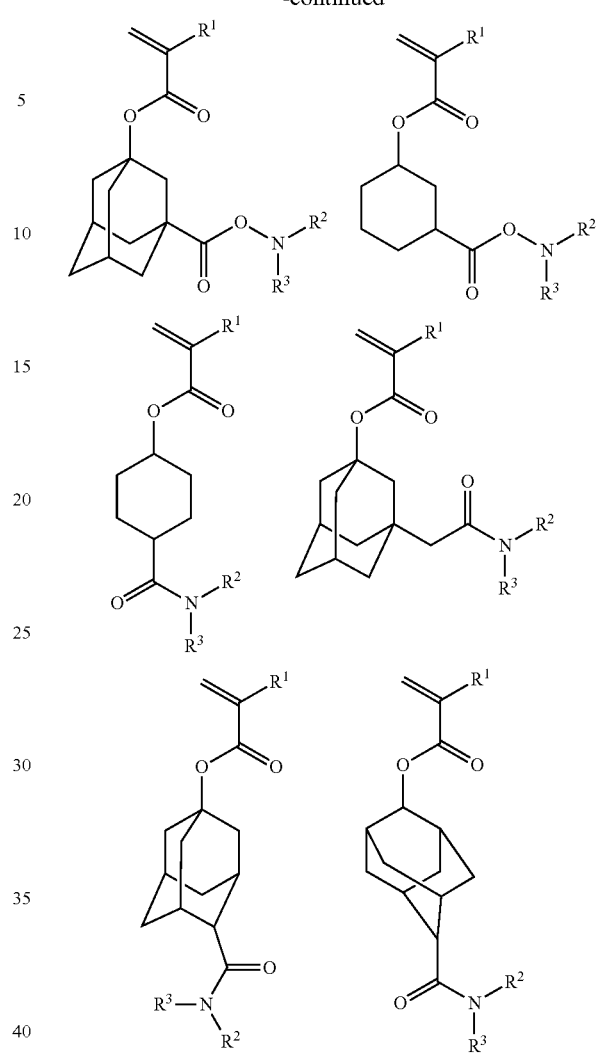
The monomer of the formula:
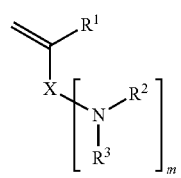
wherein $R^1$ to $R^3$, X and m are as defined above may be prepared through steps i) and ii) according to the following reaction scheme, although the synthesis method is not limited thereto.
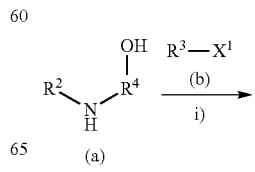

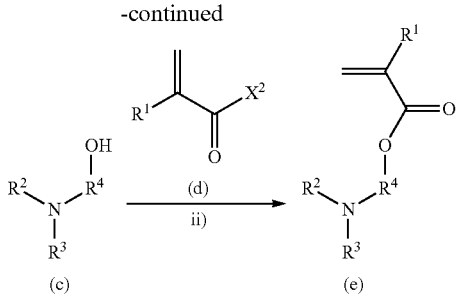

Herein R¹ to R⁴ are as defined above. X¹ is halogen or —OR' wherein R' is a group of the following formula:

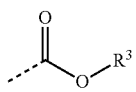

wherein the broken line denotes a valence bond. X² is halogen, hydroxyl, alkoxy or acyloxy group.

Step i) is a reaction of aminoalcohol (a) with compound (b) such as alkoxycarbonylation agent to form hydroxycarbamate (c).

The reaction of step i) may readily proceed in a well-known manner. Suitable alkoxycarbonylation agents of the formula: X¹COOR" wherein R" is an acid labile group as compound (b) include dicarbonic diesters of formula (b) wherein X¹ is —OR' and halocarbonic esters of formula (b) wherein X¹ is halogen. In one embodiment wherein the alkoxycarbonylation agent (b) used is a dicarbonic diester such as dibenzyl dicarbonate, di-tert-butyl dicarbonate, or di-tert-amyl dicarbonate, the aminoalcohol (a), the dicarbonic diester, and a base (e.g., triethylamine, pyridine, 2,6-lutidine or N,N-dimethylaniline) may be successively or simultaneously added to a solvent (e.g., methylene chloride, acetonitrile, diethyl ether, tetrahydrofuran, N,N-dimethylformamide, toluene or hexane) while the reaction system may be cooled or heated as desired. In another embodiment wherein the alkoxycarbonylation agent (b) used is a halocarbonic ester such as allyl chlorocarbonate or benzyl chlorocarbonate, the aminoalcohol (a), the halocarbonic ester, and a base (e.g., triethylamine, pyridine, 2,6-lutidine or N,N-dimethylaniline) may be successively or simultaneously added to a solventless system or to a solvent (e.g., methylene chloride, acetonitrile, diethyl ether, tetrahydrofuran, N,N-dimethylformamide, toluene or hexane) while the reaction system may be cooled or heated as desired. Although the amount of alkoxycarbonylation agent (b) used varies with conditions, the amount in one embodiment is desirably 1.0 to 5.0 moles, more desirably 1.0 to 2.0 moles per mole of aminoalcohol (a). Although the amount of the base used varies with conditions, the amount in one embodiment is desirably 0 to 5.0 moles, more desirably 0 to 2.0 moles per mole of aminoalcohol (a). The reaction time is determined as appropriate by monitoring the reaction process by gas chromatography (GC) or silica gel thin-layer chromatography (TLC) because it is desirable from the yield aspect to drive the reaction to completion. Usually the reaction time is about 0.5 to about 24 hours. The desired hydroxycarbamate (c) may be recovered from the reaction mixture by ordinary aqueous work-up. If necessary, the compound (c) may be purified by standard techniques like distillation, chromatography and recrystallization.

Step ii) is a reaction of hydroxycarbamate (c) with esterifying agent (d) to form nitrogen-containing monomer (e).

The reaction of step ii) may readily proceed in a well-known manner. Suitable esterifying agents (d) include acid chlorides of formula (d) wherein X² is chlorine, carboxylic acids of formula (d) wherein X² is hydroxyl, and acid anhydrides of formula (d) wherein X² is acyloxy. In one embodiment wherein the esterifying agent (d) used is an acid chloride such as methacryloyl chloride, the hydroxycarbamate (c), the acid chloride, and a base (e.g., triethylamine, pyridine or 4-dimethylaminopyridine) may be successively or simultaneously added to a solventless system or to a solvent (e.g., methylene chloride, acetonitrile, toluene or hexane) while the reaction system may be cooled or heated as desired. In another embodiment wherein the esterifying agent (d) used is a carboxylic acid such as methacrylic acid, the hydroxycarbamate (c) and the carboxylic acid may be heated in a solvent (e.g., toluene or hexane) in the presence of an acid catalyst while water formed during reaction may be removed out of the system if desired. Suitable acid catalysts used herein include mineral acids such as hydrochloric acid, sulfuric acid, nitric acid and perchloric acid and organic acids such as p-toluenesulfonic acid and benzenesulfonic acid. In a further embodiment wherein the esterifying agent (d) used is an acid anhydride such as methacrylic anhydride, the hydroxycarbamate (c), the acid anhydride, and a base (e.g., triethylamine, pyridine or 4-dimethylaminopyridine) may be successively or simultaneously added to a solventless system or to a solvent (e.g., methylene chloride, acetonitrile, toluene or hexane) while the reaction system may be cooled or heated as desired. The reaction time is determined as appropriate by monitoring the reaction process by GC or silica gel TLC because it is desirable from the yield aspect to drive the reaction to completion. Usually the reaction time is about 0.5 to about 24 hours. The nitrogen-containing monomer (e) may be recovered from the reaction mixture by ordinary aqueous work-up. If necessary, the monomer (e) may be purified by standard techniques like distillation, chromatography and recrystallization.

A monomer of the formula wherein X is a single bond may be obtained by reaction of an amine having a vinyl group with R³-X¹. A monomer of the formula wherein m=2 may be obtained by reaction of an amine having a vinyl group and two amino groups with R³-X¹ or reaction of a compound having two amino groups corresponding to formula (a) with R³-X¹.

While the polymer used as base resin in the resist composition (adapted to form a pattern through positive/negative reversal by organic solvent development) essentially comprises the recurring units having a nitrogen atom bonded to an acid labile group, as represented by formula (1), specifically recurring units having an acid labile group-substituted amino group, the polymer may further comprise recurring units having an acid labile group-substituted carboxyl group and/or an acid labile group-substituted hydroxyl group. When the polymer consists of the recurring units having a nitrogen atom bonded to an acid labile group, specifically recurring units having an acid labile group-substituted amino group, there is a possibility that deprotection generates an amino or imino group which, in turn, deactivates the acid, whereby deprotection does not run sufficiently, failing to provide a dissolution contrast. In such a situation, it is effective to enhance the dissolution contrast by copolymerizing recurring units having an acid labile group-substituted carboxyl or hydroxyl group or by blending the polymer with another polymer comprising recurring units having an acid labile group-substituted carboxyl or hydroxyl group.

In a preferred embodiment, the recurring units having an acid labile group-substituted carboxyl group are units (b) and the recurring units having an acid labile group-substituted hydroxyl group are units (c), represented by the general formula (2) below.

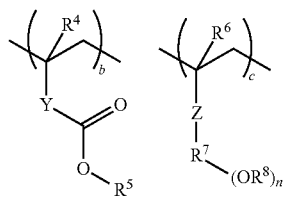
(2)

Herein $R^4$ and $R^6$ each are hydrogen or methyl. $R^5$ and $R^8$ each are an acid labile group, Y is a single bond or —C(=O)—O—$R^9$— wherein $R^9$ is a straight, branched or cyclic $C_1$-$C_{10}$ alkylene group which may contain an ether or ester moiety, or a naphthylene group. Z is a single bond or —C(=O)—O—. $R^7$ is a straight, branched or cyclic $C_1$-$C_{15}$ alkylene group or a trivalent form of the alkylene group with one hydrogen eliminated, which may contain an ether or ester moiety, or a naphthylene group or a trivalent form of the naphthylene group with one hydrogen eliminated. The subscript n is 1 or 2, b and c are numbers in the range: $0 \le b < 1.0$, $0 \le c < 1.0$, and $0 < b+c < 1.0$.

The monomer Mb from which recurring units (b) are derived has the formula:

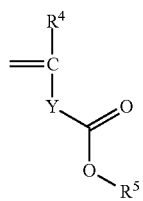
Mb wherein $R^4$, $R^5$, and Y are as defined above.

Examples of monomer Mb wherein Y is different are shown below. Herein $R^4$ and $R^5$ are as defined above.

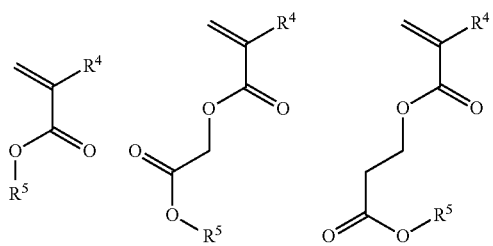

-continued

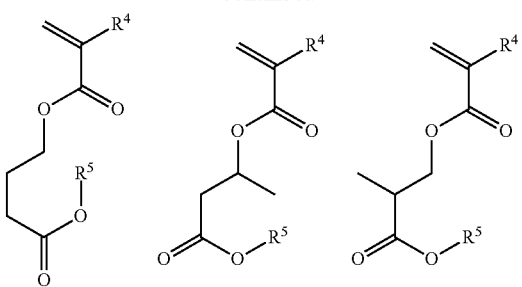

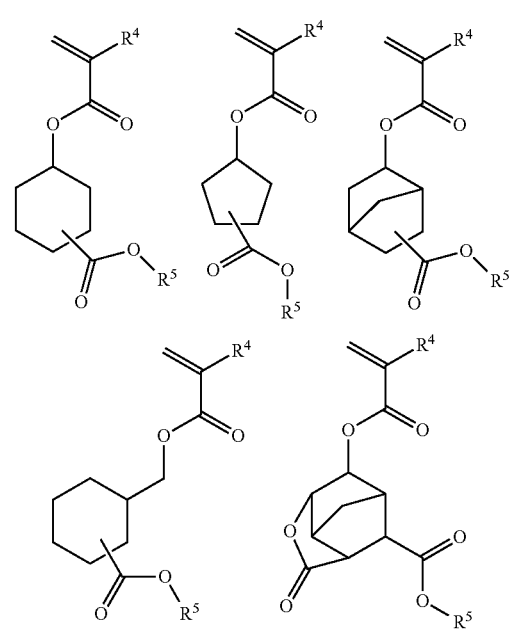

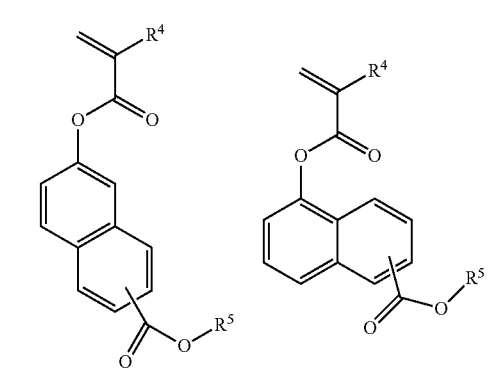

-continued
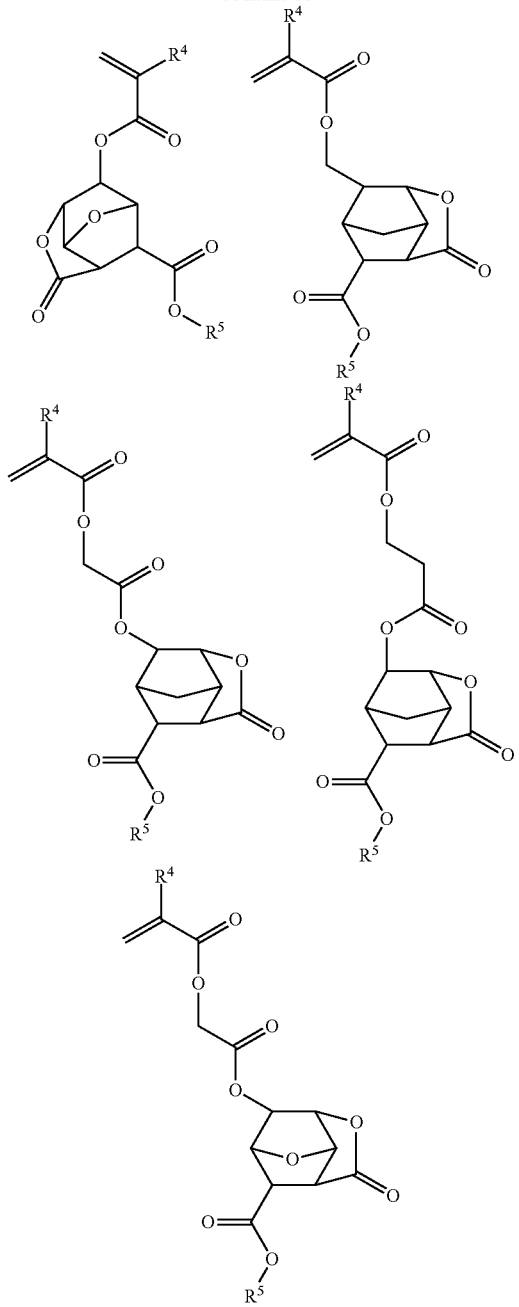
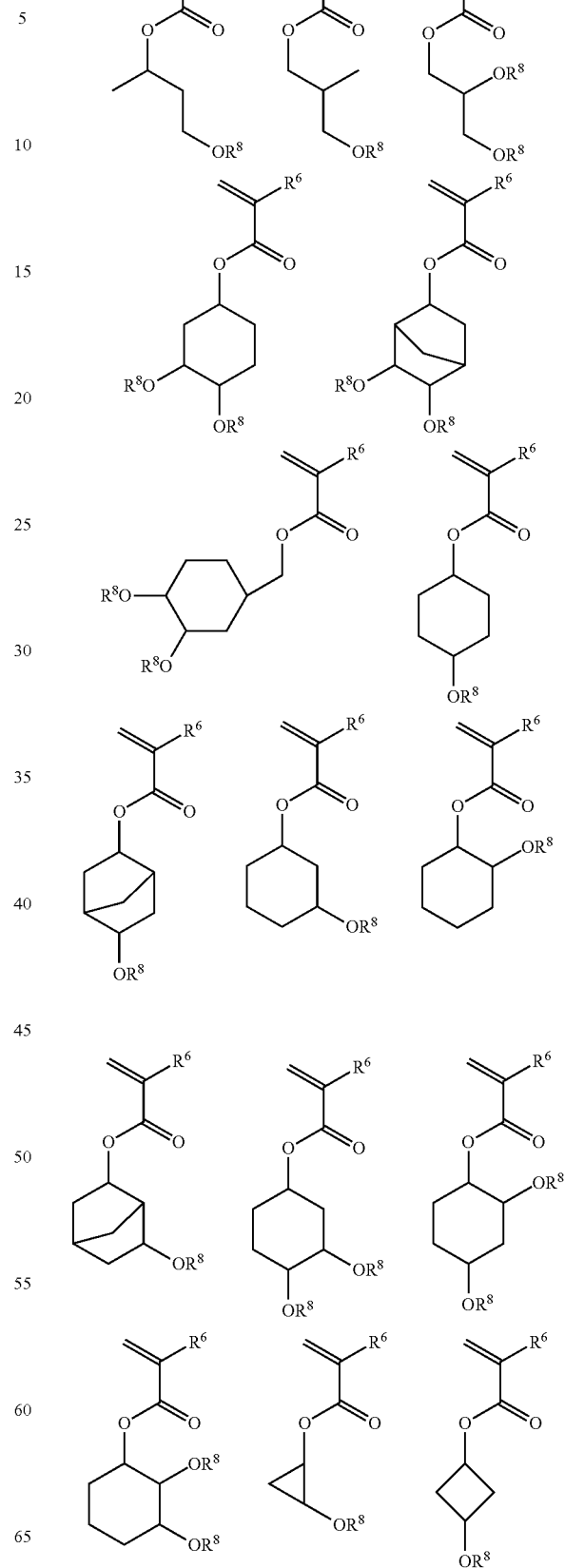
Examples of the monomer Mc from which recurring units (c) are derived are shown below. Herein $R^6$ and $R^8$ are as defined above.
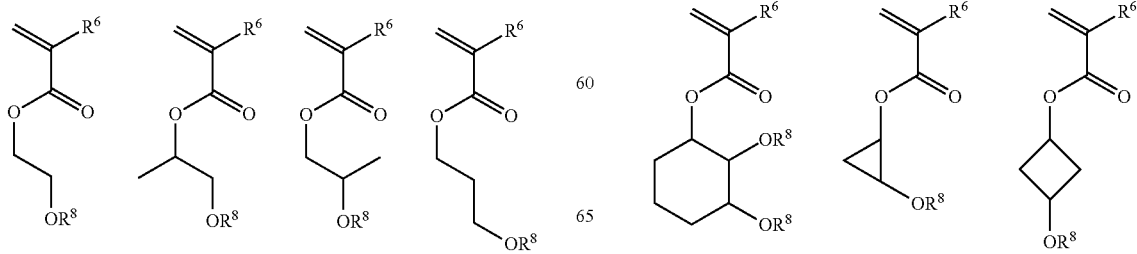

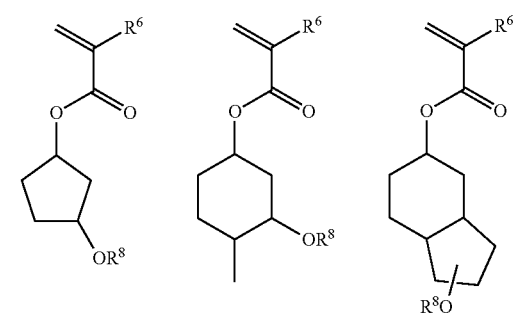
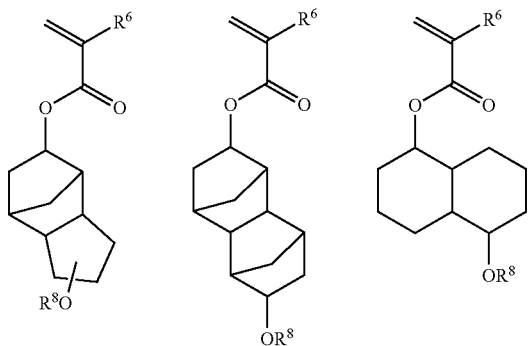
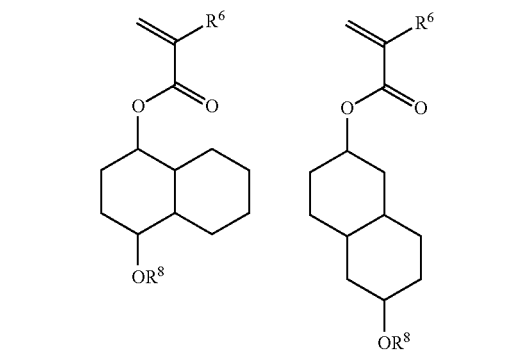
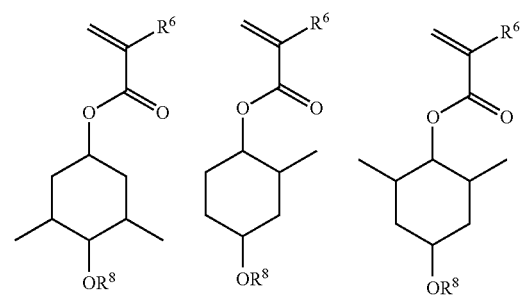
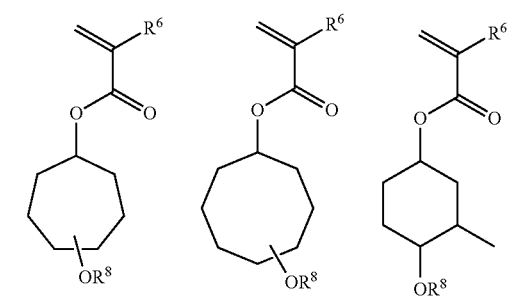
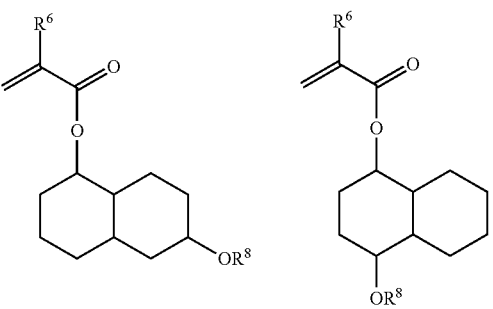
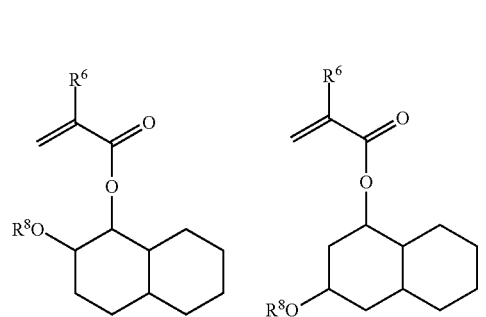
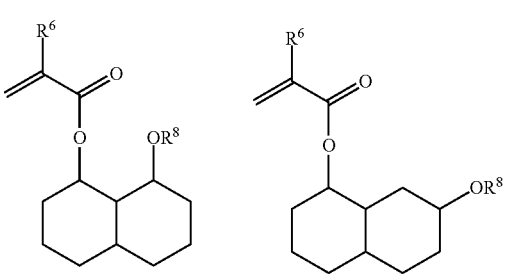
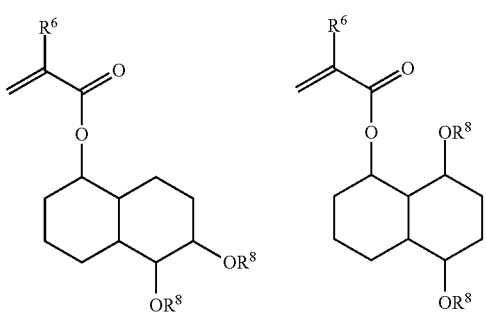
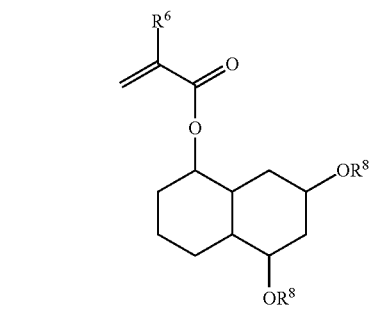

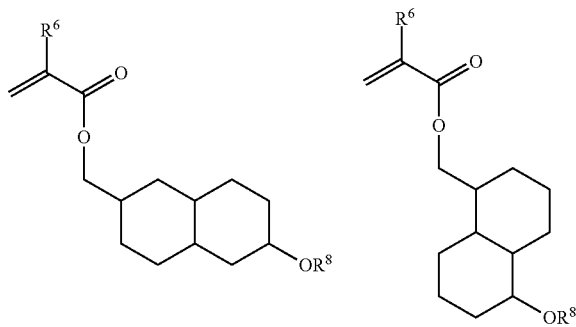
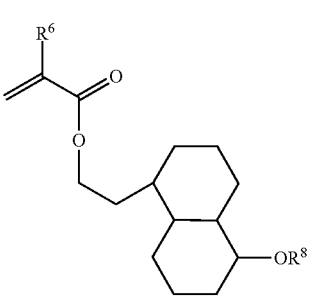
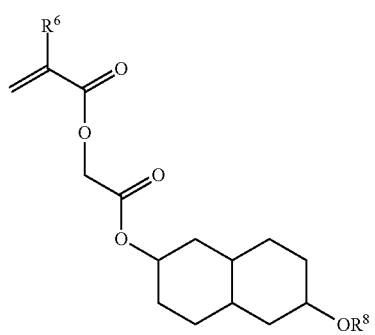
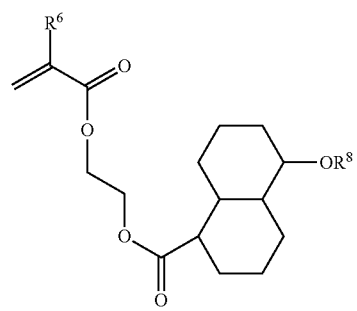
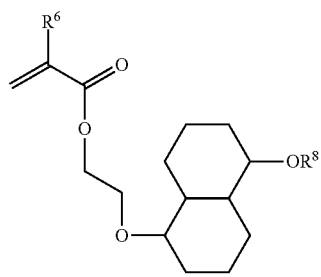
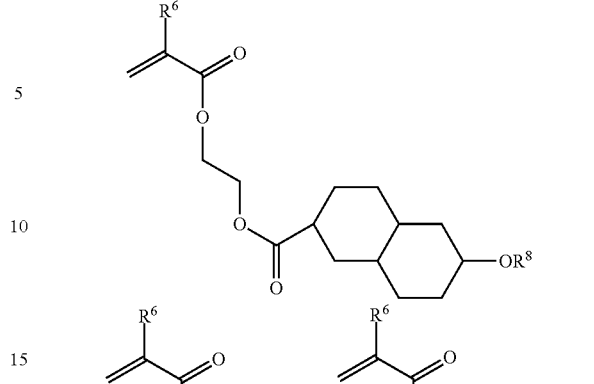
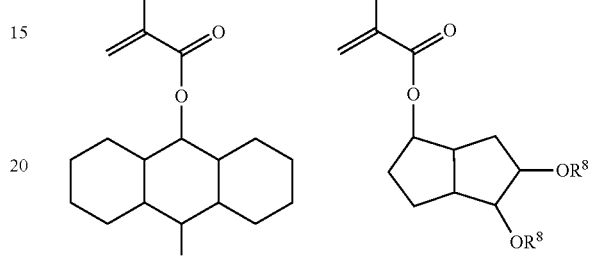
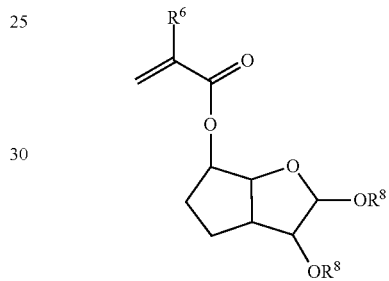
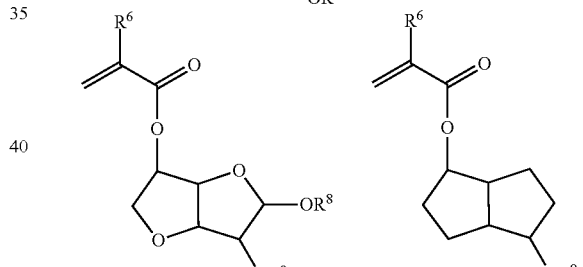
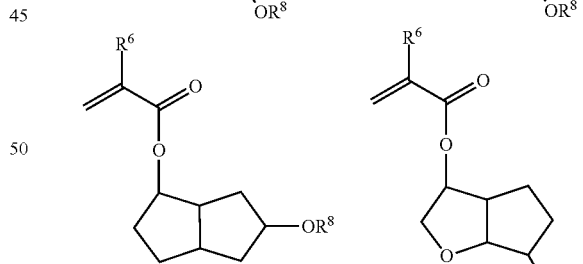
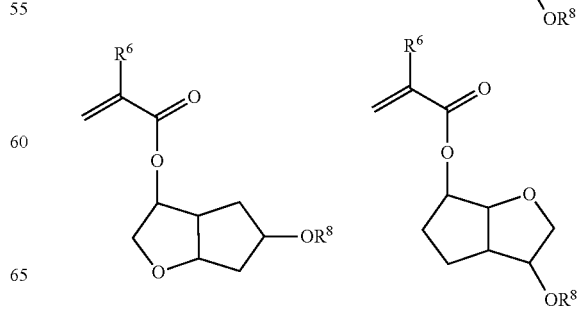

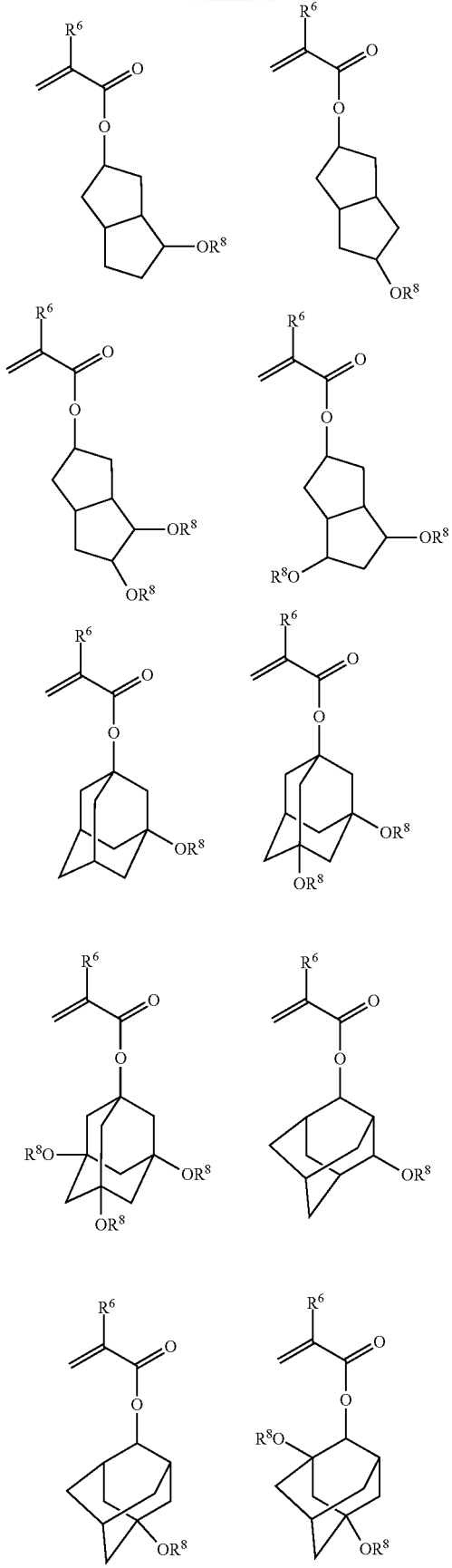
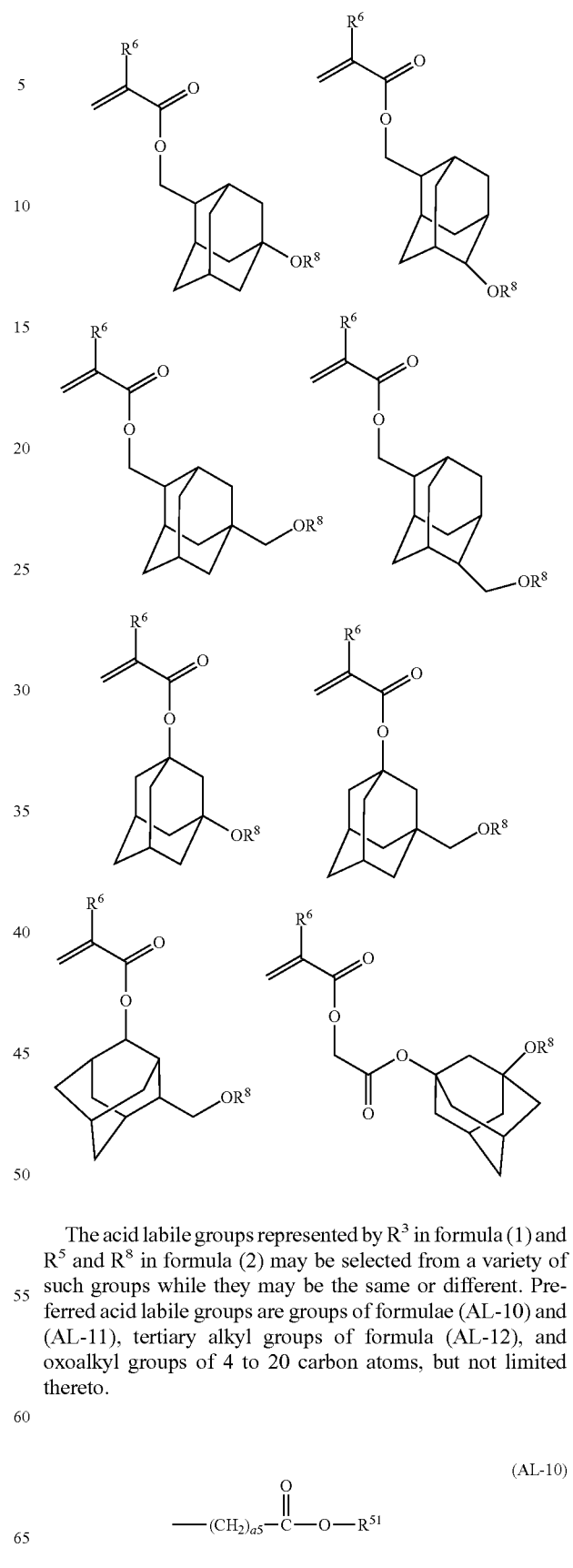
The acid labile groups represented by $R^3$ in formula (1) and $R^5$ and $R^8$ in formula (2) may be selected from a variety of such groups while they may be the same or different. Preferred acid labile groups are groups of formulae (AL-10) and (AL-11), tertiary alkyl groups of formula (AL-12), and oxoalkyl groups of 4 to 20 carbon atoms, but not limited thereto.
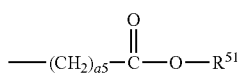
(AL-10)

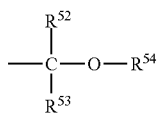
(AL-11)

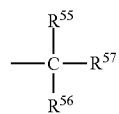
(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, preferably 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-12.

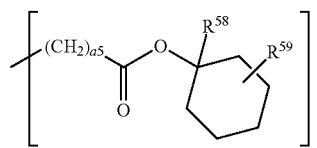
(AL-10)-1

(AL-10)-2

(AL-10)-3

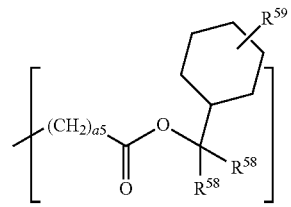
(AL-10)-4

(AL-10)-5

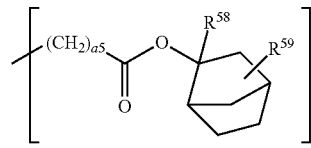
(AL-10)-6

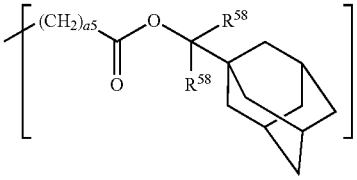
(AL-10)-7

(AL-10)-8

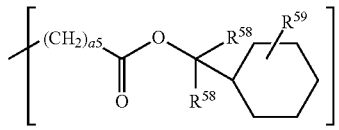
(AL-10)-9

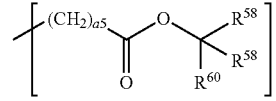
(AL-10)-10

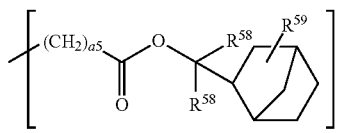
(AL-10)-11

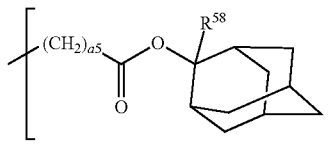
(AL-10)-12

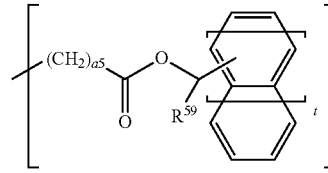
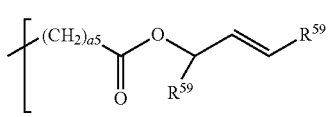

In formulae (AL-10)-1 to (AL-10)-12, $R^{58}$ is independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^H$ is a $C_6$-$C_{20}$ aryl group or $C_7$-$C_{20}$ aralkyl group; "a5" is an integer of 0 to 10 as defined above; and t is an integer of 1 to 3.

Illustrative examples of the acetal group of formula (AL-11) include those of the following formulae (AL-11)-1 to (AL-11)-112.

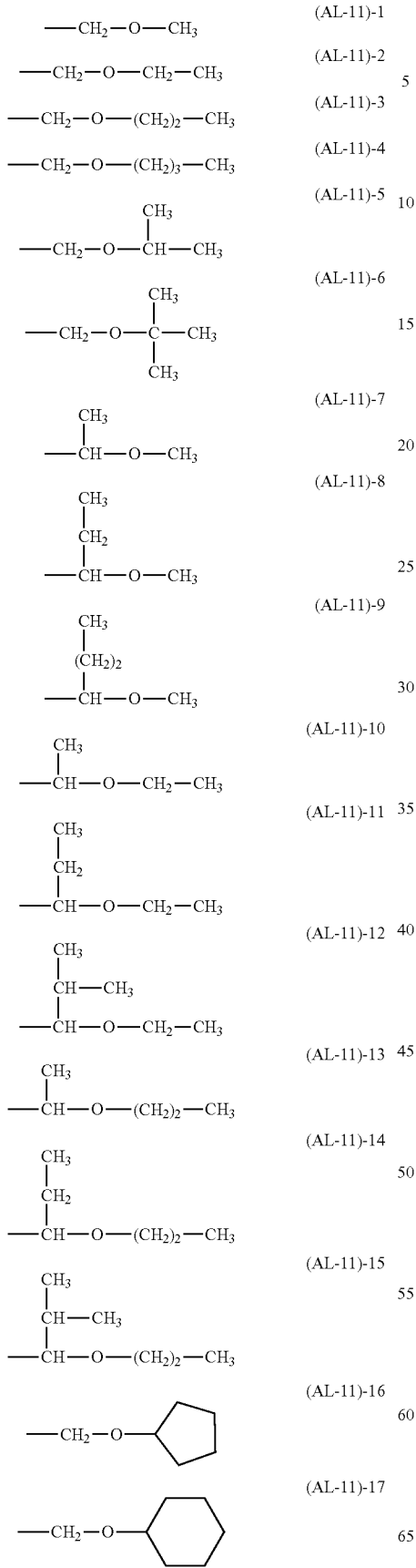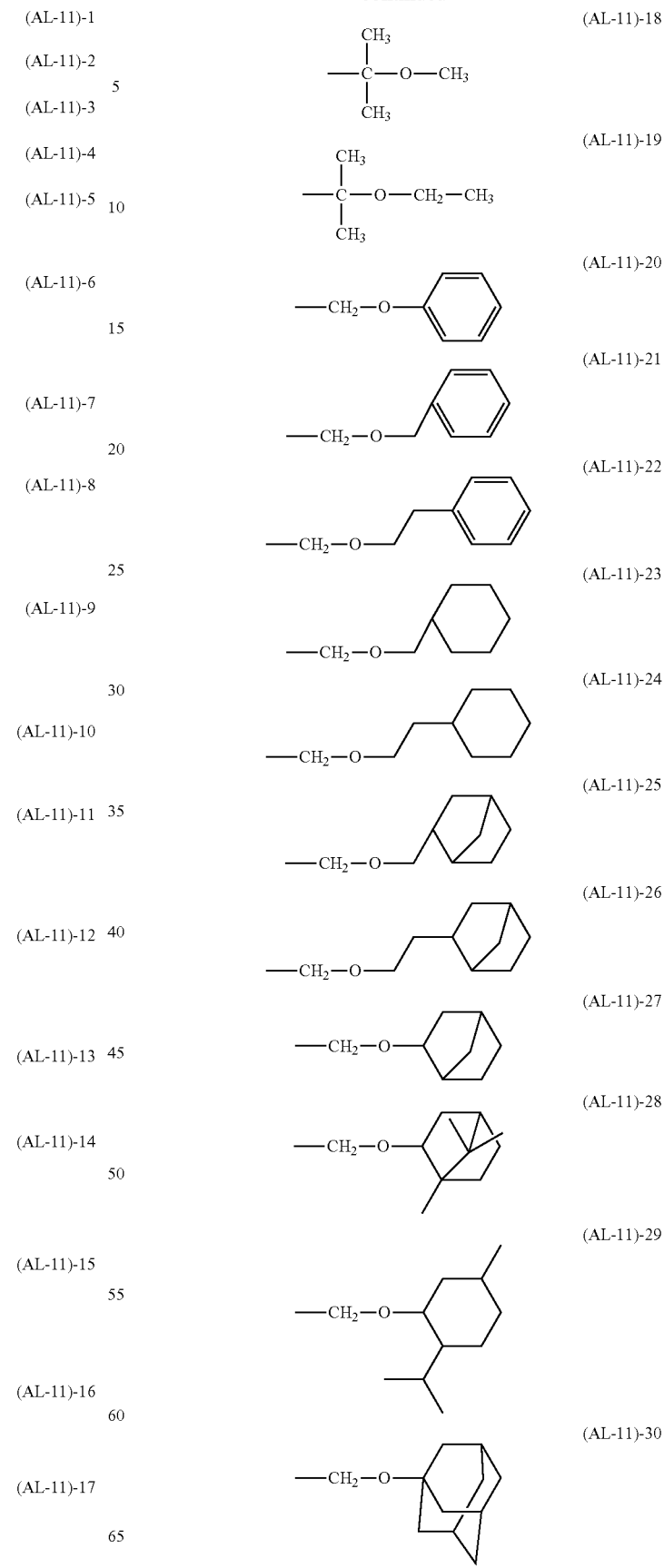

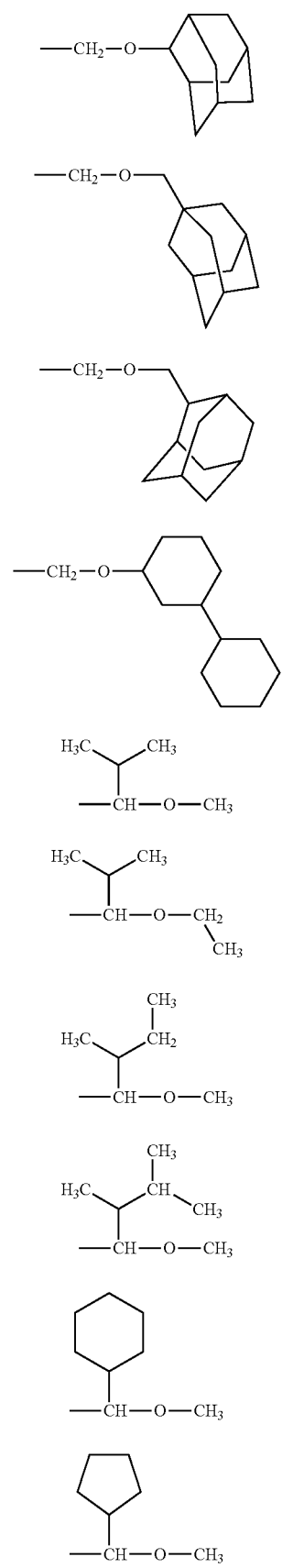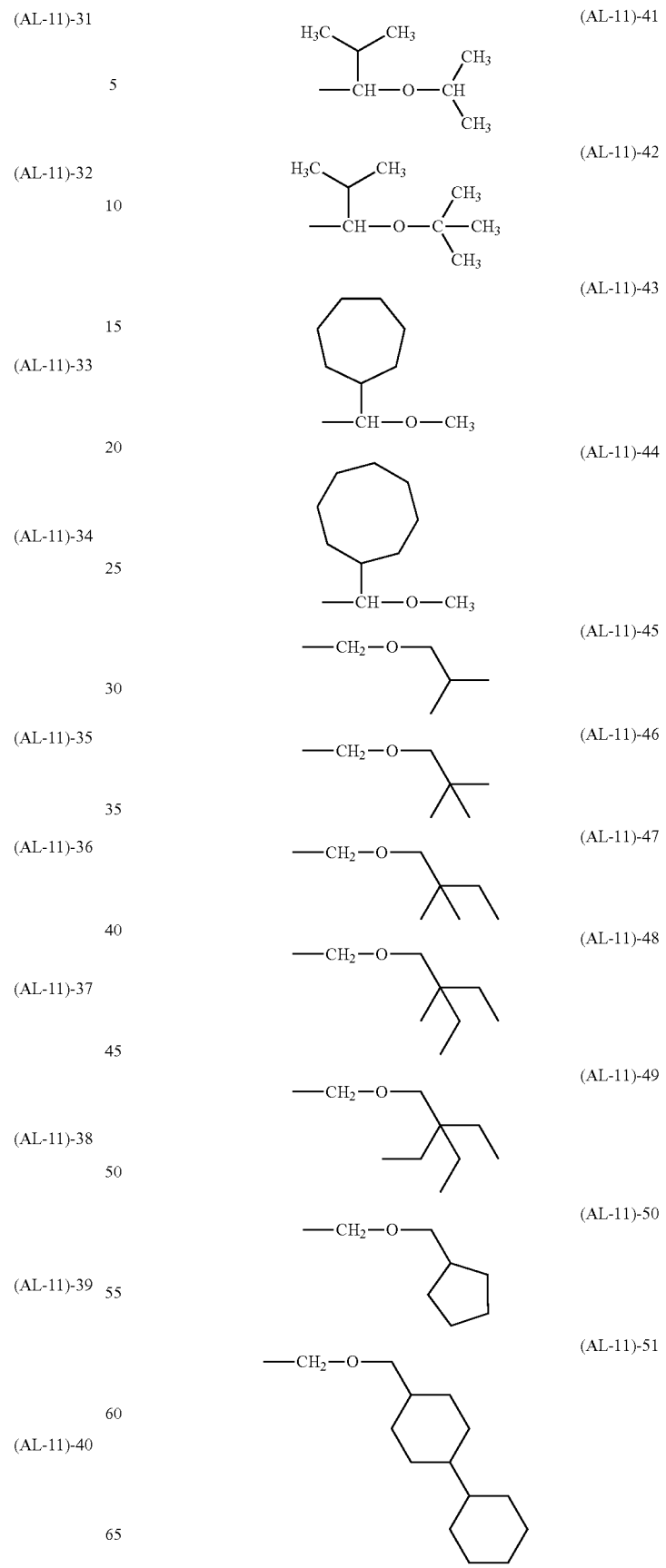

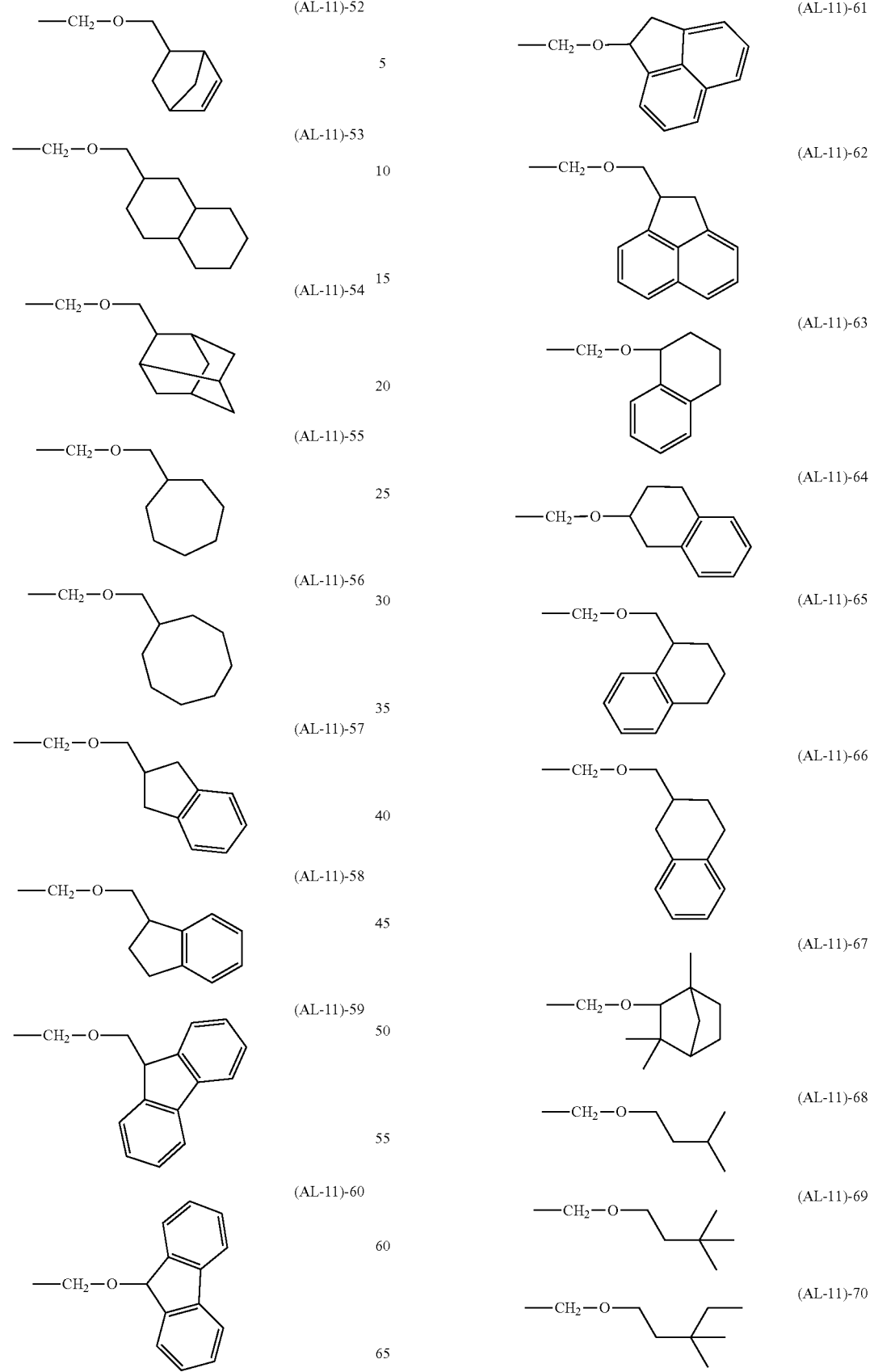

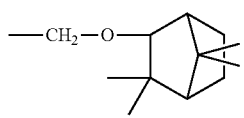 (AL-11)-71
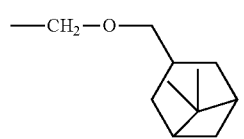 (AL-11)-72
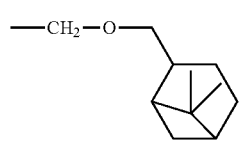 (AL-11)-73
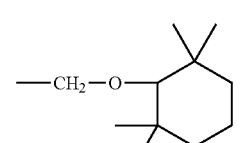 (AL-11)-74
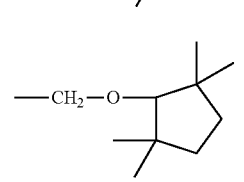 (AL-11)-75
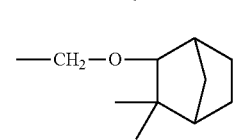 (AL-11)-76
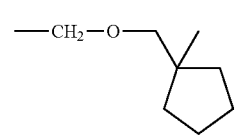 (AL-11)-77
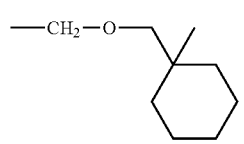 (AL-11)-78
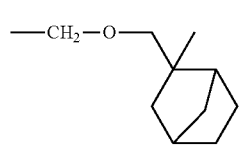 (AL-11)-79
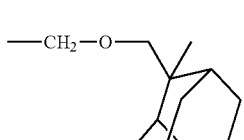 (AL-11)-80
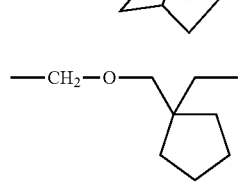 (AL-11)-81
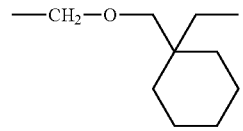 (AL-11)-82
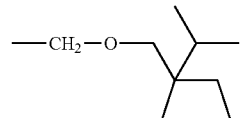 (AL-11)-83
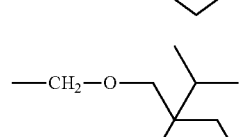 (AL-11)-84
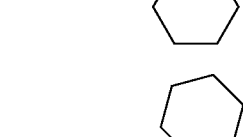 (AL-11)-85
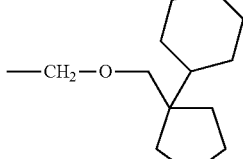 (AL-11)-86
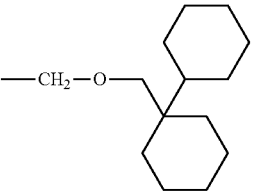 (AL-11)-87
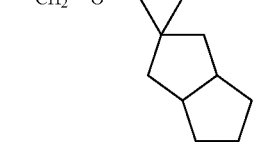 (AL-11)-88
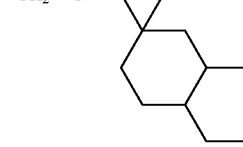 (AL-11)-89
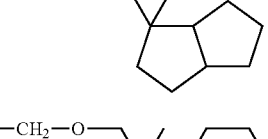 (AL-11)-90
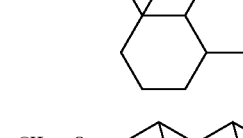 (AL-11)-91

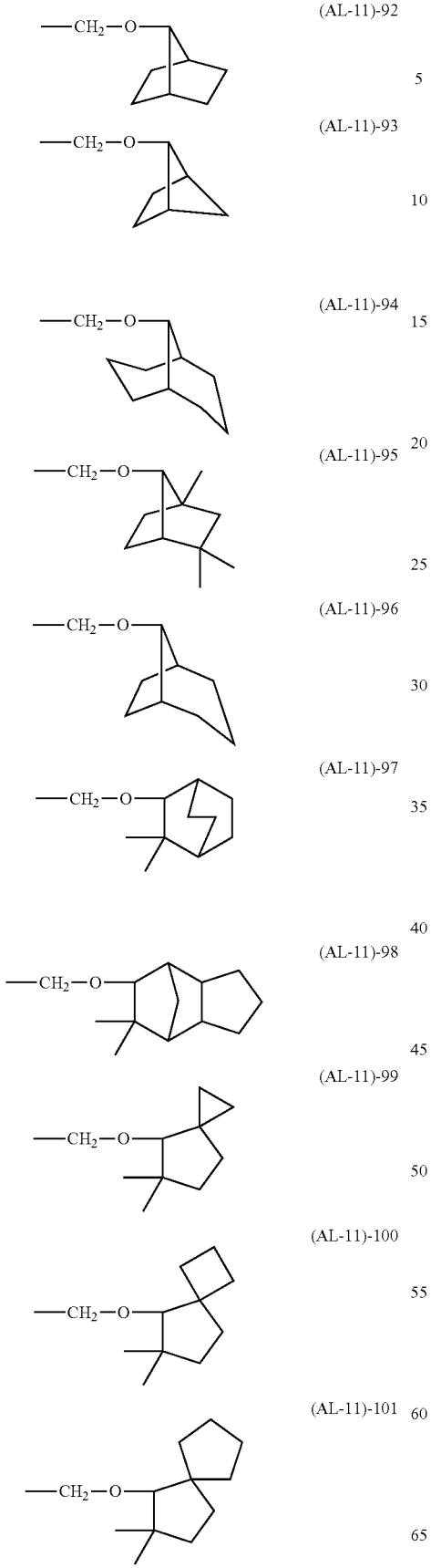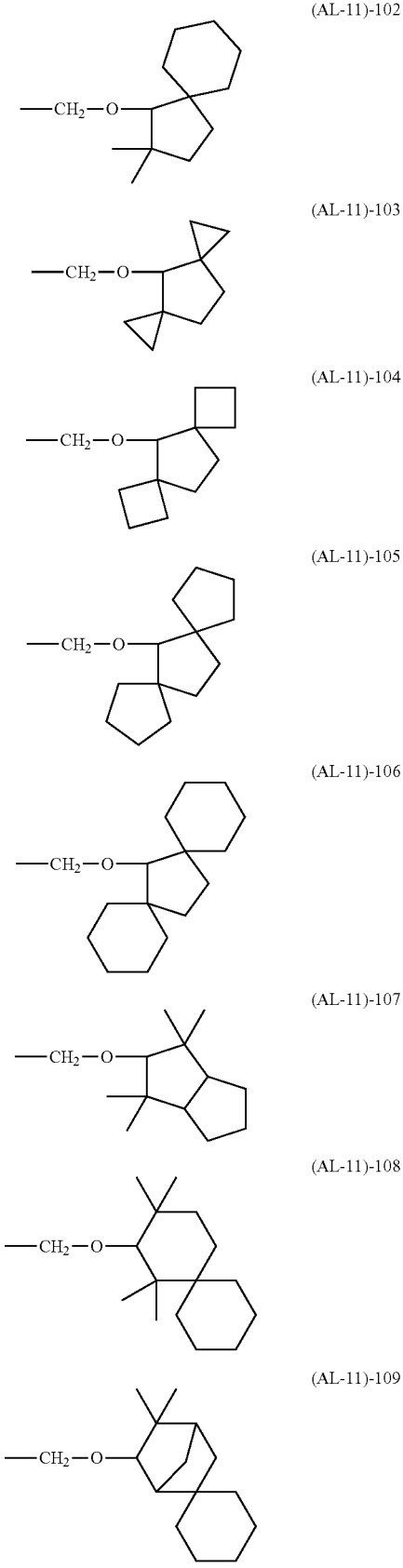

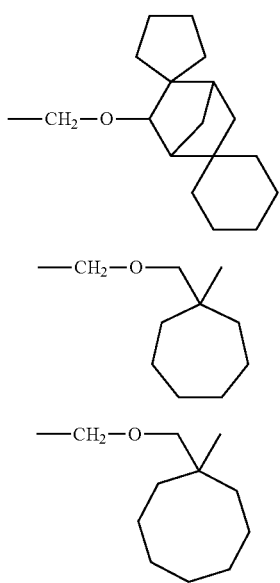

(AL-11)-110

(AL-11)-111

(AL-11)-112

The polymer may be crosslinked within the molecule or between molecules with acid labile groups of formula (AL-11a) or (AL-11b).

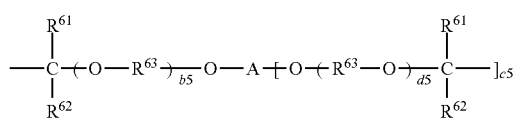

(AL-11a)

(AL-11b)

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-113 through (AL-11)-120.

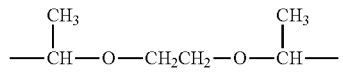

(AL-11)-113

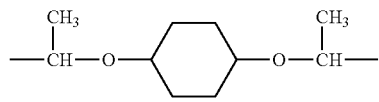

(AL-11)-114

(AL-11)-115

(AL-11)-116

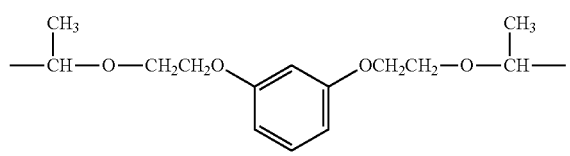

(AL-11)-117

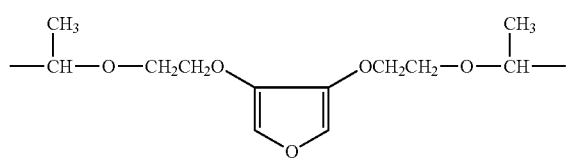

(AL-11)-118

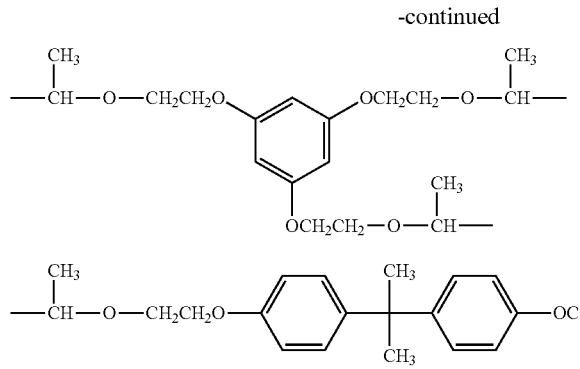
(AL-11)-119
(AL-11)-120
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
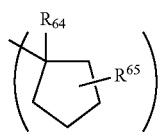
(AL-12)-1
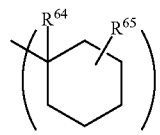
(AL-12)-2
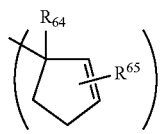
(AL-12)-3
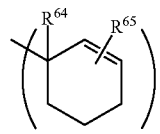
(AL-12)-4
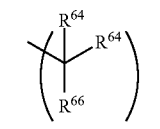
(AL-12)-5
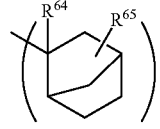
(AL-12)-6
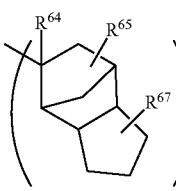
(AL-12)-7
-continued
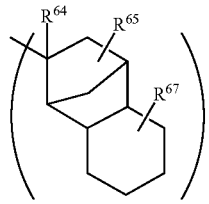
(AL-12)-8
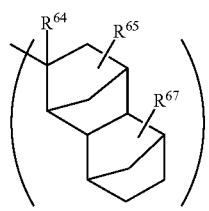
(AL-12)-9
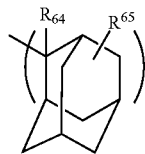
(AL-12)-10
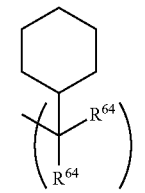
(AL-12)-11
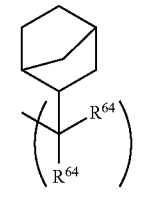
(AL-12)-12

(AL-12)-13
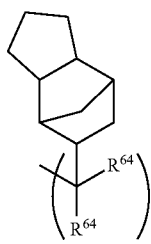

(AL-12)-14
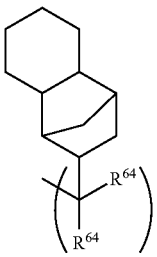

(AL-12)-15
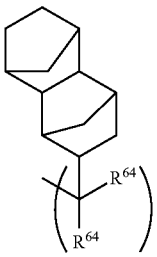

(AL-12)-16
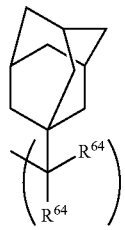

Herein $R^{64}$ is independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group. Two $R^{64}$ may bond together to form an aliphatic ring with the carbon atom to which they are attached.

With acid labile groups comprising $R^{68}$ representative of a di- or more valent alkylene or arylene group being included as shown in formulae (AL-12)-17 and (AL-12)-18, the polymer may be crosslinked within the molecule or between molecules.

(AL-12)-17
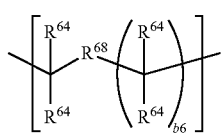

(AL-12)-18
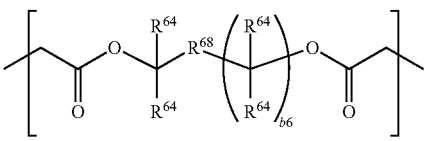

In formulae (AL-12)-17 and (AL-12)-18, $R^{64}$ is as defined above; $R^{68}$ is a single bond, or a straight, branched or cyclic $C_1$-$C_{20}$ alkylene group or arylene group which may contain a heteroatom such as oxygen, sulfur or nitrogen; and b6 is an integer of 1 to 3.

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

(AL-13)-1
—(CH$_2$)$_4$OH (AL-13)-2
—(CH$_2$)$_2$O(CH$_2$)$_3$CH$_3$ (AL-13)-3
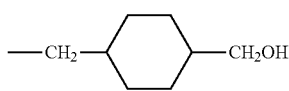

(AL-13)-4
—(CH$_2$)$_2$O(CH$_2$)$_2$OH (AL-13)-5
—(CH$_2$)$_6$OH (AL-13)-6
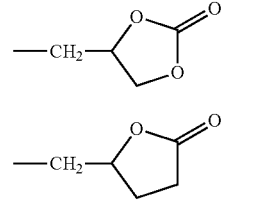

(AL-13)-7
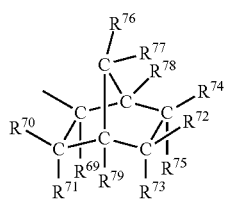

Of the acid labile groups of formula (AL-12), recurring units having an exo-form structure represented by the formula (AL-12)-19 are preferred.

(AL-12)-19
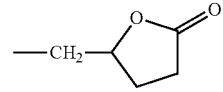

Herein, $R^{69}$ is a straight, branched or cyclic $C_1$-$C_8$ alkyl group or an optionally substituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen or a monovalent hydrocarbon group, typically alkyl, of 1 to 15 carbon atoms which may contain a heteroatom. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$, or $R^{77}$ and $R^{72}$ may bond together to form a ring, typically alicyclic, with the carbon atom to which they are attached, and in this case, each group participating in ring formation is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19, as shown below, are derived are described in U.S. Pat. No. 6,448,420 (JP-A 2000-327633).

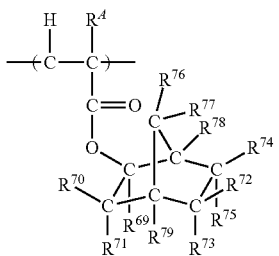

Examples of these monomers are shown below, but not limited thereto. Note that $R^A$ is hydrogen or methyl.

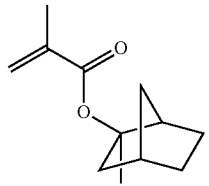

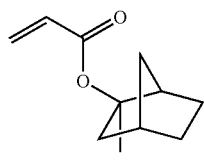

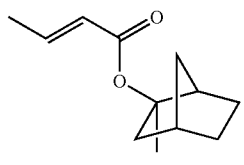

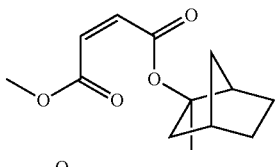

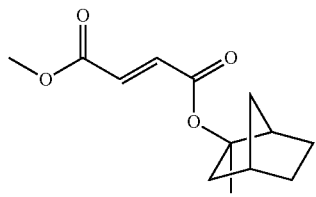

-continued

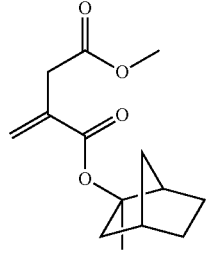

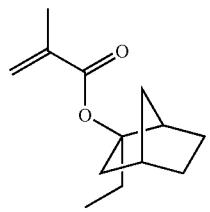

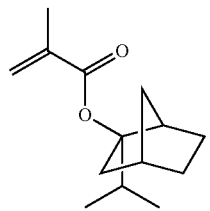

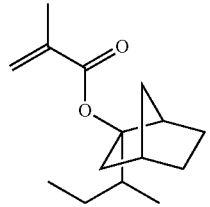

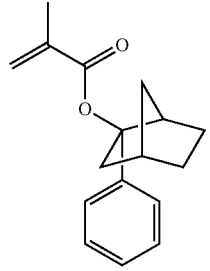

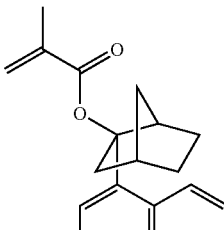

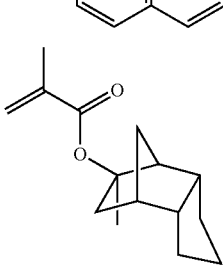

-continued

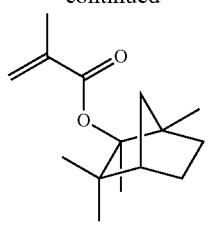
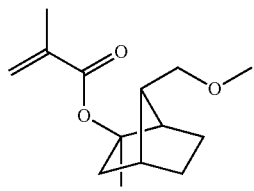
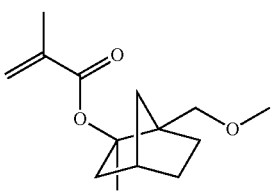
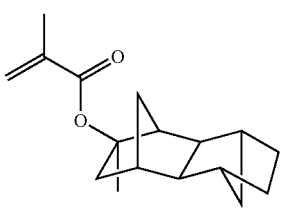
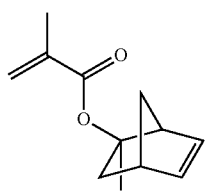
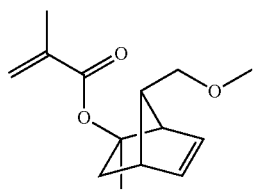
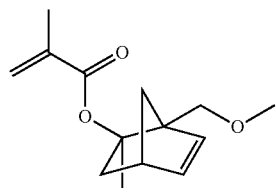
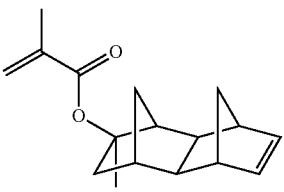

-continued

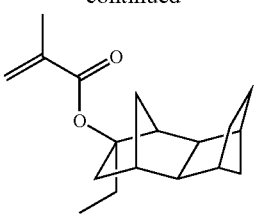
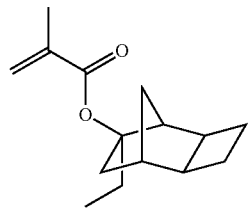
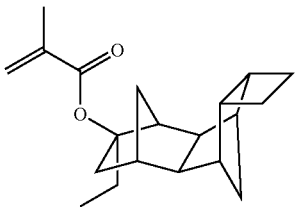 [SMILES: C=C(C)C(=O)OC1(CC)CC2CC1C1C3CC(C4CCC43)C21]

Also included in the acid labile groups of formula (AL-12) are acid labile groups having furandiyl, tetrahydrofurandiyl or oxanorbornanediyl as represented by the following formula (AL-12)-20.

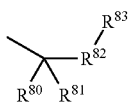
(AL-12)-20

Herein, $R^{80}$ and $R^{81}$ are each independently a monovalent hydrocarbon group, typically a straight, branched or cyclic $C_1$-$C_{10}$ alkyl group. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl group, which may contain a heteroatom.

Recurring units substituted with an acid labile group having furandiyl, tetrahydrofurandiyl or oxanorbornanediyl as represented by the formula:

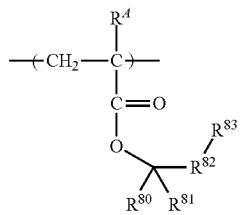

(wherein $R^{80}$ to $R^{83}$ and $R^A$ are as defined above) are derived from monomers, examples of which are shown below. Note that Me is methyl and Ac is acetyl.

51
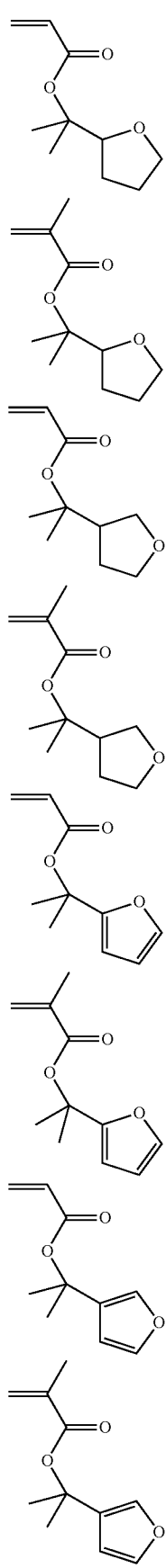
52
-continued
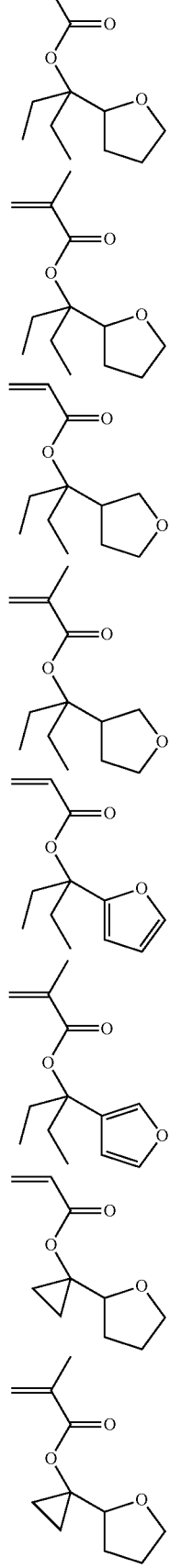

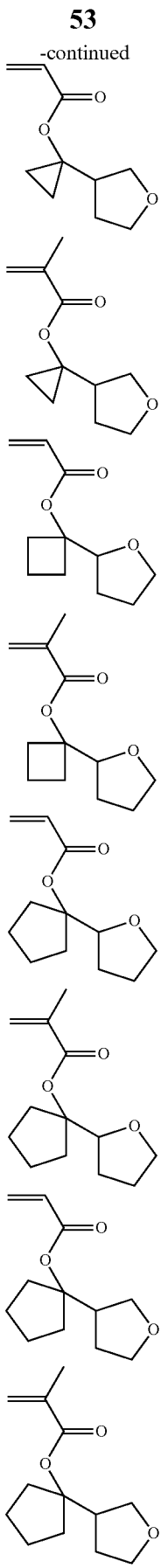
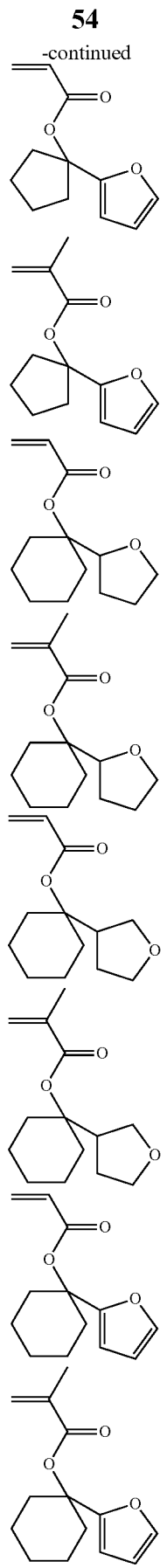

55
-continued
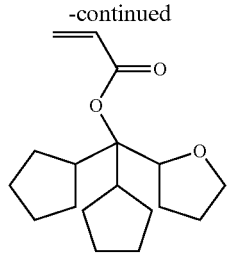
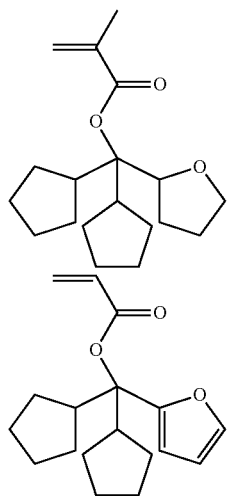
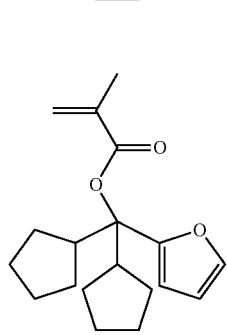
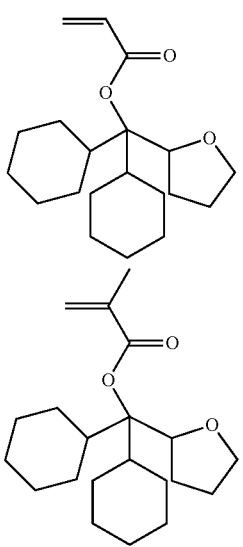
56
-continued
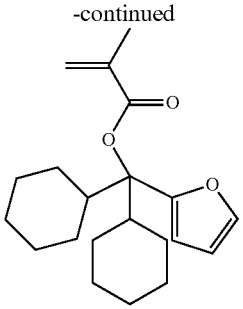
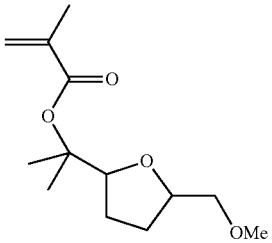
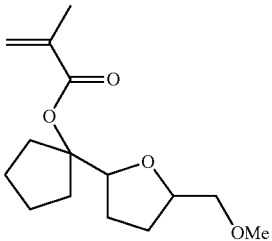
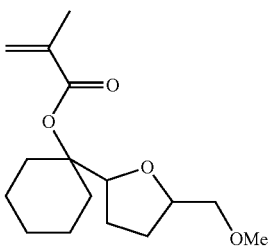
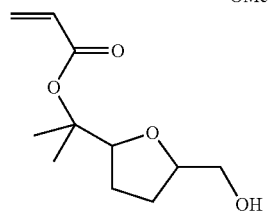
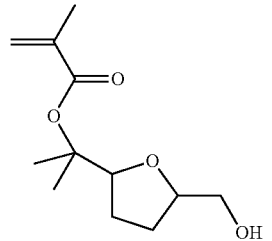
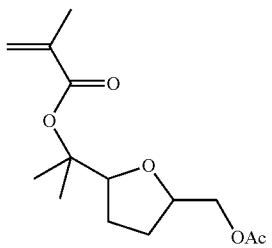

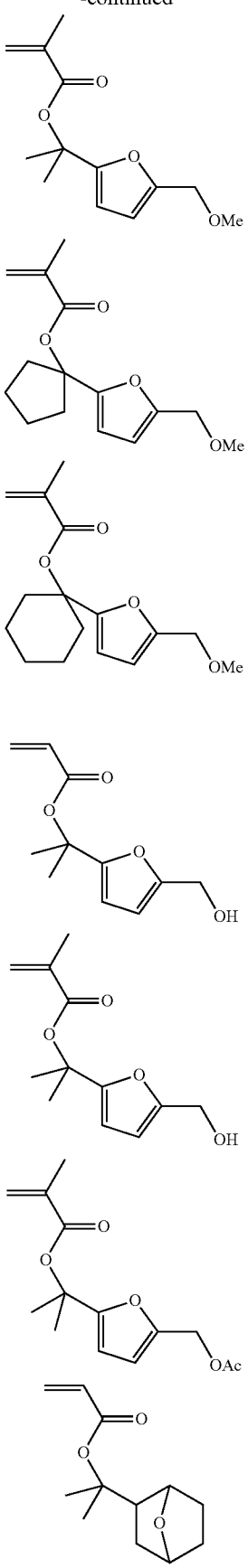
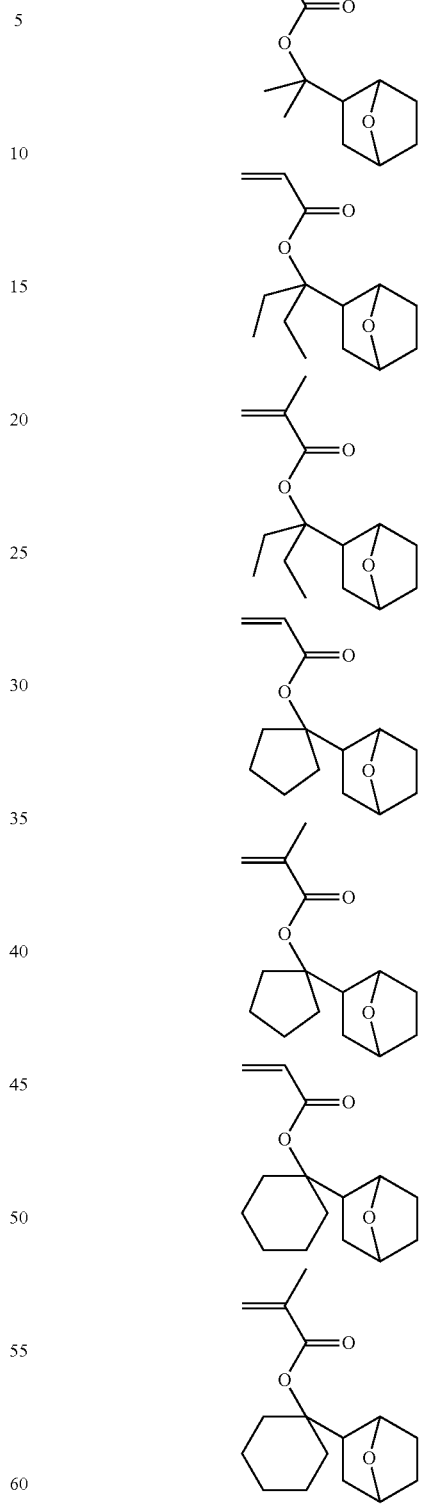
In a preferred embodiment, the acid labile group $R^3$ bonded to nitrogen in recurring units (a1) and (a2) represented by formula (1) and the acid labile group $R^8$ substituting on hydroxyl in recurring units (c) represented by formula (2) are acetal groups having formula (AL-11) and carbonate groups having formula (AL-10). Also preferably, the acid labile group $R^5$ substituting on carboxyl in recurring units (b) represented by formula (2) are tertiary ester groups having formula (AL-12), more preferably tertiary ester groups of cyclic structure, and most preferably tertiary ester groups of formulae (AL-12)-1 to (AL-12)-16 and (AL-12)-19.

While the polymer in the resist composition used in the patterning process of the invention essentially includes recurring units (a1) and/or (a2) represented by formula (1), it may have further copolymerized therein recurring units (d) derived from monomers having adhesive groups such as hydroxyl, cyano, carbonyl, ester, ether groups, lactone rings, carboxyl, carboxylic anhydride, sulfonic acid ester and amide groups. Inter alia, adhesive groups having lactone ring are preferred.

Examples of monomers from which recurring units (d) are derived are given below.

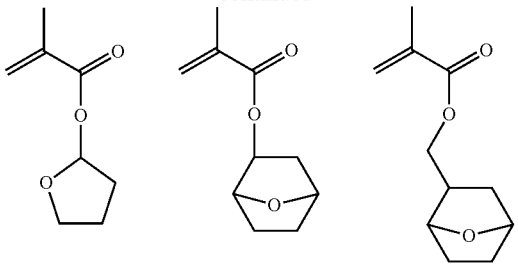
-continued

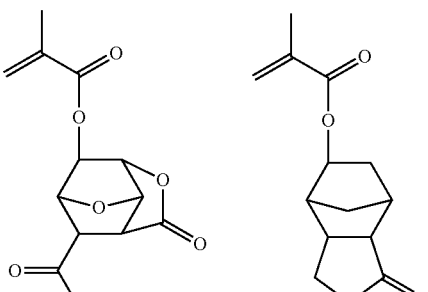

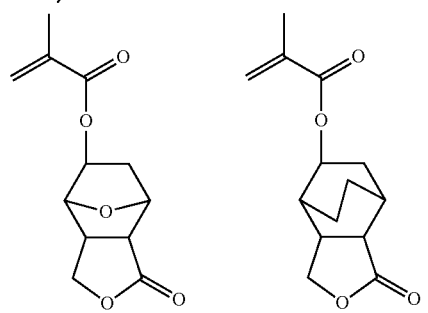

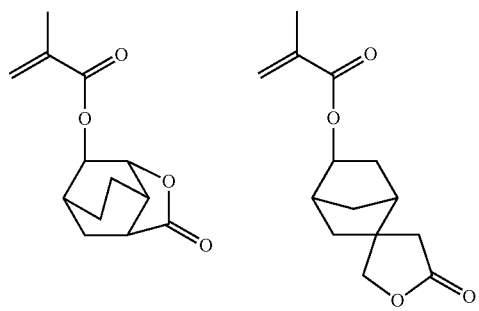

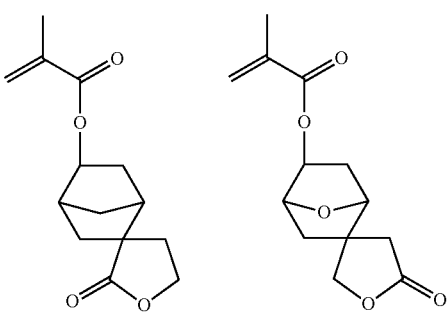

61
-continued
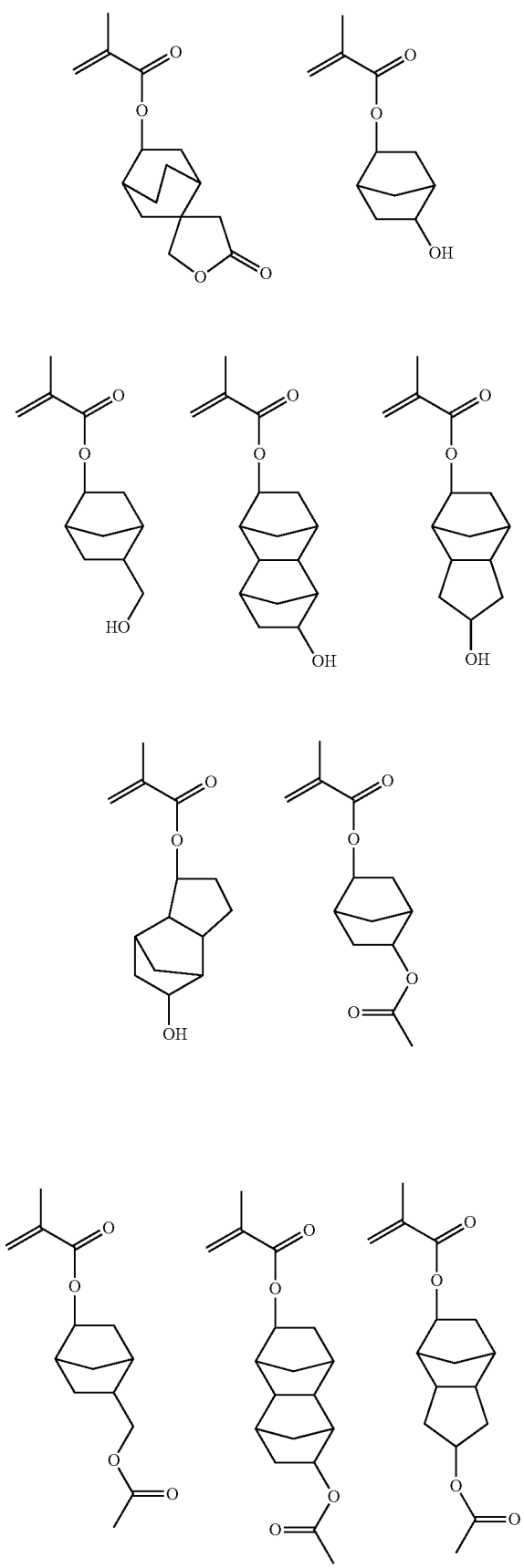
62
-continued
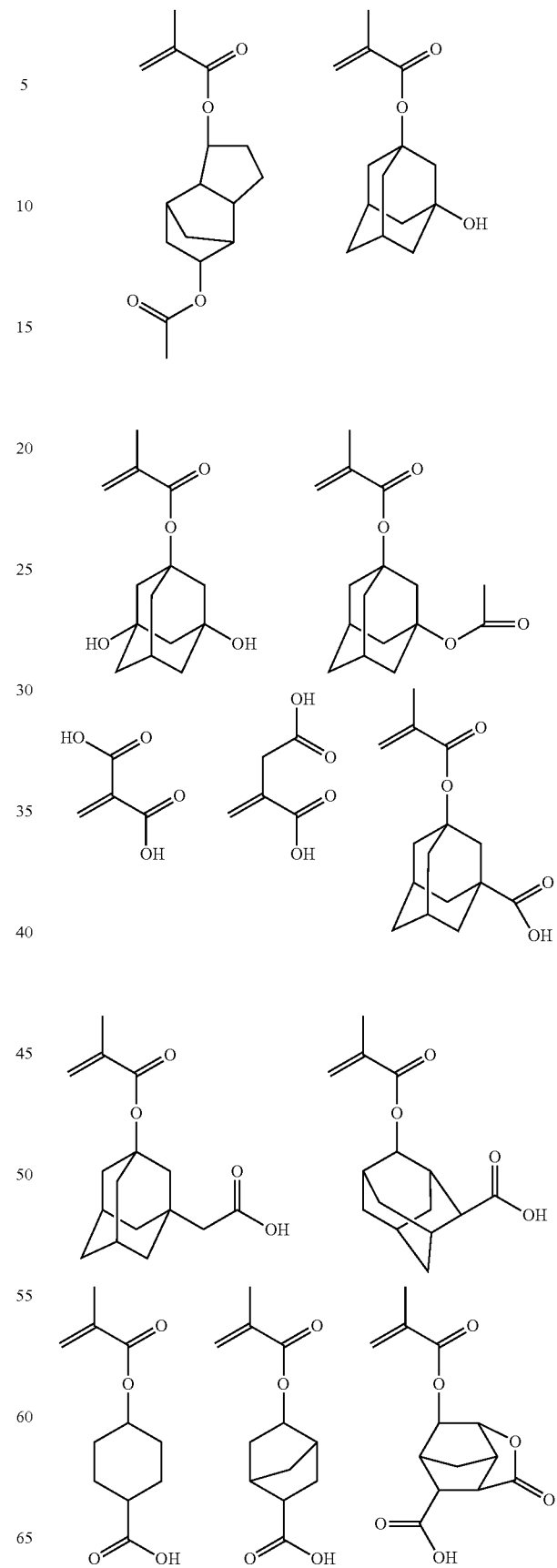

63
-continued
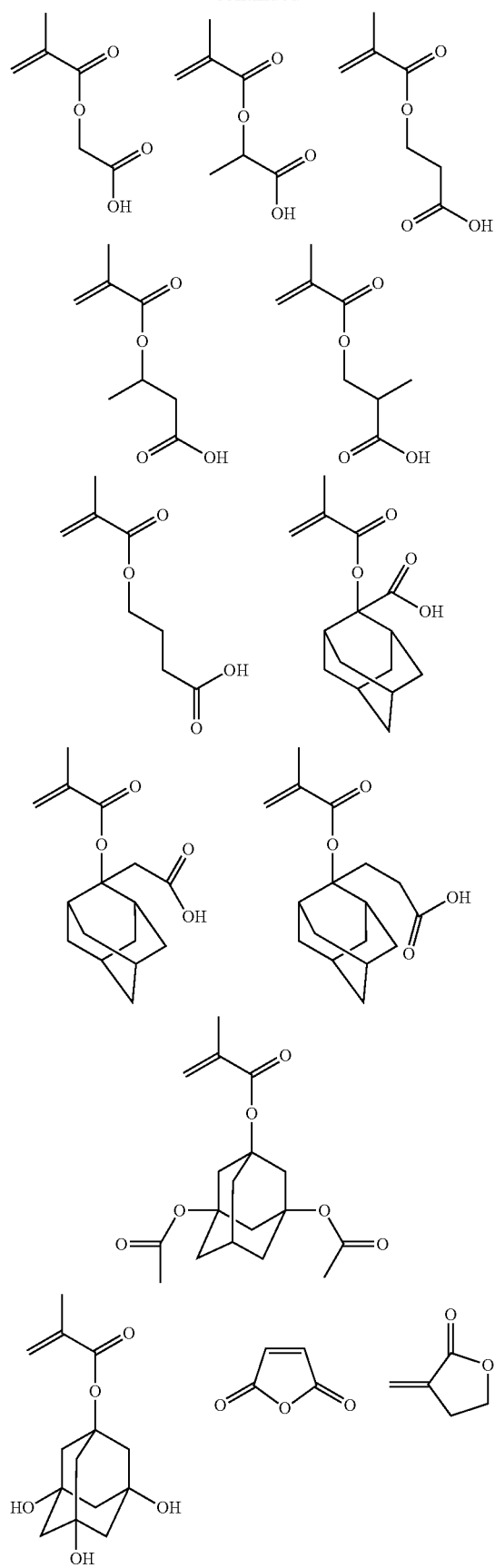
64
-continued
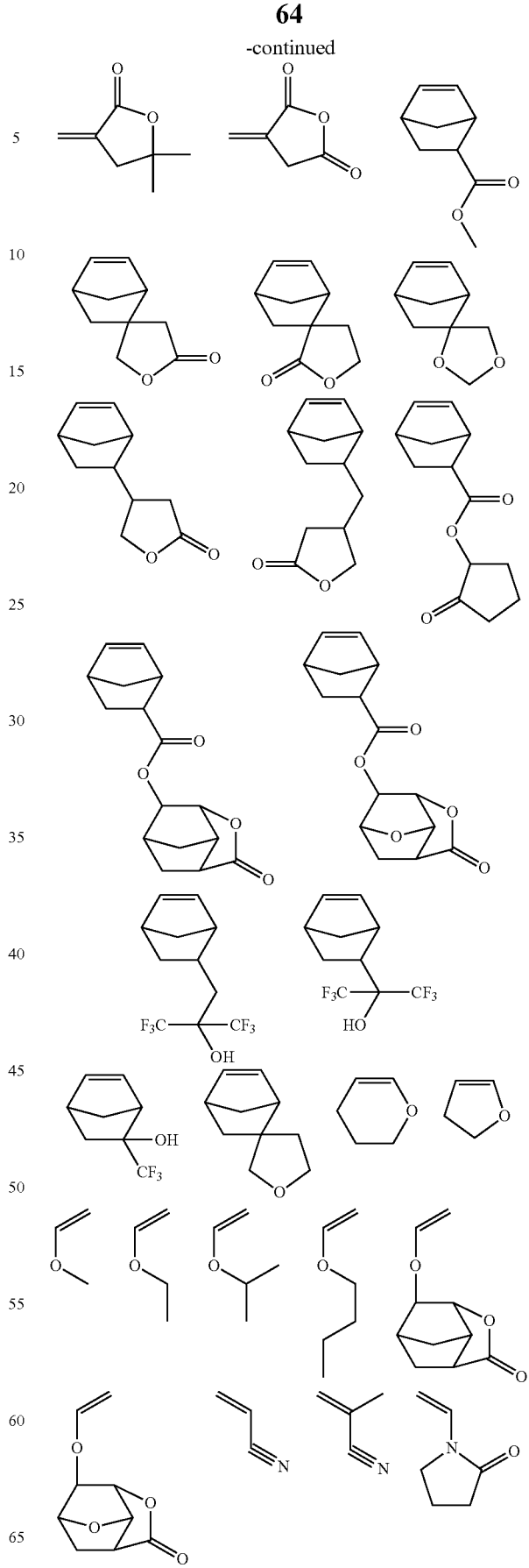

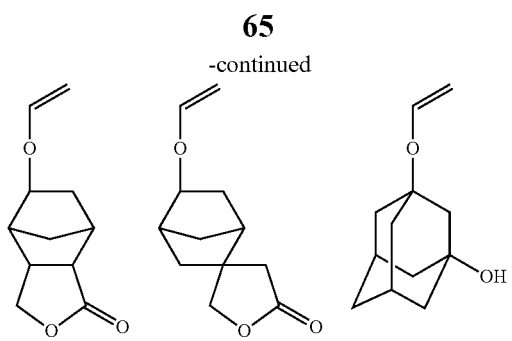
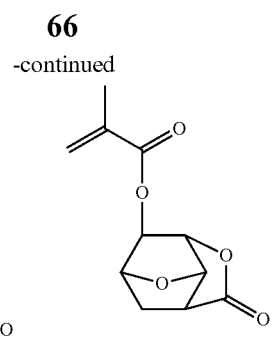
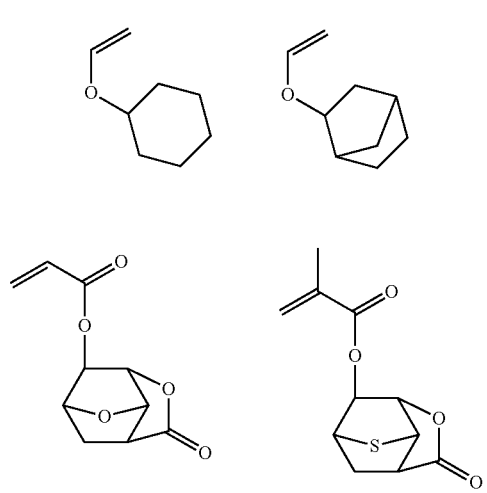
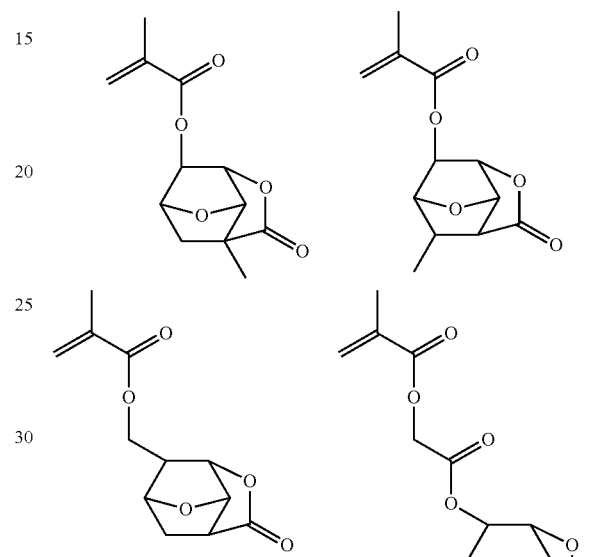
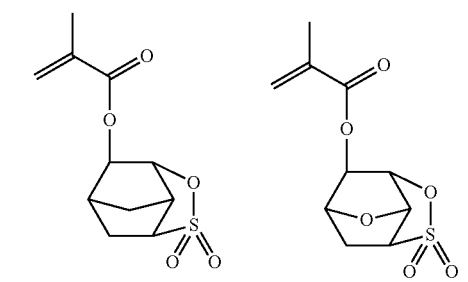
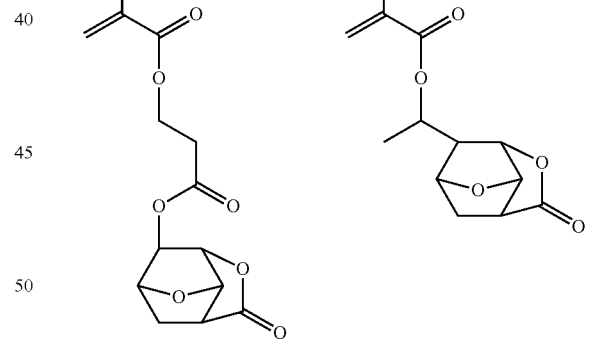
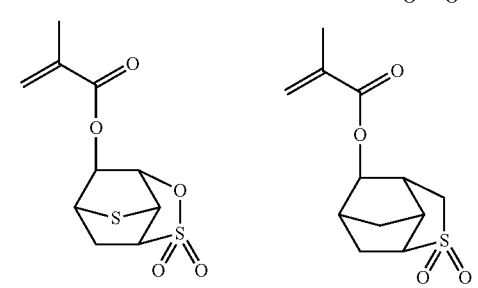
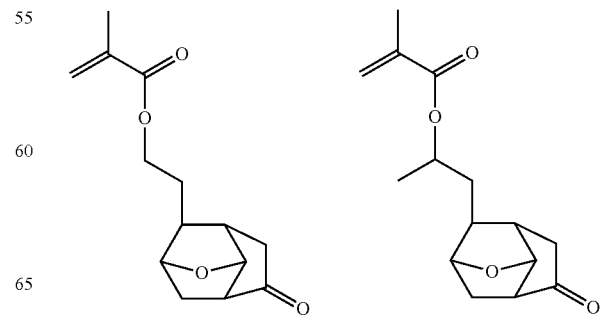
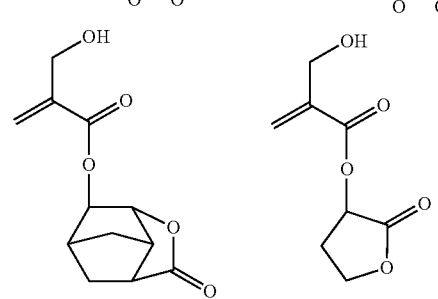

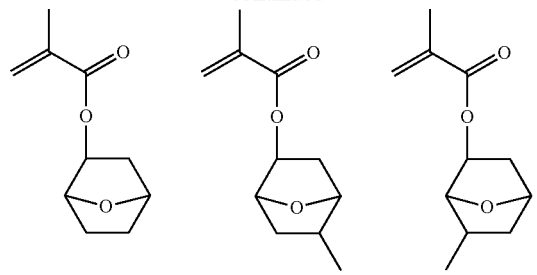
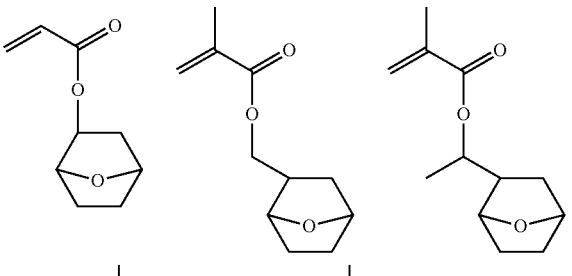
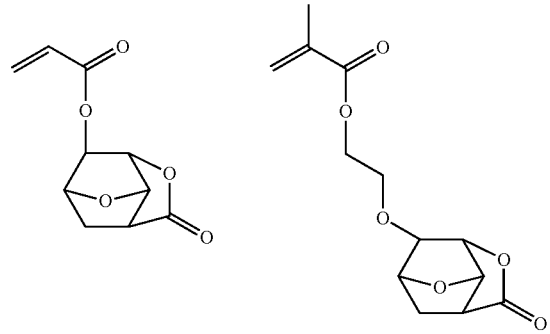
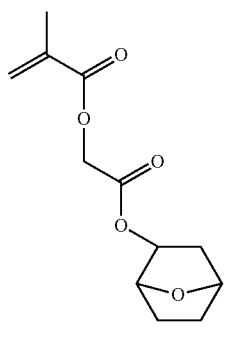
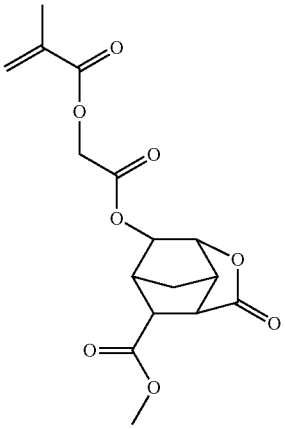
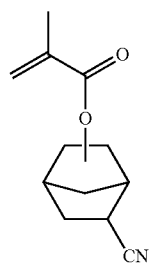
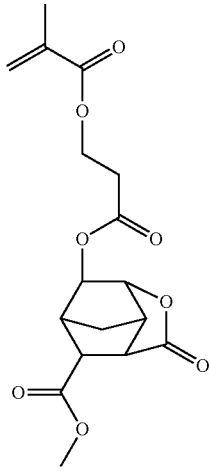
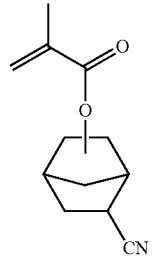
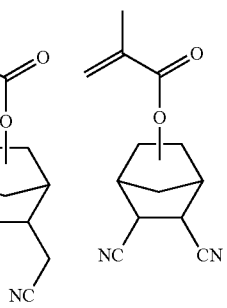
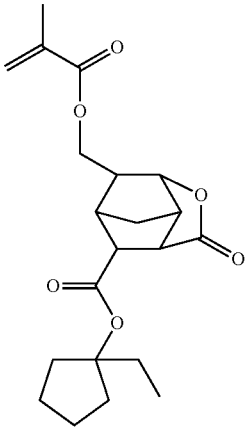

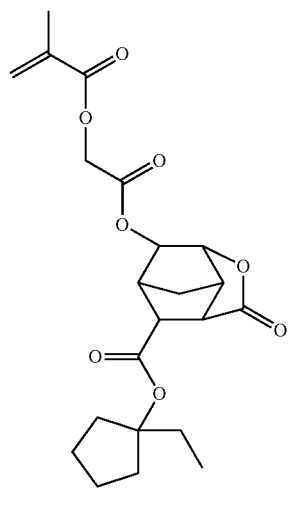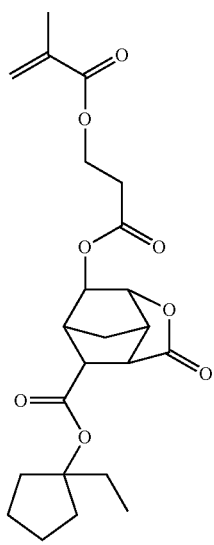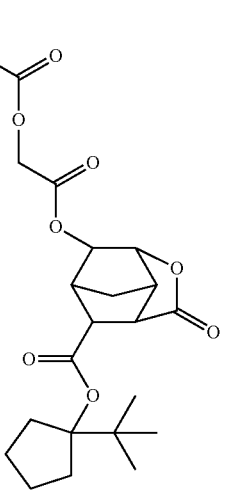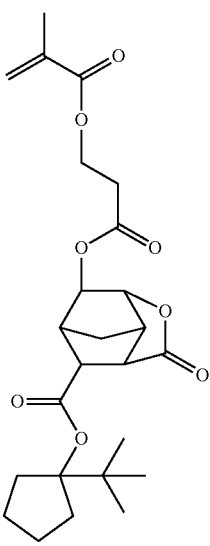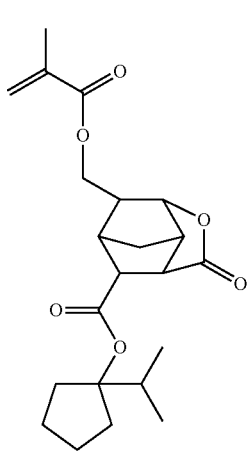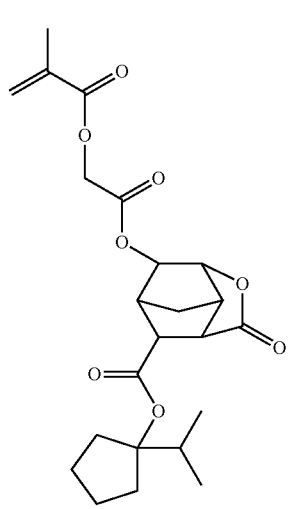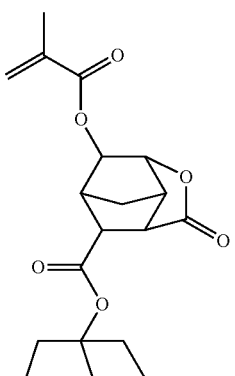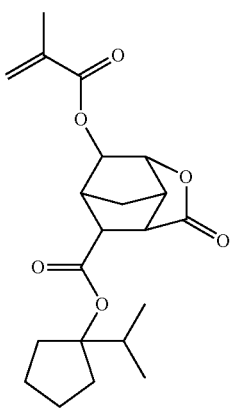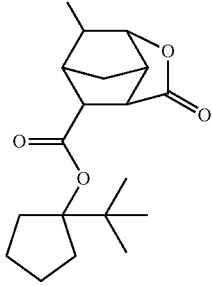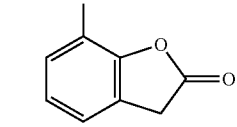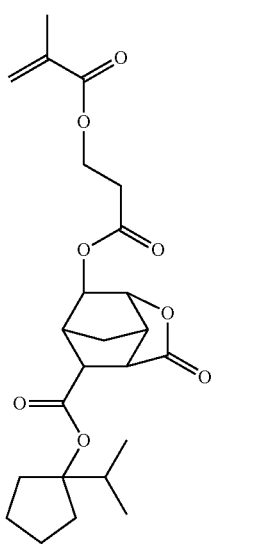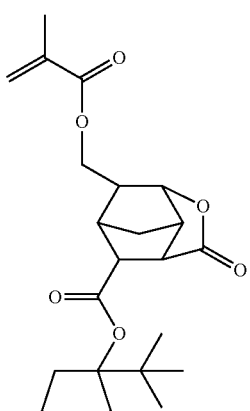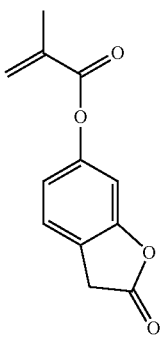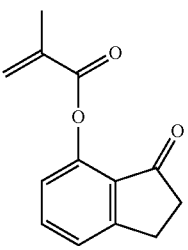

71
-continued
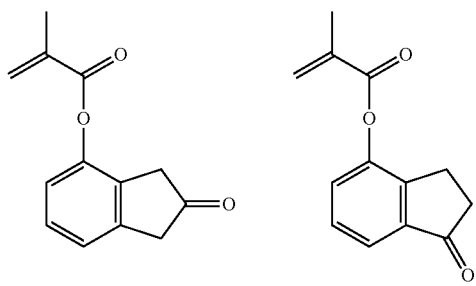
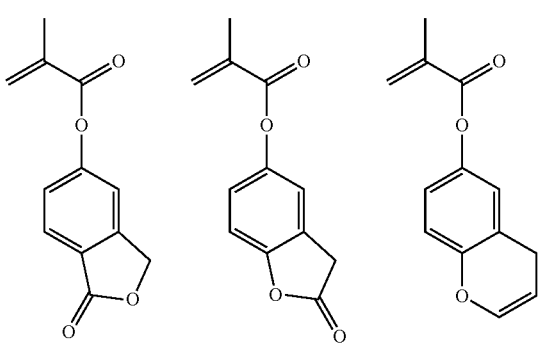
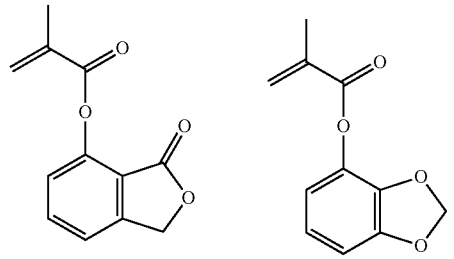
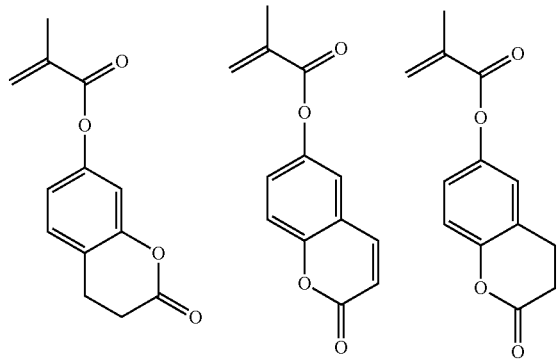
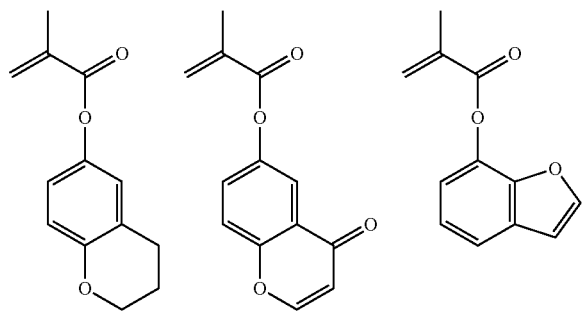 [SMILES: C=C(C)C(=O)Oc1ccc2c(c1)CCCO2 ; C=C(C)C(=O)Oc1ccc2occc(=O)c2c1 ; C=C(C)C(=O)Oc1cccc2ccoc12]
72
-continued
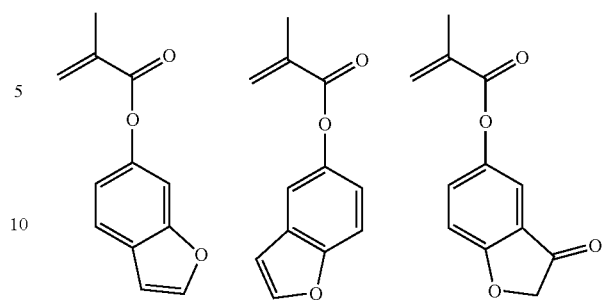
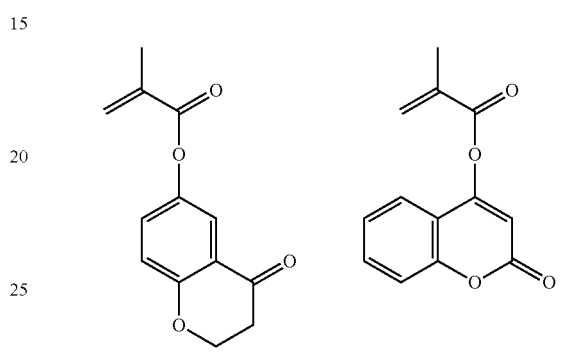
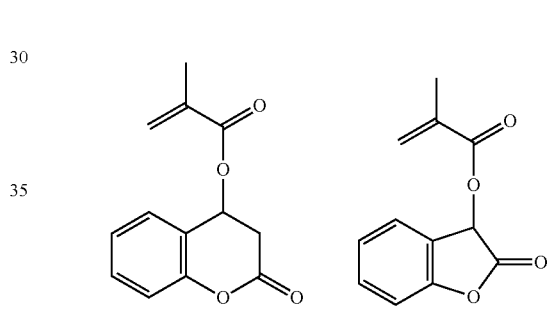
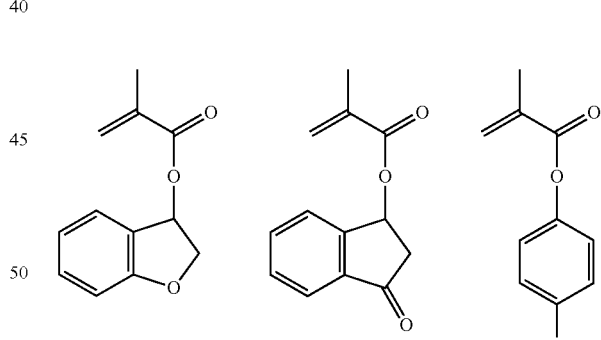
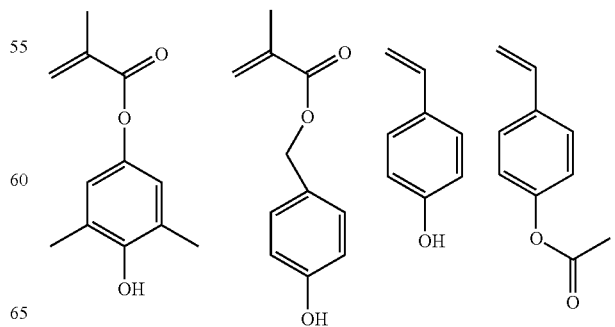

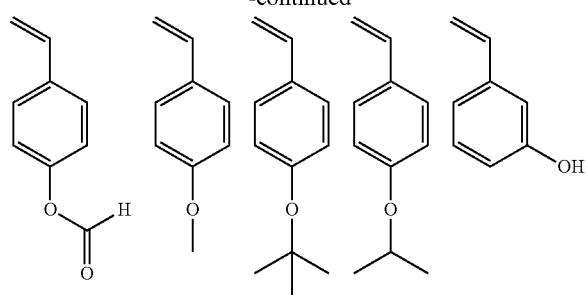
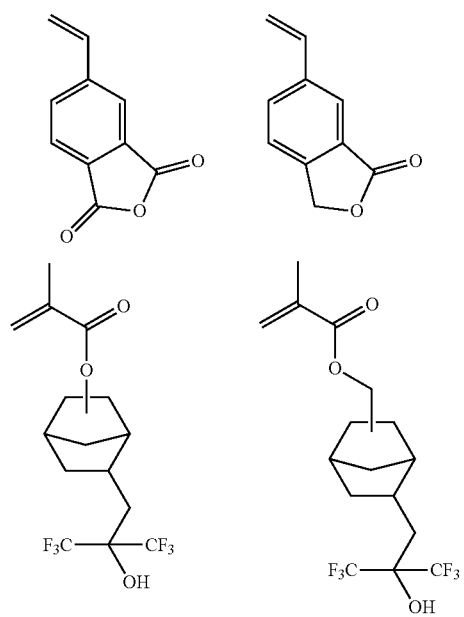
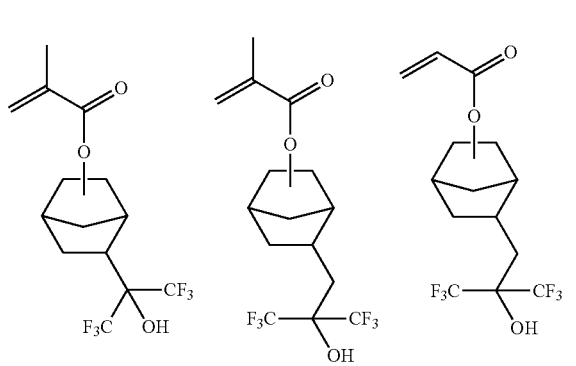
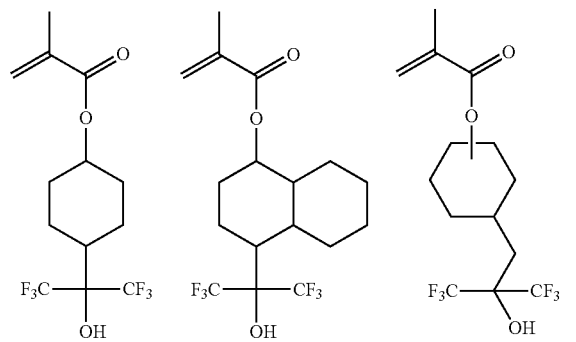
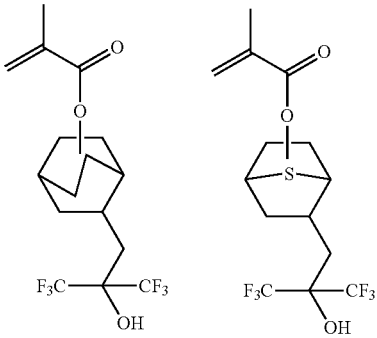
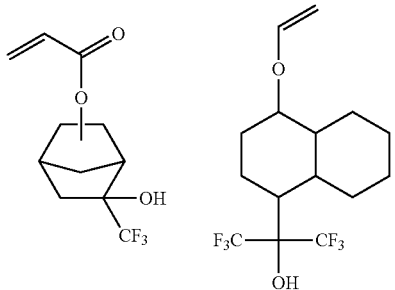

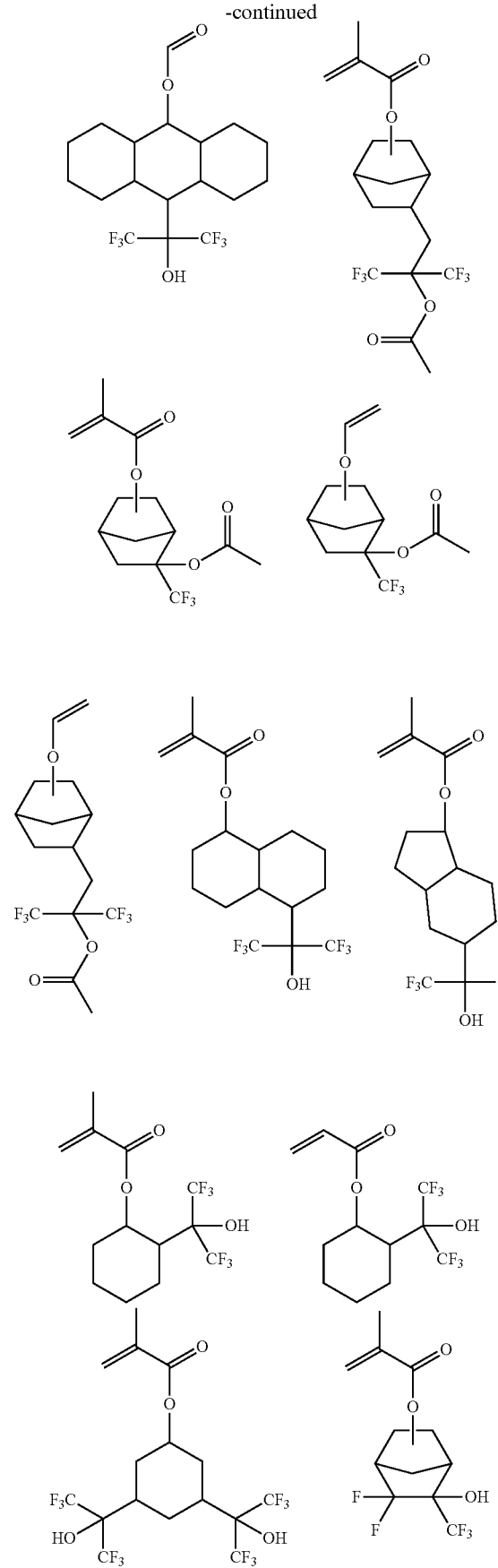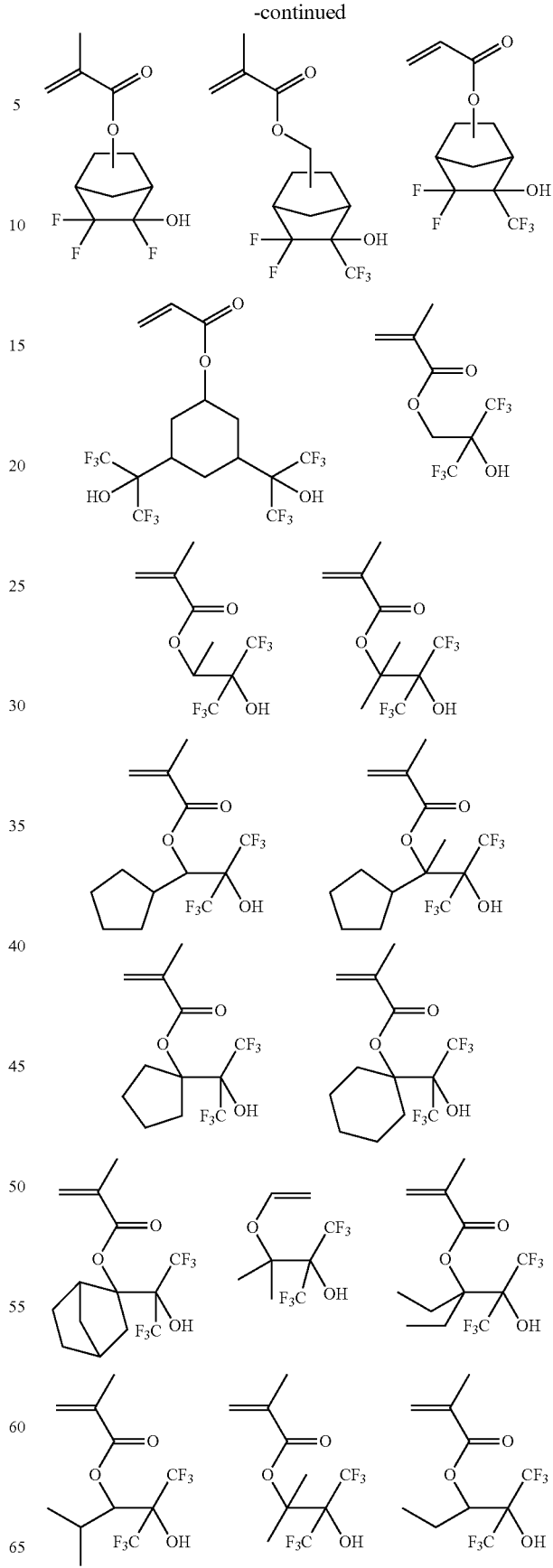

77
-continued
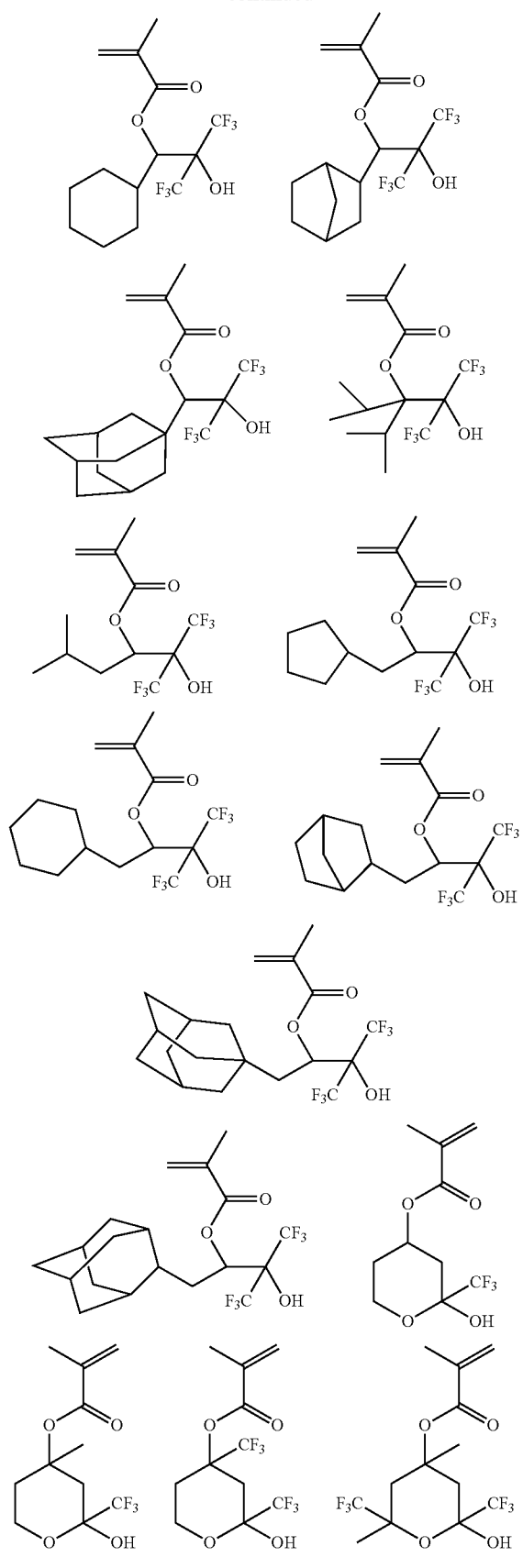
78
-continued
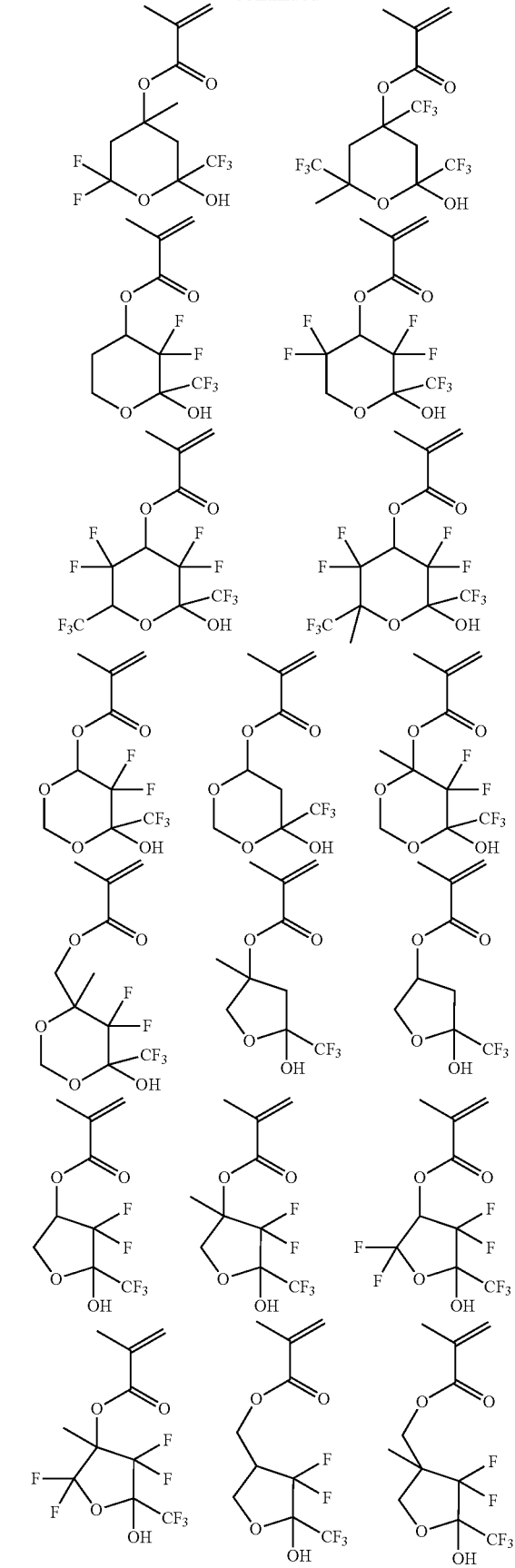

-continued

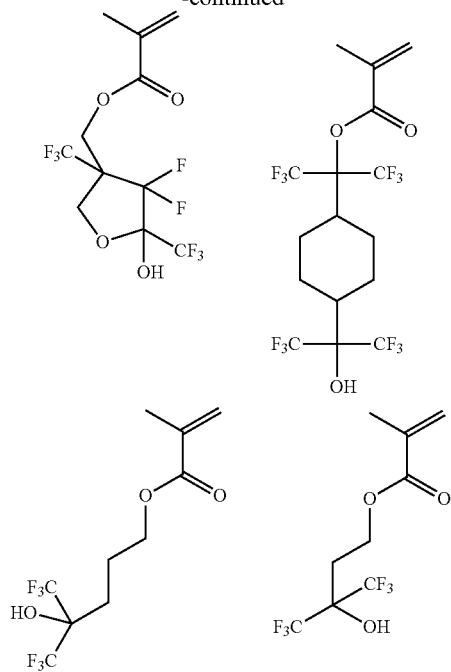

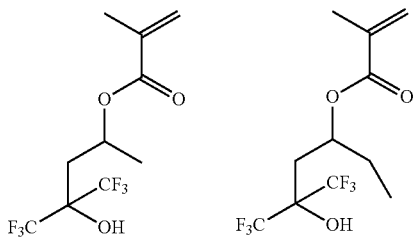

As alluded to previously, the pattern forming process is characterized by comprising the steps of applying a resist composition comprising a polymer comprising recurring units having a nitrogen atom bonded to an acid labile group, especially recurring units having an amino group substituted with an acid labile group, an acid generator, and an organic solvent onto a substrate, baking the composition to form a resist film, exposing the resist film to high-energy radiation to define exposed and unexposed regions, baking, and developing the exposed film with an organic solvent developer to form a negative pattern wherein the unexposed region of film is dissolved and the exposed region of film is not dissolved. In the process, the acid generator may be added by blending it with the polymer comprising recurring units having a nitrogen atom bonded to an acid labile group, especially recurring units having an amino group substituted with an acid labile group. Alternatively, the acid generator may be incorporated into the polymer by copolymerizing recurring units having the acid generator with the recurring units having a nitrogen atom bonded to an acid labile group, especially recurring units having an amino group substituted with an acid labile group.

The acid generator-containing recurring units which can be copolymerized include sulfonium salts (e1) to (e3) represented by the following general formula. Any one or more of these sulfonium salts may be copolymerized.

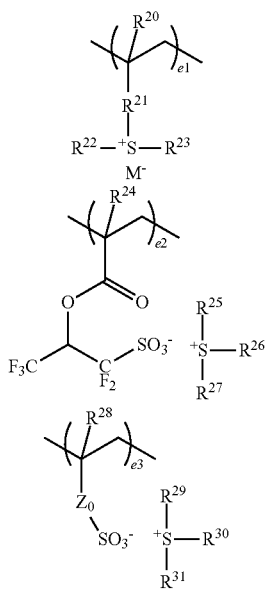

Herein $R^{20}$, $R^{24}$, and $R^{28}$ each are hydrogen or methyl. $R^{21}$ is a single bond, phenylene, —O—$R^{33}$—, or —C(=O)—Y—$R^{33}$— wherein Y is oxygen or NH, and $R^{33}$ is a straight, branched or cyclic $C_1$-$C_6$ alkylene group, alkenylene or phenylene group, which may contain a carbonyl (—CO—), ester (—COO—), ether (—O—) or hydroxyl radical. $R^{22}$, $R^{23}$, $R^{25}$, $R^{26}$, $R^{27}$, $R^{29}$, $R^{30}$, and $R^{31}$ are each independently a straight, branched or cyclic $C_1$-$C_{12}$ alkyl group which may contain a carbonyl, ester or ether radical, or a $C_6$-$C_{12}$ aryl, $C_7$-$C_{20}$ aralkyl, or thiophenyl group. $Z_0$ is a single bond, methylene, ethylene, phenylene, fluorophenylene, —O—$R^{32}$—, or —C(=O)—$Z_1$—$R^{32}$— wherein $Z_1$ is oxygen or NH, and $R^{32}$ is a straight, branched or cyclic $C_1$-$C_6$ alkylene group, alkenylene or phenylene group, which may contain a carbonyl, ester, ether or hydroxyl radical. M⁻ is a non-nucleophilic counter ion, e1, e2 and e3 are in the range of $0 \leq e1 \leq 0.3$, $0 \leq e2 \leq 0.3$, $0 \leq e3 \leq 0.3$, and $0 \leq e1+e2+e3 \leq 0.3$.

In the polymer, the recurring units (a1) and (a2) are preferably present in proportions: $0 \leq a1 < 1.0$, $0 \leq a2 < 1.0$, and $0 < a1+a2 \leq 1.0$. Assume $a1+a2=a$. The recurring units (a), (b), (c), (d), (e1), (e2), and (e3) are preferably present in proportions: $0 < a \leq 1.0$, $0 \leq b < 1.0$, $0 \leq c < 1.0$, $0 \leq d < 1.0$, $0 \leq e1 \leq 0.3$, $0 \leq e2 \leq 0.3$, $0 \leq e3 \leq 0.3$, and $0 \leq e1+e2+e3 \leq 0.3$, and more preferably, $0.01 \leq a \leq 1.0$, $0 \leq b \leq 0.8$, $0 \leq c \leq 0.8$, $0.1 \leq a+b+c \leq 1.0$, $0 \leq d \leq 0.9$, $0 \leq e1 \leq 0.15$, $0 \leq e2 \leq 0.15$, and $0 \leq e3 \leq 0.15$, provided that $a+b+c+d+e1+e2+e3=1$.

In the embodiment using a blend of a first polymer comprising recurring units (a) with a second polymer free of recurring units (a) and comprising recurring units (b) and/or (c), the second polymer is preferably constructed in the range: $a=0$, $0 \leq b < 1.0$, $0 \leq c < 1.0$, $0 \leq d \leq 0.9$, $0 \leq e1 \leq 1.0$, $0 \leq e2 \leq 1.0$, $0 \leq e3 \leq 1.0$, $0.1 \leq b+c \leq 1.0$, provided that $b+c+d+e1+e2+e3=1$.

The polymer serving as the base resin in the resist composition used in the pattern forming process of the invention should preferably have a weight average molecular weight (Mw) in the range of 1,000 to 500,000, and more preferably 2,000 to 30,000, as measured in tetrahydrofuran solvent by GPC versus polystyrene standards. With too low a Mw, a film thickness loss is likely to occur upon organic solvent development. A polymer with too high a Mw may lose solubility in organic solvent and have a likelihood of footing after pattern formation.

If a multi-component polymer has a broad molecular weight distribution or dispersity (Mw/Mn), which indicates the presence of lower and higher molecular weight polymer fractions, there is a possibility that following exposure, foreign matter is left on the pattern or the pattern profile is exacerbated. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is acceptable to use a blend of two or more polymers which differ in compositional ratio, molecular weight or dispersity or a blend of a polymer having a nitrogen atom bonded to an acid labile group and another polymer free of such nitrogen.

The polymer as used herein may be synthesized by any desired method, for example, by dissolving unsaturated bond-containing monomers corresponding to the respective units (a1), (a2), (b), (c), (d), (e1), (e2), and (e3) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomer may be kept as such, or the acid labile group may be once eliminated with an acid catalyst and thereafter introduced for protection or partial protection.

As described previously, the pattern forming process of the invention comprises the steps of coating the positive resist composition described above onto a substrate, prebaking the resist composition to form a resist film, exposing a selected region of the resist film to high-energy radiation, baking (PEB), and developing the exposed resist film with an organic solvent developer so that the unexposed region of film is dissolved and the exposed region of film is left, thereby forming a negative tone resist pattern such as a hole or trench pattern.

Resist Composition

The resist composition used in the pattern forming process of the invention may further comprise an organic solvent, a compound capable of generating an acid in response to high-energy radiation (known as "acid generator"), and optionally, a dissolution regulator, basic compound, surfactant, acetylene alcohol, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]). Where the polymer has a polymerizable acid generator unit selected from recurring units (e1), (e2) and (e3) copolymerized therein, the acid generator need not necessarily be added.

Examples of the organic solvent used herein are described in JP-A 2008-111103, paragraphs [0144] to [0145] (U.S. Pat. No. 7,537,880). Specifically, exemplary solvents include ketones such as cyclohexanone, cyclopentanone, and methyl-2-n-amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone, and mixtures thereof.

Exemplary basic compounds include primary, secondary and tertiary amine compounds, specifically amine compounds having a hydroxyl, ether, ester, lactone, cyano or sulfonic ester group, as described in JP-A 2008-111103, paragraphs [0146] to [0164], and compounds having a carbamate group, as described in JP 3790649.

Onium salts such as sulfonium salts, iodonium salts and ammonium salts of sulfonic acids which are not fluorinated at α-position as described in US 2008153030 (JP-A 2008-158339) and similar onium salts of carboxylic acid may be used as the quencher. While an α-position fluorinated sulfonic acid, imide acid, and methide acid are necessary to deprotect the acid labile group of carboxylic acid ester, an α-position non-fluorinated sulfonic acid and a carboxylic acid are released by salt exchange with an onium salt which is not fluorinated at α-position. An α-position non-fluorinated sulfonic acid and a carboxylic acid function as a quencher because they do not induce deprotection reaction. In particular, since sulfonium salts and iodonium salts of an α-position non-fluorinated sulfonic acid and a carboxylic acid are photo-decomposable, those portions receiving a high light intensity are reduced in quenching capability and increased in the concentration of a α-position fluorinated sulfonic acid, imide acid, or methide acid. As a result, the exposed portions are improved in contrast. When a negative tone pattern is formed using an organic solvent, the improvement in the contrast of exposed portions leads to an improvement in the rectangularity of negative pattern. Onium salts including sulfonium salts, iodonium salts and ammonium salts of an α-position non-fluorinated sulfonic acid and a carboxylic acid are highly effective in controlling the diffusion of an α-position fluorinated sulfonic acid, imide acid and methide acid. This is because the onium salt resulting from salt exchange is less mobile due to a higher molecular weight. In the event that a hole pattern is formed by negative development, since acid is generated in many regions, it is very important to control the diffusion of acid from the exposed area to the unexposed area. The addition of onium salts including sulfonium salts, iodonium salts and ammonium salts of an α-position non-fluorinated sulfonic acid and a carboxylic acid as well as the carbamate compound capable of generating an amine compound under the action of acid is very important from the aspect of controlling acid diffusion.

Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182].

To the resist composition, a base amplifier as described in JP-A 2000-330270 may be added. As the recurring unit is deprotected to generate an amino group under the action of an acid, the base amplifier generates an amine compound, enhancing the acid diffusion controlling effect.

Also a polymeric additive may be added for improving the water repellency on surface of a resist film as spin coated. This additive may be used in the topcoatless immersion lithography. These additives have a specific structure with a 1,1,1,3,3,3-hexafluoro-2-propanol residue and are described in JP-A 2007-297590, JP-A 2008-111103 and JP-A 2008-122932. The water repellency improver to be added to the resist should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB and avoiding any hole pattern opening failure after development. An appropriate amount of the water repellency improver is 0.1 to 20 parts, preferably 0.5 to 10 parts by weight per 100 parts by weight of the base resin.

Notably, an appropriate amount of the organic solvent is 100 to 10,000 parts, preferably 300 to 8,000 parts by weight, and an appropriate amount of the basic compound is 0.0001 to 30 parts, preferably 0.001 to 20 parts by weight, per 100 parts by weight of the base resin.

Process

Now referring to the drawings, the pattern forming process of the invention is illustrated in FIG. 1. First, the positive resist composition is coated on a substrate to form a resist film thereon. Specifically, a resist film 40 of a positive resist composition is formed on a processable substrate 20 disposed on a substrate 10 directly or via an intermediate intervening layer 30 as shown in FIG. 1A. The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, α-Si, TiN, WSi, BPSG, SOG, Cr, CrO, CrON, MoSi, low dielectric film, and etch stopper film. The intermediate intervening layer 30 includes hard masks of $SiO_2$, SiN, SiON or p-Si, an undercoat in the form of carbon film, a silicon-containing intermediate film, and an organic antireflective coating.

Next comes exposure depicted at 50 in FIG. 1B. For the exposure, preference is given to high-energy radiation having a wavelength of 140 to 250 nm and EUV having a wavelength of 13.5 nm, and especially ArF excimer laser radiation of 193 nm. The exposure may be done either in a dry atmosphere such as air or nitrogen stream or by immersion lithography in water. The ArF immersion lithography uses deionized water or liquids having a refractive index of at least 1 and highly transparent to the exposure wavelength such as alkanes as the immersion solvent. The immersion lithography involves exposing the prebaked resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective film-forming composition used herein may be based on a polymer comprising recurring units derived from a monomer having a 1,1,1,3,3,3-hexafluoro-2-propanol residue. While the protective film must dissolve in the organic solvent developer, the polymer comprising recurring units derived from a monomer having a 1,1,1,3,3,3-hexafluoro-2-propanol residue dissolves in organic solvent developers. In particular, protective film-forming materials having 1,1,1,3,3,3-hexafluoro-2-propanol residues as described in JP-A 2008-081716 and JP-A 2008-111089 readily dissolve in organic solvent developers.

In the protective film-forming composition, an amine compound or amine salt or a polymer having copolymerized therein recurring units containing an amine compound or amine salt may be used. This component is effective for controlling diffusion of the acid generated in the exposed region of the photoresist film to the unexposed region for thereby preventing any hole opening failure. Useful protective film materials having an amine compound added thereto are described in JP-A 2008-003569. The amine compound may be selected from the compounds enumerated as the basic compound to be added to the resist composition. An appropriate amount of the amine compound added is 0.01 to 10 parts, preferably 0.02 to 8 parts by weight per 100 parts by weight of the base resin.

After formation of the resist film, deionized water rinsing (or post-soaking) may be carried out for extracting the acid generator and the like from the film surface or washing away particles, or after exposure, rinsing (or post-soaking) may be carried out for removing water droplets left on the resist film. If the acid evaporating from the exposed region during PEB deposits on the unexposed region to deprotect the protective group on the surface of the unexposed region, there is a possibility that the surface edges of holes after development are bridged to close the holes. Particularly in the case of negative development, regions surrounding the holes receive light so that acid is generated therein. There is a possibility that the holes are not opened if the acid outside the holes evaporates and deposits inside the holes during PEB. Provision of a protective film is effective for preventing evaporation of acid and for avoiding any hole opening failure. A protective film having an amine compound added thereto is more effective for preventing acid evaporation. On the other hand, a protective film to which an acid compound such as a carboxyl or sulfo group is added or which is based on a polymer having copolymerized therein monomeric units containing a carboxyl or sulfo group is undesirable because of a potential hole opening failure.

Exposure is preferably performed in an exposure dose of about 1 to 200 $mJ/cm^2$, more preferably about 10 to 100 $mJ/cm^2$. This is followed by baking (PEB) on a hot plate at 60 to 150° C. for 1 to 5 minutes, preferably at 80 to 120° C. for 1 to 3 minutes.

Thereafter the exposed resist film is developed with a developer consisting of an organic solvent for 0.1 to 3 minutes, preferably 0.5 to 2 minutes by any conventional techniques such as dip, puddle and spray techniques. In this way, the unexposed region of resist film was dissolved away, leaving a negative resist pattern 40 on the substrate 10 as shown in FIG. 1C. The developer used herein is preferably selected from among ketones such as 2-octanone, 2-nonanone, 2-heptanone, 3-heptanone, 4-heptanone, 2-hexanone, 3-hexanone, diisobutyl ketone, methylcyclohexanone, acetophenone, and methylacetophenone; esters such as propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, and ethyl crotonate; and aromatic esters such as methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof.

A surfactant may be added to the developer. The surfactant used herein may be selected from the compounds exemplified above in conjunction with the resist composition. It is advantageous to add a fluorochemical surfactant among others because in dispensing a developer, a spreading rate of the developer can be improved.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-t-amyl ether, and di-n-hexyl ether. Suitable aromatic solvents include toluene, xylene, ethylbenzene, isopropylbenzene, t-butylbenzene, and mesitylene. The solvents may be used alone or in admixture.

Where a hole pattern is formed by negative tone development, exposure by double dipole illuminations of X- and Y-direction line patterns provides the highest contrast light. The contrast may be further increased by combining dipole illumination with s-polarized illumination.

FIG. 2 is an optical image of X-direction lines having a pitch of 90 nm and a line size of 45 nm printed under conditions: ArF excimer laser of wavelength 193 nm, NA 1.3 lens, dipole illumination, 6% halftone phase shift mask, and s-polarization.

Figure 3:
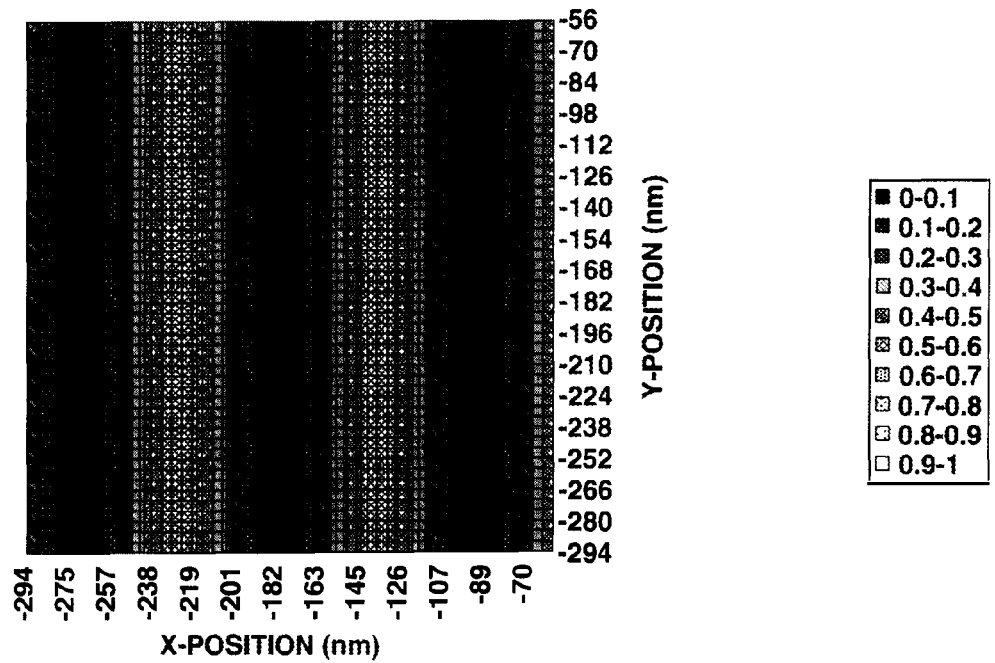
FIG. 3 is an optical image of Y-direction lines like FIG. 2.

FIG. 3 is an optical image of Y-direction lines having a pitch of 90 nm and a line size of 45 nm printed under conditions: ArF excimer laser of wavelength 193 nm, NA 1.3 lens, dipole illumination, 6% halftone phase shift mask, and s-polarization. A black area is a light shielded area while a white area is a high light intensity area. A definite contrast difference is recognized between white and black, indicating the presence of a fully light shielded area.

Figure 4:
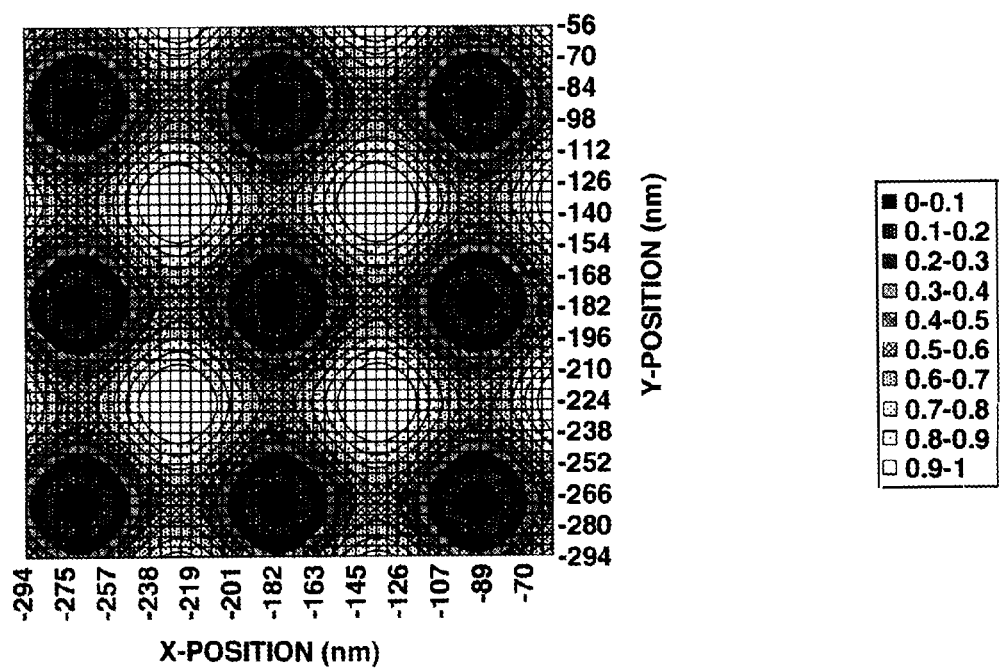
FIG. 4 shows a contrast image obtained by overlaying the optical image of X-direction lines in FIG. 2 with the optical image of Y-direction lines in FIG. 3.

FIG. 4 shows a contrast image obtained by overlaying the optical image of X-direction lines in FIG. 2 with that of Y-direction lines in FIG. 3. Against the expectation that a combination of X and Y lines may form a lattice-like image, weak light black areas draw circular shapes. As the pattern (circle) size becomes larger, the circular shape changes to a rhombic shape to merge with adjacent ones. As the circle size becomes smaller, circularity is improved, which is evidenced by the presence of a fully light shielded small circle.

Figure 18:
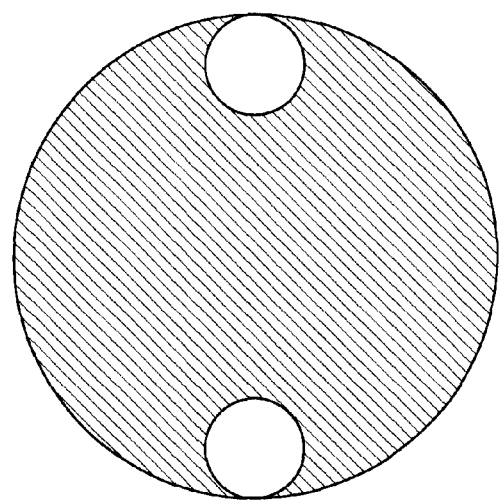
FIG. 18 illustrates an aperture configuration in an exposure tool of dipole illumination for improving the contrast of X-direction lines.
Figure 19:
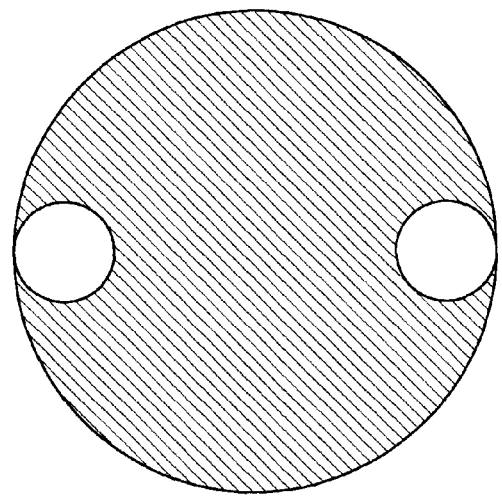
FIG. 19 illustrates an aperture configuration in an exposure tool of dipole illumination for improving the contrast of Y-direction lines.

Exposure by double dipole illuminations of X- and Y-direction lines combined with polarized illumination presents a method of forming light of the highest contrast. This method, however, is not regarded practical because of the drawback that the throughput is substantially reduced by double exposures and mask exchange therebetween. It is then proposed in Non-Patent Document 1 to carry out two exposures by dipole illuminations in X and Y directions using a mask bearing a lattice-like pattern. As described in Non-Patent Document 1, the method involves forming X-direction lines in a first photoresist film by X-direction dipole illumination using a mask bearing a lattice-like pattern, insolubilizing the X-direction lines by light irradiation, coating a second photoresist film thereon, and forming Y-direction lines by Y-direction dipole illumination, thereby forming holes at the interstices between X- and Y-direction lines. Although only a single mask is needed, this method includes additional steps of insolubilizing the first photoresist pattern between the two exposures, and coating and developing the second photoresist film. Then the wafer must be removed from the exposure stage between the two exposures, giving rise to the problem of an increased alignment error. To minimize the alignment error between two exposures, two exposures must be continuously carried out without removing the wafer from the exposure stage. FIG. 18 shows the shape of apertures for dipole illumination for forming X-direction or horizontal lines using a mask bearing a lattice-like pattern, and FIG. 19 shows the shape of apertures for dipole illumination for forming Y-direction or vertical lines. The addition of s-polarized illumination to dipole illumination provides a further improved contrast and is thus preferably employed. After two exposures for forming X- and Y-direction lines using a lattice-like mask are performed in an overlapping manner, negative tone development is performed whereupon a hole pattern is formed.

Figure 20:
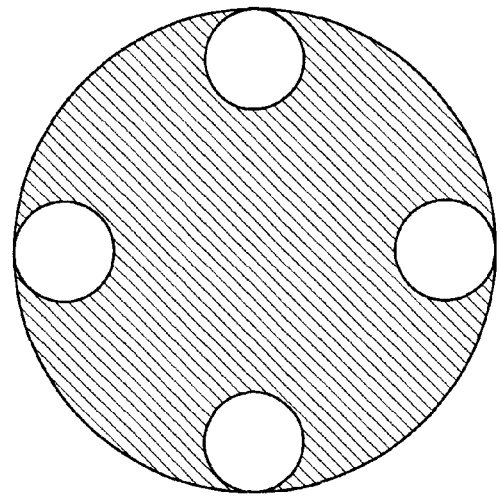
FIG. 20 illustrates an aperture configuration in an exposure tool of cross-pole illumination.

When it is desired to form a hole pattern via a single exposure using a lattice-like mask, a quadra-pole illumination or cross-pole illumination in the aperture configuration shown in FIG. 20 is used. The contrast may be improved by combining it with X-Y polarized illumination or azimuthally polarized illumination of circular polarization. As compared with the above exposure by two dipole illuminations in X and Y directions, this method has the advantage of single exposure despite a somewhat reduced optical contrast.

In the hole pattern forming process of the invention, when two exposures are involved, these exposures are consecutively carried out by changing the illumination for the second exposure from that for the first exposure, whereby an alignment error can be minimized. Of course, the single exposure entails a smaller alignment error than the two consecutive exposures.

Figure 5:
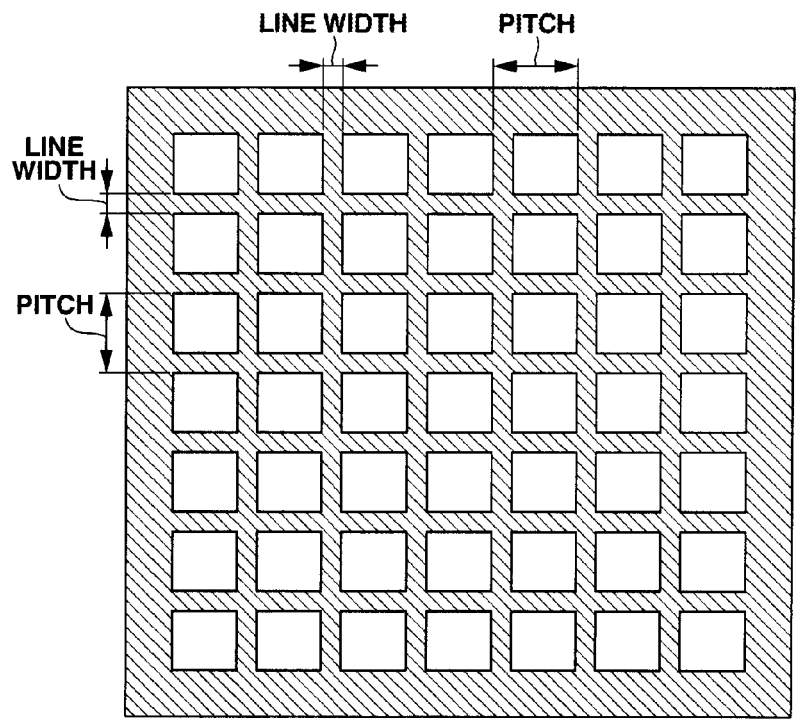
FIG. 5 illustrates a mask bearing a lattice-like pattern.
Figure 7:
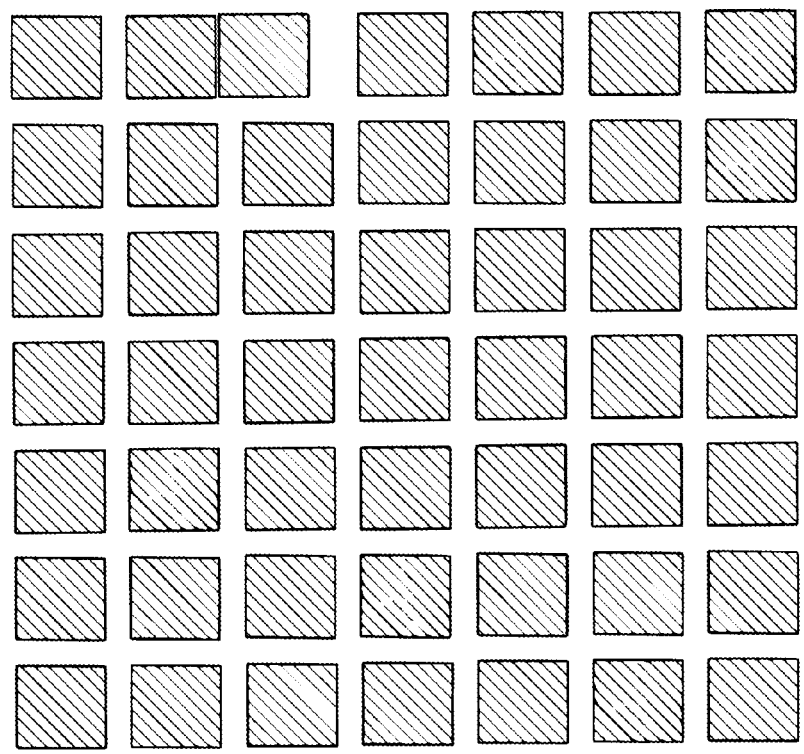
FIG. 7 illustrates a mask bearing a dot pattern of square dots having a side width of 60 nm.
Figure 9:
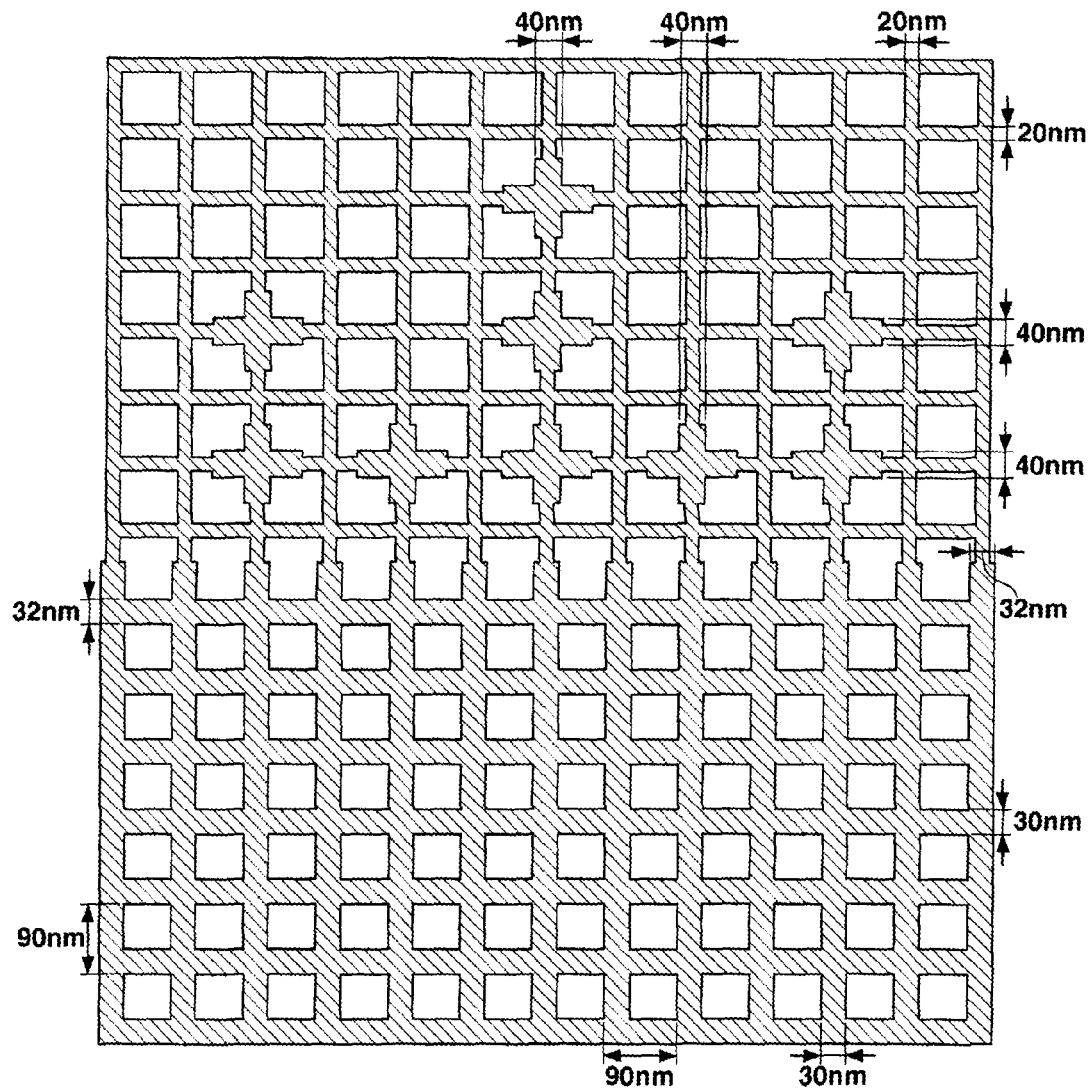
FIG. 9 illustrates a 6% halftone phase shift mask bearing a lattice-like pattern having a pitch of 90 nm and a line width of 20 nm on which thick crisscross or intersecting line segments are disposed where dots are to be formed.
Figure 11:
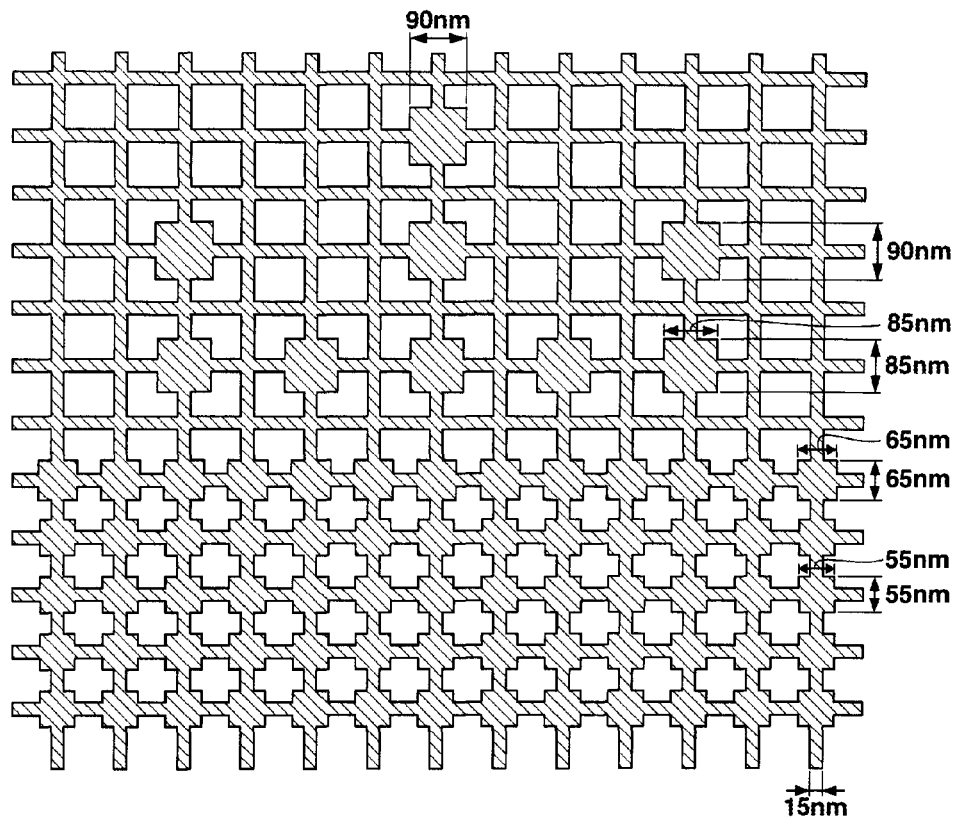
FIG. 11 illustrates a 6% halftone phase shift mask bearing a lattice-like pattern having a pitch of 90 nm and a line width of 15 nm on which thick dots are disposed where dots are to be formed.

When two exposures are performed using a single mask, the mask pattern may be a lattice-like pattern as shown in FIG. 5, a dot pattern as shown in FIG. 7, a pattern of gratings of varying size as shown in FIG. 9, or a combination of a dot pattern and a lattice-like pattern as shown in FIG. 11. The use of a lattice-like pattern contributes to the most improved light contrast, but has the drawback of a reduced resist sensitivity due to a lowering of light intensity. On the other hand, the use of a dot pattern suffers a lowering of light contrast, but provides the merit of an improved resist sensitivity.

Where holes are arrayed in horizontal and vertical directions, the above-described illumination and mask pattern are used. Where holes are arrayed at a different angle, for example, at an angle of 45°, a mask of a 45° arrayed pattern is combined with dipole illumination or cross-pole illumination.

Where two exposures are performed, a first exposure by a combination of dipole illumination with polarized illumination for enhancing the contrast of X-direction lines is followed by a second exposure by a combination of dipole illumination with polarized illumination for enhancing the contrast of Y-direction lines. Two consecutive exposures with the X- and Y-direction contrasts emphasized through a single mask can be performed on a currently commercially available scanner.

The method of combining X and Y polarized illuminations with cross-pole illumination using a mask bearing a lattice-like pattern can form a hole pattern through a single exposure, despite a slight lowering of light contrast as compared with two exposures of dipole illumination. The method is estimated to attain a substantial improvement in throughput and avoids the problem of misalignment between two exposures. Using such a mask and illumination, a hole pattern having a half pitch of the order of 40 nm can be formed at a practically acceptable cost.

Figure 6:
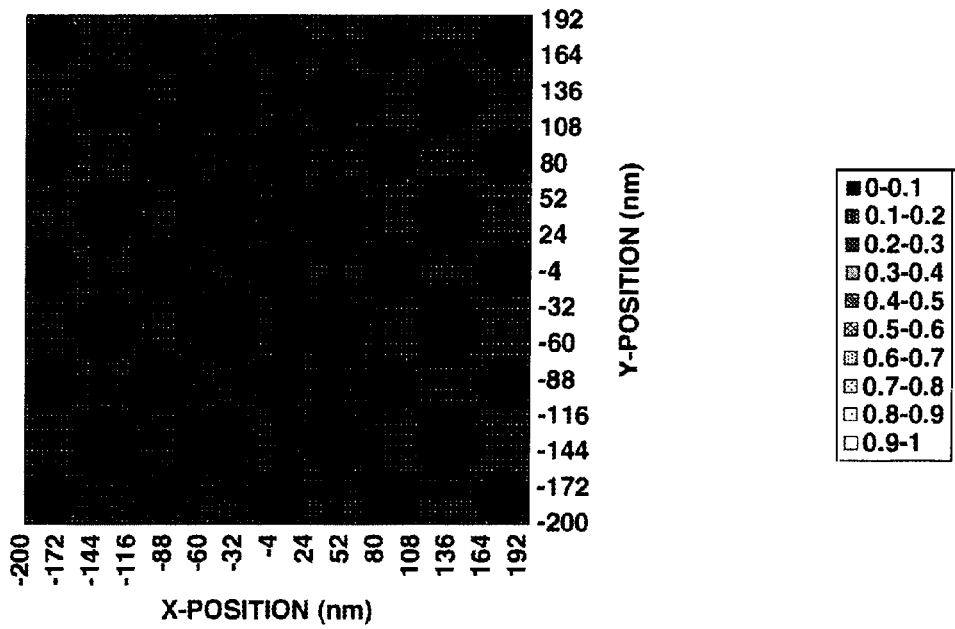
FIG. 6 is an optical image of a lattice-like pattern having a pitch of 90 nm and a line width of 30 nm printed under conditions: NA 1.3 lens, cross-pole illumination, 6% halftone phase shift mask, and azimuthally polarized illumination.

On use of a mask bearing a lattice-like pattern as shown in FIG. 5 where light is fully shielded at intersections between gratings, black spots having a very high degree of light shielding appear as shown in FIG. 6. FIG. 6 is an optical image of a lattice-like line pattern having a pitch of 90 nm and a line width of 30 nm printed under conditions: NA 1.3 lens, cross-pole illumination, 6% halftone phase shift mask, and azimuthally polarized illumination. A fine hole pattern may be formed by performing exposure through a mask bearing such a pattern and organic solvent development entailing positive/negative reversal.

Figure 8:
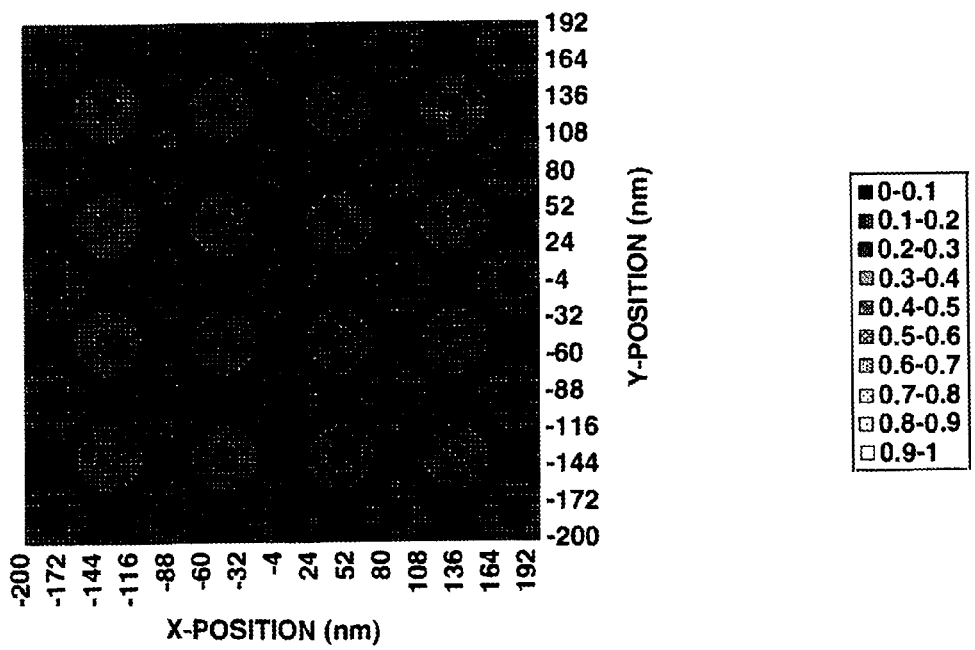
FIG. 8 is an optical image printed under conditions: the mask of FIG. 7, NA 1.3 lens, cross-pole illumination, 6% halftone phase shift mask, and azimuthally polarized illumination, showing its contrast.

On use of a mask bearing a dot pattern of square dots having a pitch of 90 nm and a side width of 60 nm as shown in FIG. 7, under conditions: NA 1.3 lens, cross-pole illumination, 6% halftone phase shift mask, and azimuthally polarized illumination, an optical image is obtained as shown in FIG. 8 that depicts the contrast thereof. Although the circle of fully light shielded spot in FIG. 8 has a smaller area than in FIG. 6, which indicates a low contrast as compared with the lattice-like pattern mask, the formation of a hole pattern is possible owing to the presence of black or light shielded spots.

With respect to the mask type, binary masks and phase shift masks are included. Either of these masks may be used in the pattern forming process of the invention. Suitable phase shift masks include halftone phase shift masks and Shibuya-Levenson phase shift masks, with the halftone phase shift masks being preferred for ease of fabrication and no limitation on pattern layout. The halftone phase shift masks preferably have a transmittance of 3 to 15%.

It is difficult to form a fine hole pattern that holes are randomly arrayed at varying pitch and position. The super-resolution technology using off-axis illumination (such as dipole or cross-pole illumination) in combination with a phase shift mask and polarization is successful in improving the contrast of dense (or grouped) patterns, but not so the contrast of isolated patterns.

When the super-resolution technology is applied to repeating dense patterns, the pattern density bias between dense and isolated patterns, known as proximity bias, becomes a problem. As the super-resolution technology used becomes stronger, the resolution of a dense pattern is more improved, but the resolution of an isolated pattern remains unchanged. Then the proximity bias is exaggerated. In particular, an increase of proximity bias in a hole pattern resulting from further miniaturization poses a serious problem. One common approach taken to suppress the proximity bias is by biasing the size of a mask pattern. Since the proximity bias varies with properties of a photoresist composition, specifically dissolution contrast and acid diffusion, the proximity bias of a mask varies with the type of photoresist composition. For a particular type of photoresist composition, a mask having a different proximity bias must be used. This adds to the burden of mask manufacturing. Then the pack and unpack (PAU) method is proposed in Proc. SPIE Vol. 5753, p 171 (2005), which involves strong super-resolution illumination of a first positive resist to resolve a dense hole pattern, coating the first positive resist pattern with a negative resist film material in alcohol solvent which does not dissolve the first positive resist pattern, exposure and development of an unnecessary hole portion to close the corresponding holes, thereby forming both a dense pattern and an isolated pattern. One problem of the PAU method is misalignment between first and second exposures, as the authors point out in the report. The hole pattern which is not closed by the second development experiences two developments and thus undergoes a size change, which is another problem.

Figure 10:
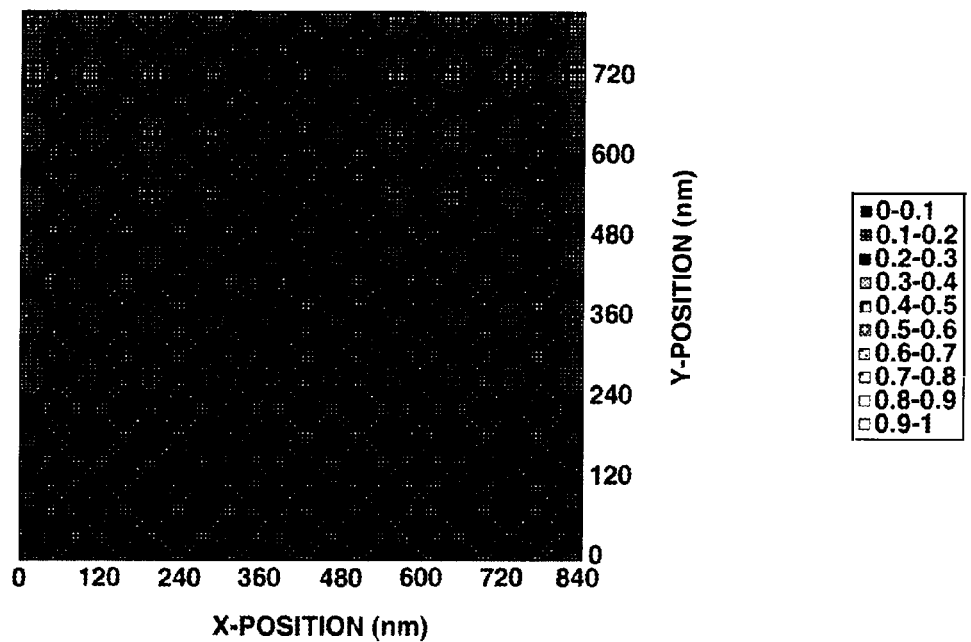
FIG. 10 is an optical image printed under conditions: the mask of FIG. 9, NA 1.3 lens, cross-pole illumination, 6% halftone phase shift mask, and azimuthally polarized illumination, showing its contrast.

To form a random pitch hole pattern by organic solvent development entailing positive/negative reversal, a mask is used in which a lattice-like pattern is arrayed over the entire surface and the width of gratings is thickened only where holes are to be formed. As shown in FIG. 9, on a lattice-like pattern having a pitch of 90 nm and a line width of 20 nm, thick crisscross or intersecting line segments are disposed where dots are to be formed. A black area corresponds to the halftone shifter portion. Line segments with a width of 30 nm are disposed in the dense pattern portion whereas thicker line segments (width 40 nm in FIG. 9) are disposed in more isolated pattern portions. Since the isolated pattern provides light with a lower intensity than the dense pattern, thicker line segments are used. Since the peripheral area of the dense pattern provides light with a relatively low intensity, line segments having a width of 32 nm are assigned to the peripheral area which width is slightly greater than that in the internal area of the dense pattern. FIG. 10 shows an optical image from the mask of FIG. 9, indicating the contrast thereof. Black or light shielded areas are where holes are formed via positive/negative reversal. Black spots are found at positions other than where holes are formed, but few are transferred in practice because they are of small size. Optimization such as reduction of the width of grating lines corresponding to unnecessary holes can inhibit transfer of unnecessary holes.

Figure 12:
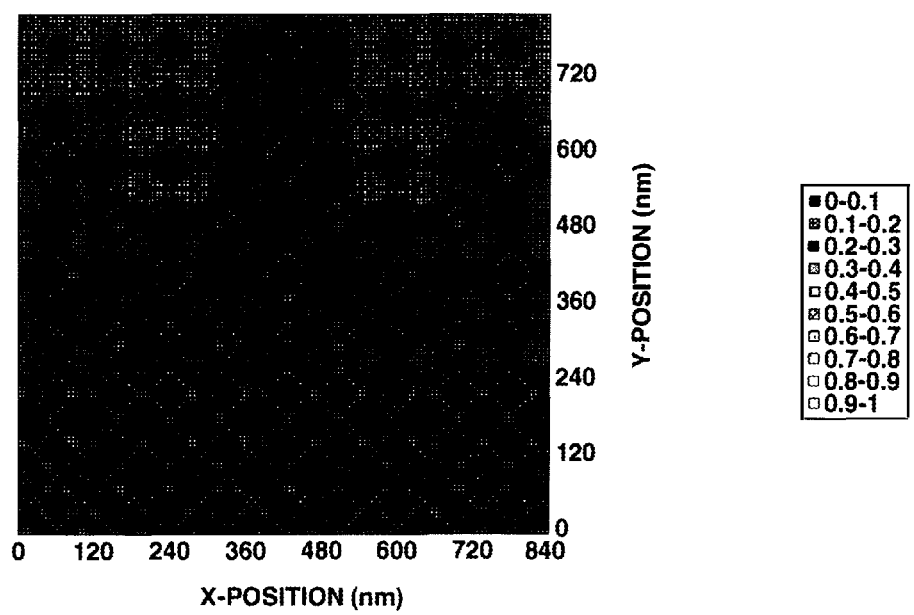
FIG. 12 is an optical image printed under conditions: the mask of FIG. 11, NA 1.3 lens, cross-pole illumination, 6% halftone phase shift mask, and azimuthally polarized illumination, showing its contrast.

Also useful is a mask in which a lattice-like pattern is arrayed over the entire surface and thick dots are disposed only where holes are to be formed. As shown in FIG. 11, on a lattice-like pattern having a pitch of 90 nm and a line width of 15 nm, thick dots are disposed where dots are to be formed. A black area corresponds to the halftone shifter portion. Square dots having one side with a size of 55 nm are disposed in the dense pattern portion whereas larger square dots (side size 90 nm in FIG. 11) are disposed in more isolated pattern portions. Although square dots are shown in the figure, the dots may have any shape including rectangular, rhombic, pentagonal, hexagonal, heptagonal, octagonal, and polygonal shapes and even circular shape. FIG. 12 shows an optical image from the mask of FIG. 11, indicating the contrast thereof. The presence of black or light shielded spots substantially equivalent to those of FIG. 10 indicates that holes are formed via positive/negative reversal.

Figure 13:
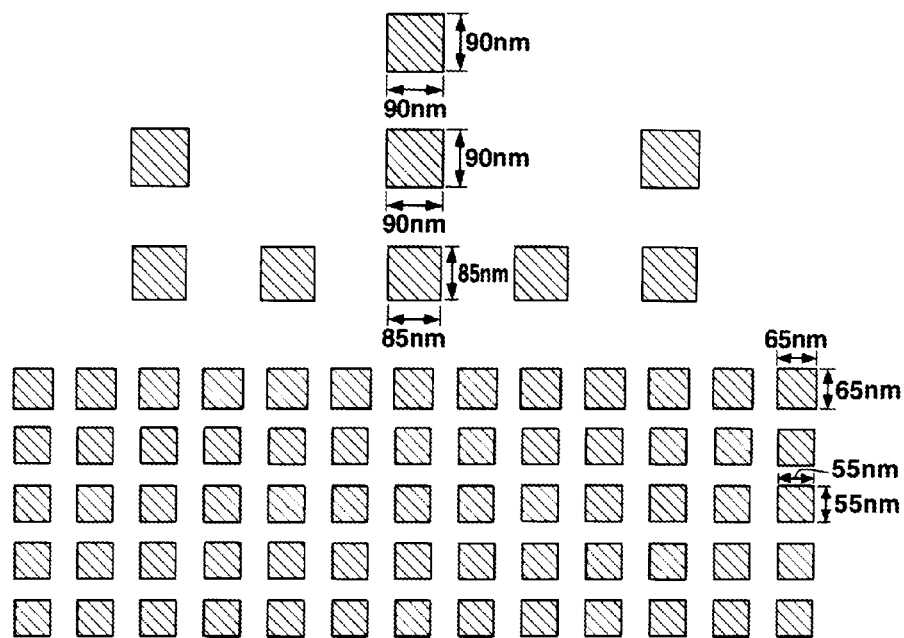
FIG. 13 illustrates a 6% halftone phase shift mask bearing only a dot pattern, but not a lattice-like pattern.
Figure 14:
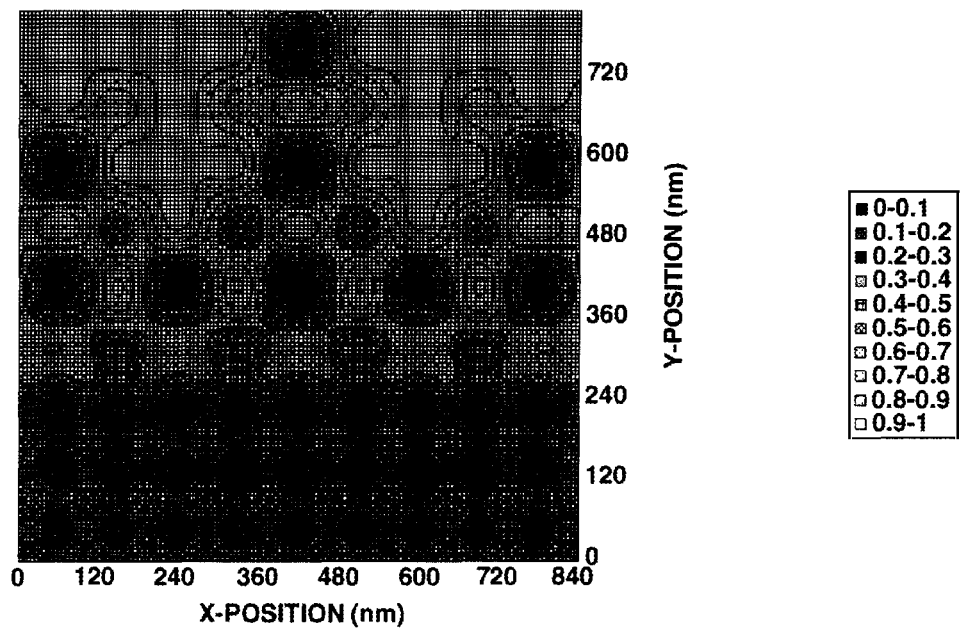
FIG. 14 is an optical image printed under conditions: the mask of FIG. 13, NA 1.3 lens, cross-pole illumination, and azimuthally polarized illumination, showing its contrast.

On use of a mask bearing no lattice-like pattern arrayed as shown in FIG. 13, black or light shielded spots do not appear as shown in FIG. 14. In this case, holes are difficult to form, or even if holes are formed, a variation of mask size is largely reflected by a variation of hole size because the optical image has a low contrast.

EXAMPLE

Examples of the invention are given below by way of illustration and not by way of limitation. The abbreviation "pbw" is parts by weight. For all polymers, Mw and Mn are determined by GPC versus polystyrene standards using tetrahydrofuran solvent. For pattern profile observation, a top-down scanning electron microscope (TDSEM) S-9380 (Hitachi Hitechnologies, Ltd.) was used.

Reference Example

Reference is made to the synthesis of a nitrogen-containing monomer used in the preparation of Resist Polymer 9.

Synthesis of 1-tert-butoxycarbonylpiperidin-4-yl methacrylate

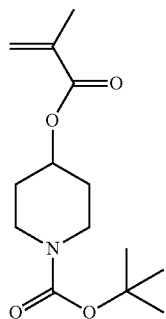 [SMILES: C=C(C)C(=O)OC1CCN(C(=O)OC(C)(C)C)CC1]

In a nitrogen atmosphere, 50 g of 1-tert-butoxycarbonylpiperidin-4-ol, 26.8 g of triethylamine, and 2.9 g of 4-dimethylaminopyridine were mixed in 200 g of toluene. Under ice cooling, 40 g of methacrylic anhydride was added dropwise to the solution at a temperature below 40° C. The solution was stirred for 4 hours at room temperature, whereupon 100 g of water was added dropwise below 20° C. to quench the reaction. This was followed by standard aqueous workup and vacuum distillation, obtaining 48.9 g of 1-tert-butoxycarbonylpiperidin-4-yl methacrylate (yield 90%).

IR (D-ATR): ν=2953, 1721, 1699, 1638, 1429, 1366, 1327, 1294, 1274, 1239, 1168, 1030, 990, 944, 863, 815, 752 cm$^{-1}$.

$^1$H-NMR (300 MHz in DMSO-d$_6$):
δ=6.04 (1H, m), 5.67 (1H, m), 4.91 (1H, m), 3.53 (2H, m), 3.25 (2H, m), 1.87 (1H, s), 1.79 (2H, m), 1.50 (1H, m), 1.39 (9H, s) ppm.

Understandably, other nitrogen-containing monomers were similarly synthesized.

Synthesis Example

Polymers for use in resist compositions were prepared from selected monomers by a standard technique including copolymerization reaction in tetrahydrofuran solvent, crystallization from methanol, repeated washing with hexane, isolation and drying. The resulting polymers designated Polymers 1 to 23 and Comparative Polymers 1 to 3 had a composition as analyzed by $^1$H-NMR spectroscopy and a Mw and dispersity (Mw/Mn) as measured by GPC.

Resist Polymer 1
Mw=8,310
Mw/Mn=1.73

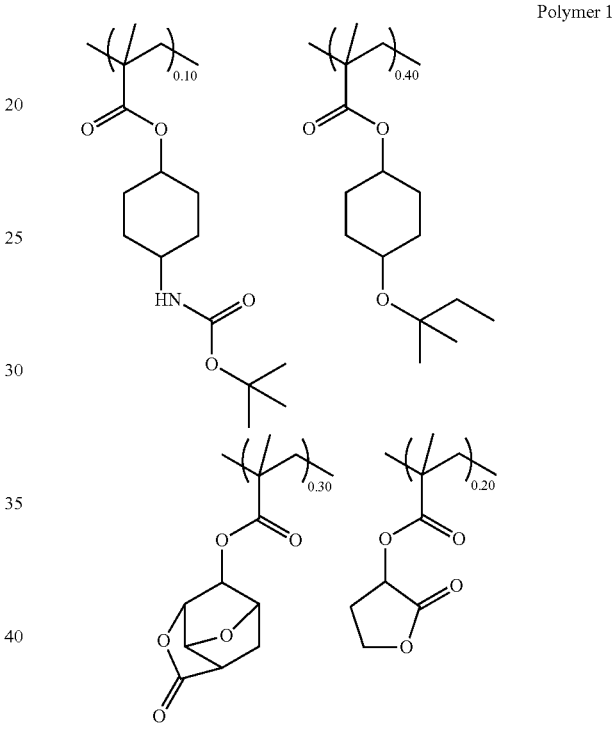

Polymer 1

Resist Polymer 2
Mw=8,900
Mw/Mn=1.89

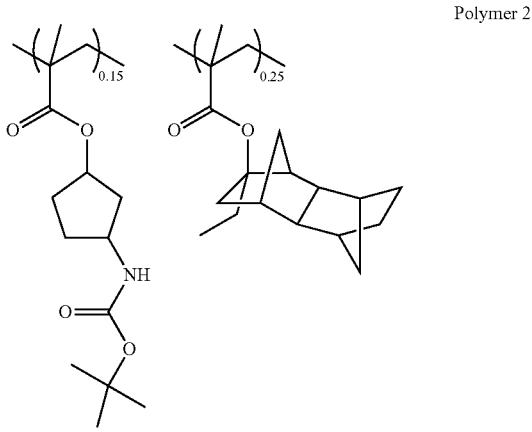

Polymer 2

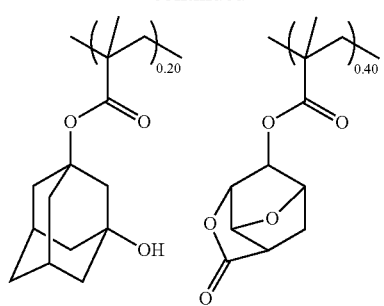
Resist Polymer 3
  Mw=8,200
  Mw/Mn=1.84
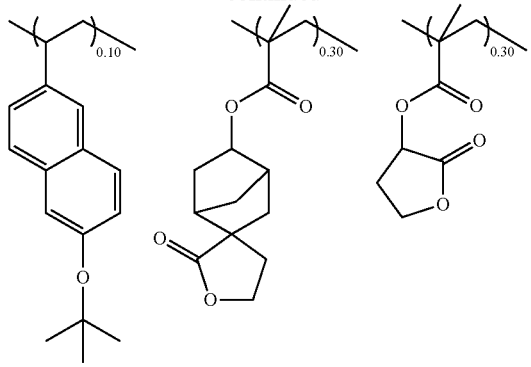
Polymer 3
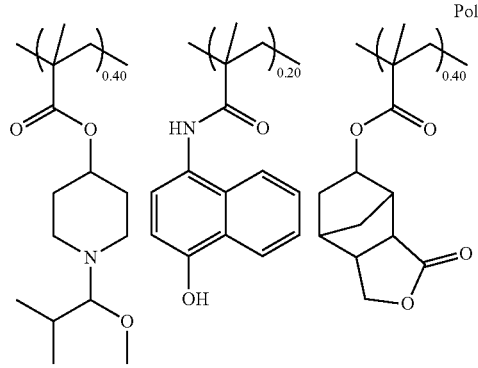
Resist Polymer 4
  Mw=8,300
  Mw/Mn=1.89
Polymer 4
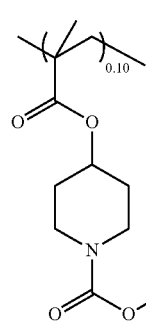
Resist Polymer 5
  Mw=6,500
  Mw/Mn=1.79
Polymer 5
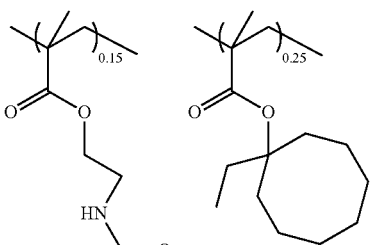
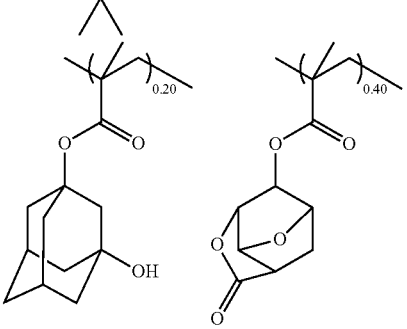

Resist Polymer 6
Mw=8,770
Mw/Mn=1.77
Polymer 6
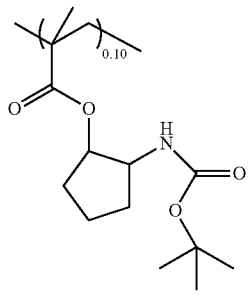
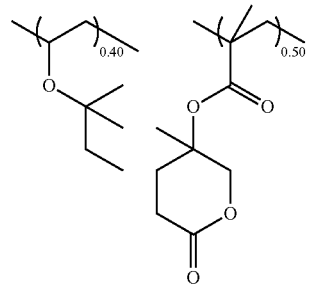
Resist Polymer 7
Mw=8,900
Mw/Mn=1.71
Polymer 7
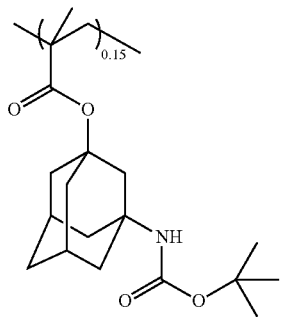
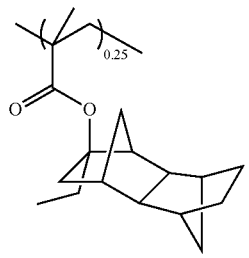
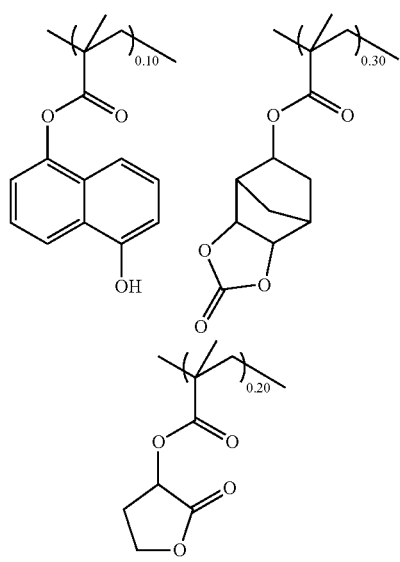
Resist Polymer 8
Mw=9,900
Mw/Mn=1.98
Polymer 8
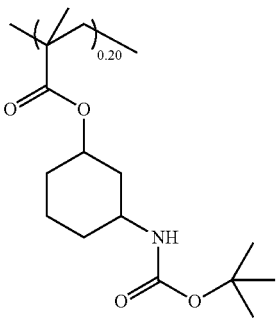
Resist Polymer 9
Mw=8,900
Mw/Mn=1.71
Polymer 9
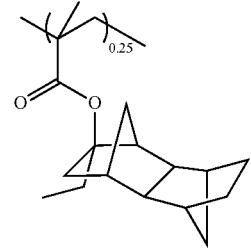
Resist Polymer 10
Mw=8,900
Mw/Mn=1.99
Polymer 10
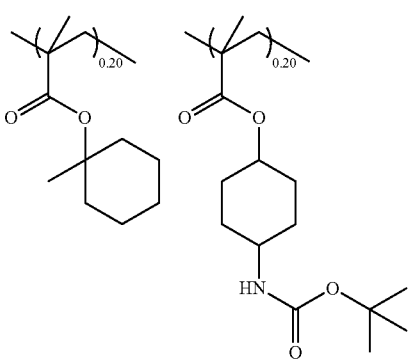

Resist Polymer 11
Mw=8,500
Mw/Mn=1.83
Polymer 11
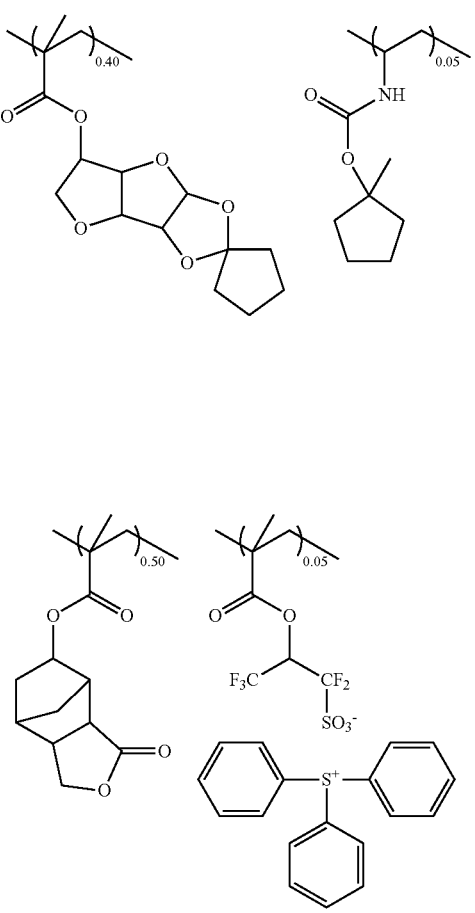
Resist Polymer 12
Mw=8,200
Mw/Mn=1.72
Polymer 12
Resist Polymer 13
Mw=8,900
Mw/Mn=1.89
Polymer 13
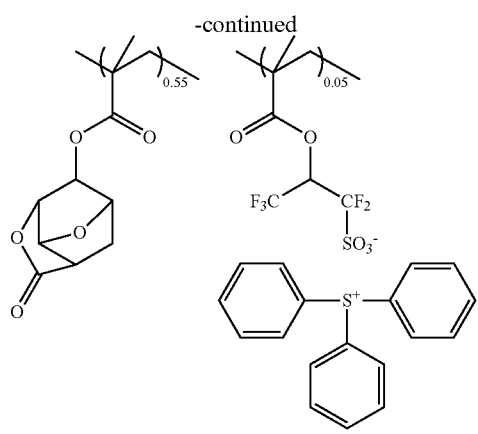
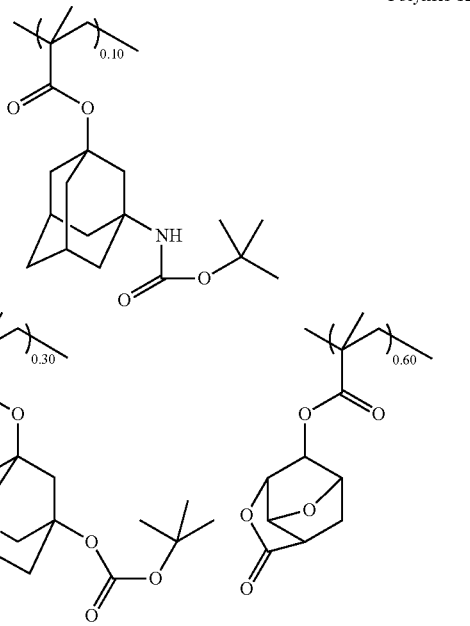

Resist Polymer 14
 Mw=8,300
 Mw/Mn=1.82
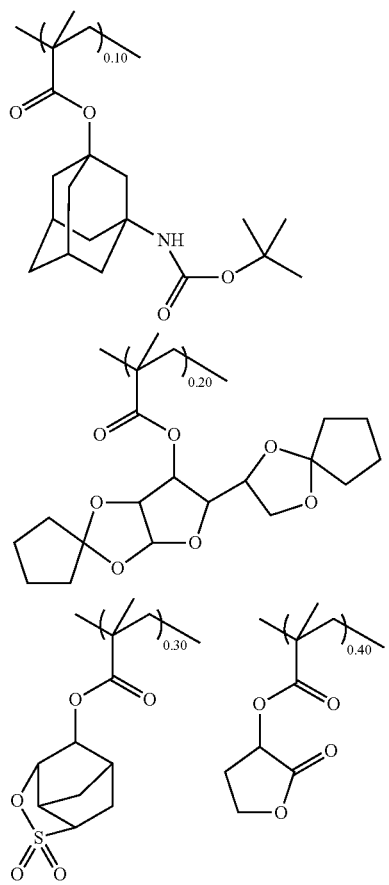
Resist Polymer 15
 Mw=8,300
 Mw/Mn=1.93
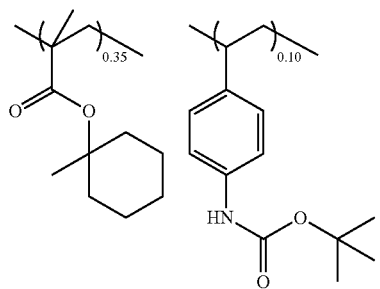
Polymer 14
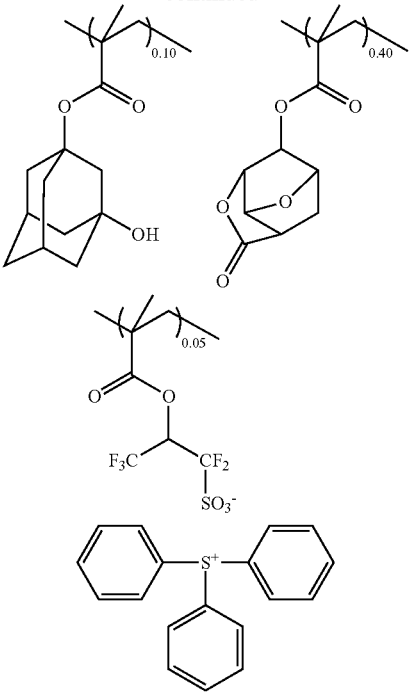
Resist Polymer 16
 Mw=8,300
 Mw/Mn=1.93
Polymer 15
Polymer 16
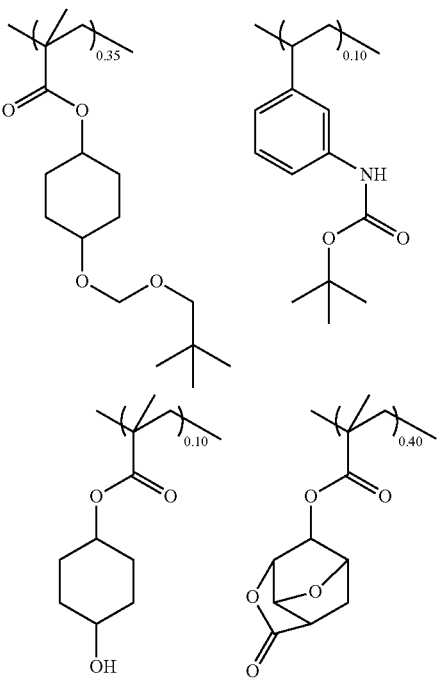

-continued
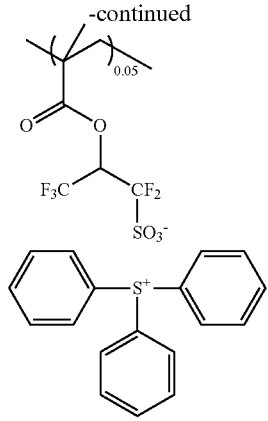
Resist Polymer 17
 Mw=8,300
 Mw/Mn=1.99
Polymer 17
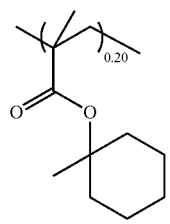 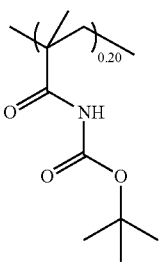 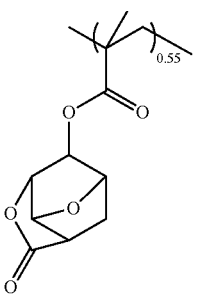
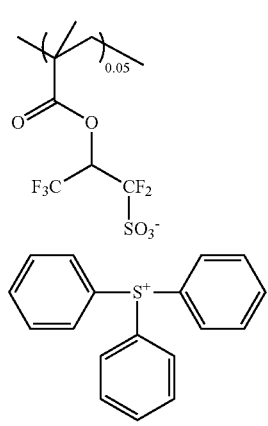
Resist Polymer 18
 Mw=6,300
 Mw/Mn=1.91
Polymer 18
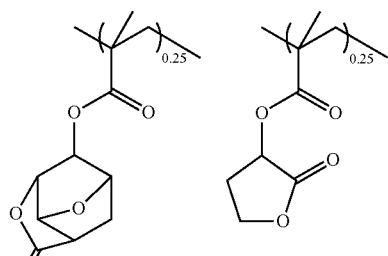
Resist Polymer 19
 Mw=8,300
 Mw/Mn=1.99
Polymer 19
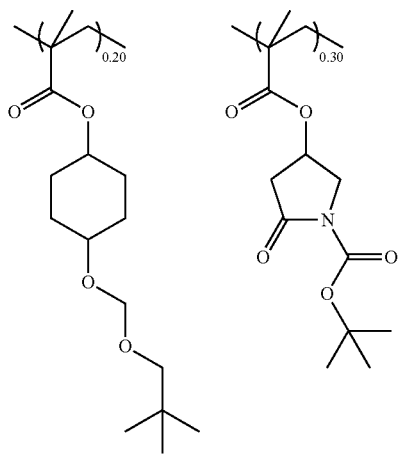

-continued
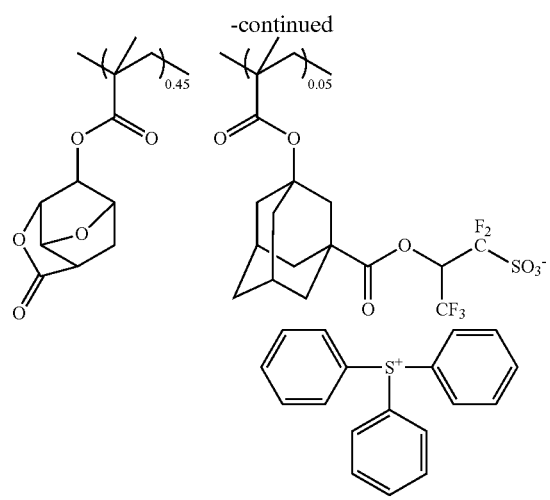
Resist Polymer 20
Mw=8,600
Mw/Mn=1.66
Polymer 20
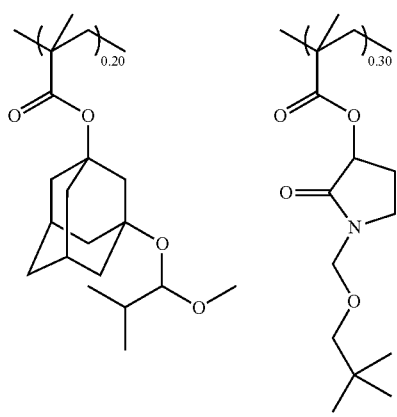
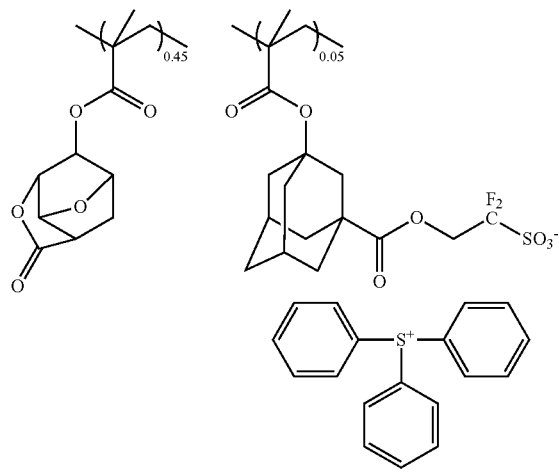
Resist Polymer 21
Mw=8,100
Mw/Mn=1.72
Polymer 21
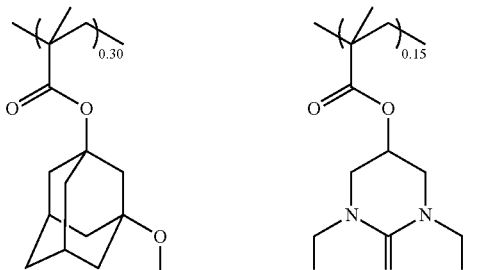
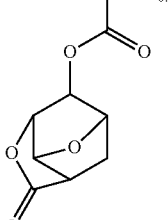
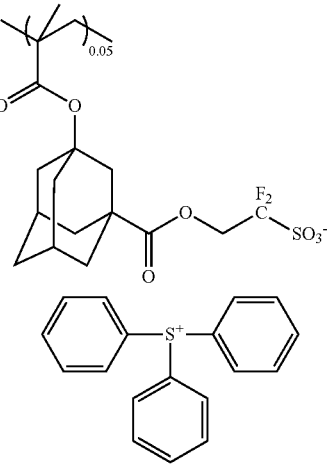
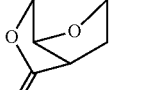
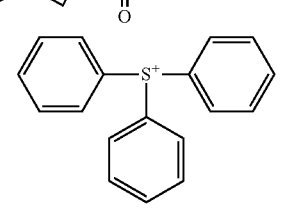
Resist Polymer 22
Mw=8,700
Mw/Mn=1.87
Polymer 22
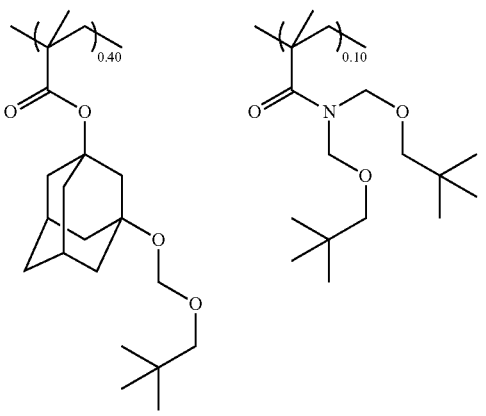

-continued
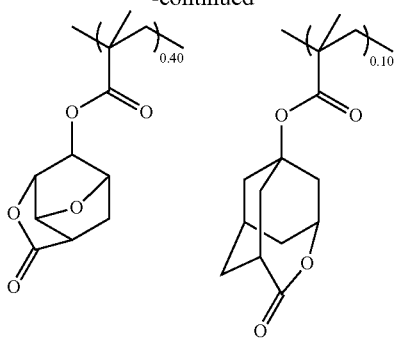
Resist Polymer 23
 Mw=8,700
 Mw/Mn=1.87
Polymer 23
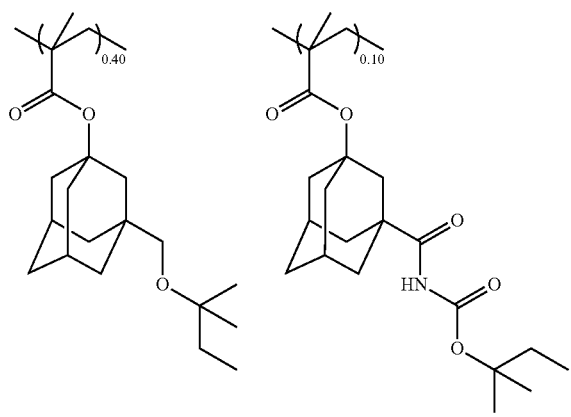
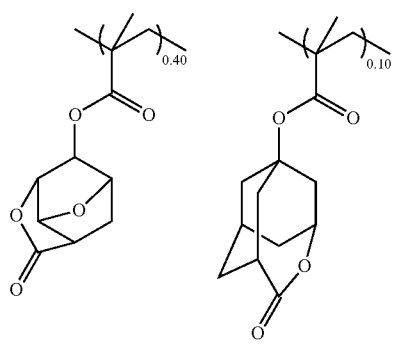
Comparative Resist Polymer 1
 Mw=8,100
 Mw/Mn=1.88
Comparative Polymer 1
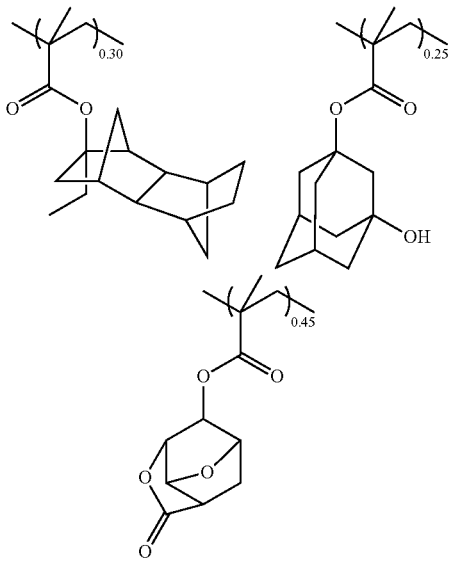
Comparative Resist Polymer 2
 Mw=7,900
 Mw/Mn=1.93
Comparative Polymer 2
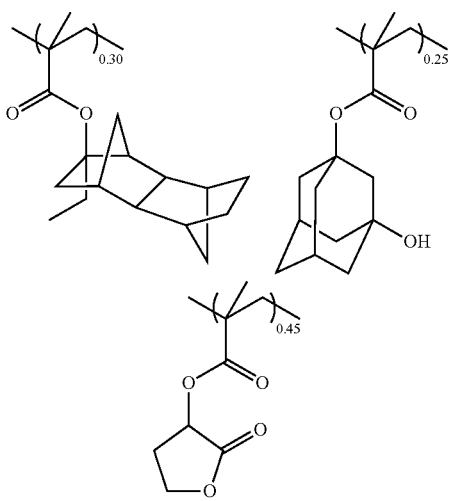

Comparative Resist Polymer 3
Mw=8,800
Mw/Mn=1.76

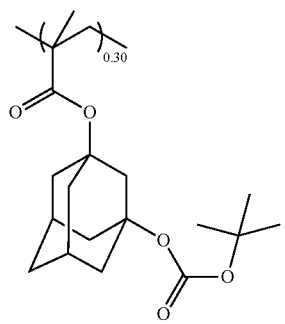
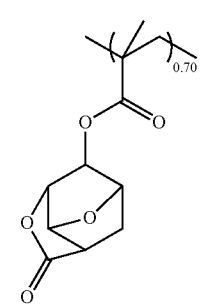

Comparative Polymer 3

Preparation of Positive Resist Composition and Alkali-soluble Protective Film-forming Composition A resist solution was prepared by dissolving a polymer (Polymers 1 to 23 or Comparative Polymers 1 to 3) and components in a solvent in accordance with the formulation of Table 1 and filtering through a Teflon® filter with a pore size of 0.2 μm. A protective film-forming solution TC-1 was prepared by dissolving TC Polymer 1 in a solvent in accordance with the formulation of Table 2 and filtering through a 0.2-μm filter.

The components in Tables 1 and 2 are identified below.

Acid generators: PAG1, PAG2, and PAG3 of the structural formulae below

PAG 1

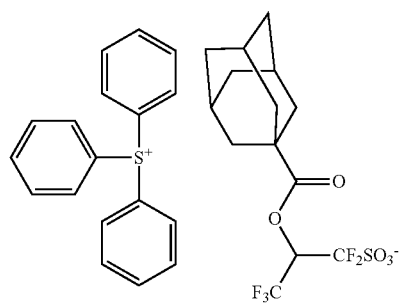

PAG 2

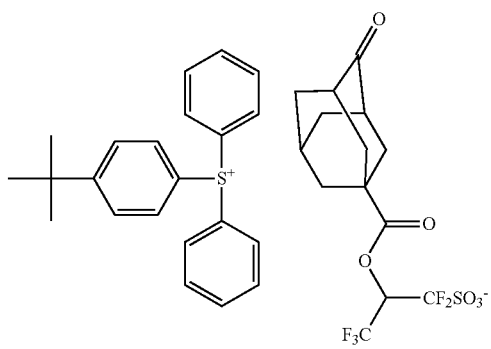

PAG 3

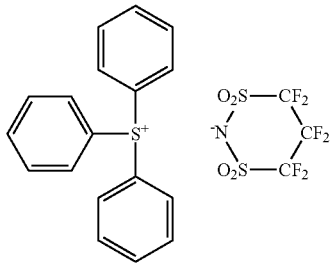

TC Polymer 1
Mw=8,800
Mw/Mn=1.69

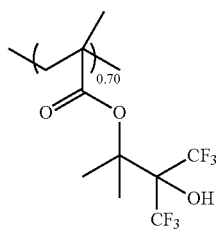
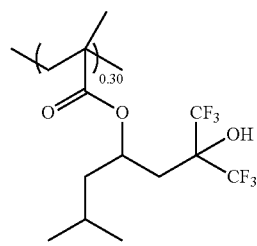

Water-repellent Polymer 1
Mw=8,700
Mw/Mn=1.82

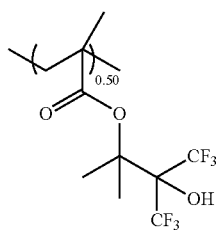
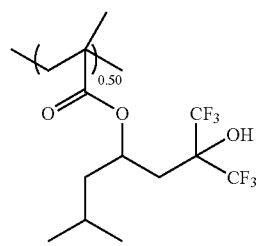

Basic compounds: Quencher 1 and Quencher 2 of the structural formulae below

Quencher 1

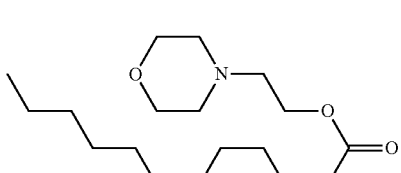

Quencher 2

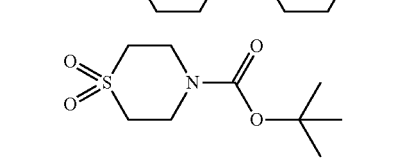

Organic Solvents:
PGMEA (propylene glycol monomethyl ether acetate)
CyH (cyclohexanone)

ArF Lithography Patterning Test 1

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 1 was spin coated, then baked on a hot plate at 100° C. for 60 seconds to form a resist film of 100 nm thick. The protective film-forming composition TC-1 shown in Table 2 was spin coated on the resist film and baked at 90° C. for 60 seconds to form a protective film (or topcoat) of 50 nm thick. In Examples 1-16 to 1-26 and Comparative Example 1-4, the protective film was omitted.

Figure 15:
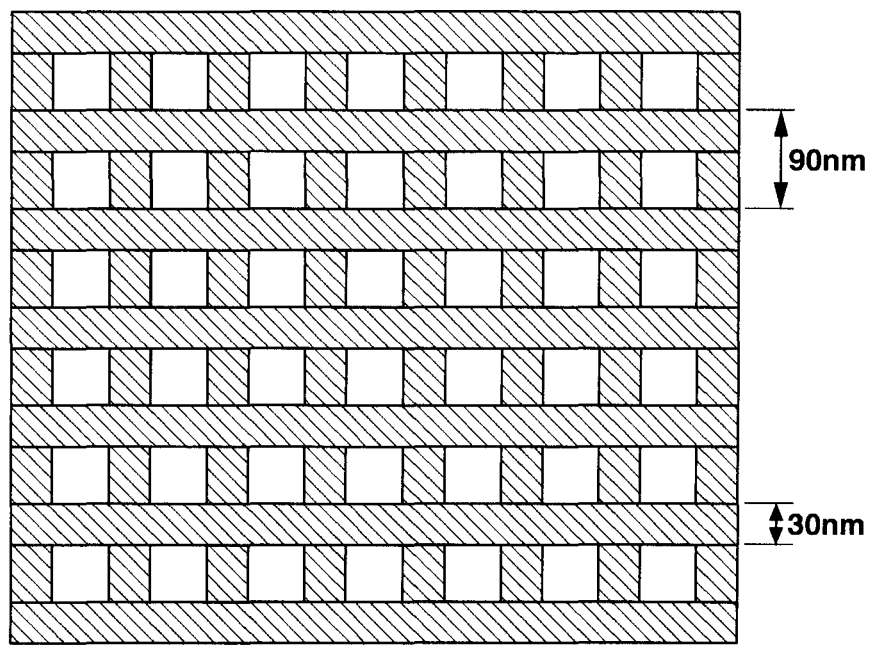
FIG. 15 illustrates a mask bearing a lattice-like pattern, used in ArF lithography patterning test 1.

Using an ArF excimer laser immersion lithography scanner NSR-610C (Nikon Corp., NA 1.30, σ 0.98/0.78, cross-pole opening 20 deg., azimuthally polarized illumination), exposure was performed in a varying dose through a 6% halftone phase shift mask bearing a lattice-like pattern with a pitch of 90 nm and a line width of 30 nm (on-wafer size) whose layout is shown in FIG. 15. After the exposure, the wafer was baked (PEB) at the temperature shown in Table 3 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of 50 holes was measured, from which a size variation 3σ was determined. The results are shown in Table 3.

TABLE 1

|  |  | Polymer (pbw) | Acid generator (pbw) | Basic compound (pbw) | Additive (pbw) | Organic solvent (pbw) |
|---|---|---|---|---|---|---|
| Resist | 1 | Polymer 1 (100) | PAG 1 (12.5) | Quencher 1 (1.10) | — | PGMEA(2,000) CyH(500) |
|  | 2 | Polymer 2 (100) | PAG 1 (12.5) | Quencher 1 (1.10) | — | PGMEA(2,000) CyH(500) |
|  | 3 | Polymer 3 (50) Comparative Polymer 1 (50) | PAG 1 (12.5) | Quencher 1 (1.20) | — | PGMEA(2,000) CyH(500) |
|  | 4 | Polymer 4 (100) | PAG 1 (12.5) | Quencher 1 (1.20) | — | PGMEA(2,000) CyH(500) |
|  | 5 | Polymer 5 (100) | PAG 1 (12.5) | Quencher 1 (1.10) | — | PGMEA(2,000) CyH(500) |
|  | 6 | Polymer 6 (100) | PAG 2 (12.5) | Quencher 1 (1.10) | — | PGMEA(2,000) CyH(500) |
|  | 7 | Polymer 7 (100) | PAG 2 (12.5) | Quencher 1 (1.10) | — | PGMEA(2,000) CyH(500) |
|  | 8 | Polymer 8 (50) Comparative Polymer 1 (50) | PAG 2 (12.5) | Quencher 1 (1.10) | — | PGMEA(2,000) CyH(500) |
|  | 9 | Polymer 9 (100) | PAG 2 (12.5) | Quencher 1 (1.10) | — | PGMEA(2,000) CyH(500) |
|  | 10 | Polymer 10 (100) | — | Quencher 1 (1.10) | — | PGMEA(2,000) CyH(500) |
|  | 11 | Polymer 11 (100) | — | Quencher 1 (1.10) | — | PGMEA(2,000) CyH(500) |
|  | 12 | Polymer 12 (100) | PAG 2 (12.5) | Quencher 1 (1.10) | — | PGMEA(2,000) CyH(500) |
|  | 13 | Polymer 13 (100) | PAG 2 (12.5) | Quencher 1 (1.10) | — | PGMEA(2,000) CyH(500) |
|  | 14 | Polymer 13 (80) Comparative Polymer 1 (20) | PAG 2 (12.5) | Quencher 1 (1.10) | Water-repellent Polymer 1 (5.0) | PGMEA(2,000) CyH(500) |
|  | 15 | Polymer 1 (50) Polymer 3 (50) | PAG 2 (12.5) | Quencher 2 (0.82) | Water-repellent Polymer 1 (5.0) | PGMEA(2,000) CyH(500) |
|  | 16 | Polymer 14 (100) | PAG 2 (12.5) | Quencher 1 (1.10) | Water-repellent Polymer 1 (5.0) | PGMEA(2,000) CyH(500) |
|  | 17 | Polymer 15 (100) | — | Quencher 1 (1.10) | Water-repellent Polymer 1 (5.0) | PGMEA(2,000) CyH(500) |
|  | 18 | Polymer 16 (100) | — | Quencher 1 (0.80) | Water-repellent Polymer 1 (5.0) | PGMEA(2,000) CyH(500) |
|  | 19 | Polymer 17 (100) | — | Quencher 1 (1.10) | Water-repellent Polymer 1 (5.0) | PGMEA(2,000) CyH(500) |
|  | 20 | Polymer 18 (100) | — | Quencher 1 (1.10) | Water-repellent Polymer 1 (5.0) | PGMEA(2,000) CyH(500) |
|  | 21 | Polymer 19 (100) | — | Quencher 1 (1.10) | Water-repellent Polymer 1 (5.0) | PGMEA(2,000) CyH(500) |
|  | 22 | Polymer 20 (100) | — | Quencher 1 (1.10) | Water-repellent Polymer 1 (5.0) | PGMEA(2,000) CyH(500) |
|  | 23 | Polymer 21 (100) | — | Quencher 1 (1.10) | Water-repellent Polymer 1 (5.0) | PGMEA(2,000) CyH(500) |
|  | 24 | Polymer 22 (100) | PAG 3 (9.5) | Quencher 1 (1.10) | Water-repellent Polymer 1 (5.0) | PGMEA(2,000) CyH(500) |
|  | 25 | Polymer 23 (100) | PAG 3 (9.5) | Quencher 1 (1.10) | Water-repellent Polymer 1 (5.0) | PGMEA(2,000) CyH(500) |
| Comparative Resist | 1 | Comparative Polymer 1 (100) | PAG 2 (12.5) | Quencher 1 (1.50) | — | PGMEA(2,000) CyH(500) |
|  | 2 | Comparative Polymer 2 (100) | PAG 2 (12.5) | Quencher 1 (1.50) | — | PGMEA(2,000) CyH(500) |
|  | 3 | Comparative Polymer 3 (100) | PAG 2 (12.5) | Quencher 1 (1.50) | — | PGMEA(2,000) CyH(500) |

TABLE 1-continued

| | Polymer (pbw) | Acid generator (pbw) | Basic compound (pbw) | Additive (pbw) | Organic solvent (pbw) |
|---|---|---|---|---|---|
| 4 | Comparative Polymer 3 (100) | PAG 2 (12.5) | Quencher 1 (1.50) | Water-repellent Polymer 1 (5.0) | PGMEA(2,000) CyH(500) |

TABLE 2

| Protective Film | Polymer (pbw) | Additive (pbw) | Organic solvent (pbw) |
|---|---|---|---|
| TC-1 | TC Polymer 1 (100) | tri-n-octylamine (0.5) | diisoamyl ether (2,700) 2-methyl-1-butanol (270) |

TABLE 3

| | | Resist | Protective film | PEB temp. (° C.) | Dose (mJ/cm$^2$) | Hole size variation 3σ (nm) |
|---|---|---|---|---|---|---|
| Example | 1-1 | Resist 1 | TC-1 | 95 | 45 | 2.5 |
| | 1-2 | Resist 2 | TC-1 | 95 | 50 | 2.3 |
| | 1-3 | Resist 3 | TC-1 | 95 | 52 | 2.2 |
| | 1-4 | Resist 4 | TC-1 | 100 | 50 | 2.1 |
| | 1-5 | Resist 5 | TC-1 | 90 | 55 | 2.5 |
| | 1-6 | Resist 6 | TC-1 | 95 | 42 | 2.8 |
| | 1-7 | Resist 7 | TC-1 | 105 | 58 | 2.6 |
| | 1-8 | Resist 8 | TC-1 | 110 | 55 | 3.1 |
| | 1-9 | Resist 9 | TC-1 | 105 | 44 | 2.8 |
| | 1-10 | Resist 10 | TC-1 | 100 | 40 | 2.8 |
| | 1-11 | Resist 11 | TC-1 | 105 | 46 | 2.8 |
| | 1-12 | Resist 12 | TC-1 | 105 | 42 | 2.7 |
| | 1-13 | Resist 13 | TC-1 | 100 | 40 | 2.6 |
| | 1-14 | Resist 14 | TC-1 | 95 | 42 | 2.8 |
| | 1-15 | Resist 15 | TC-1 | 95 | 42 | 2.6 |
| | 1-16 | Resist 14 | — | 95 | 43 | 3.0 |
| | 1-17 | Resist 15 | — | 95 | 43 | 2.9 |
| | 1-18 | Resist 16 | — | 95 | 36 | 3.1 |
| | 1-19 | Resist 17 | — | 95 | 45 | 2.8 |
| | 1-20 | Resist 18 | — | 95 | 39 | 3.3 |
| | 1-21 | Resist 19 | — | 95 | 44 | 2.7 |
| | 1-22 | Resist 20 | — | 100 | 42 | 3.0 |
| | 1-23 | Resist 21 | — | 90 | 44 | 2.8 |
| | 1-24 | Resist 22 | — | 90 | 33 | 2.6 |
| | 1-25 | Resist 23 | — | 90 | 33 | 2.5 |
| | 1-26 | Resist 24 | — | 90 | 31 | 2.1 |
| | 1-27 | Resist 25 | — | 95 | 33 | 2.4 |
| Comparative Example | 1-1 | Comparative Resist 1 | TC-1 | 110 | 50 | 5.8 |
| | 1-2 | Comparative Resist 2 | TC-1 | 105 | 56 | 5.2 |
| | 1-3 | Comparative Resist 3 | TC-1 | 110 | 44 | 3.8 |
| | 1-4 | Comparative Resist 4 | — | 110 | 44 | 5.1 |

ArF Lithography Patterning Test 2

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 4 was spin coated, then baked on a hot plate at 100° C. for 60 seconds to form a resist film of 100 nm thick. The protective film-forming composition TC-1 shown in Table 2 was spin coated on the resist film and baked at 90° C. for 60 seconds to form a protective film (or topcoat) of 50 nm thick.

Figure 16:
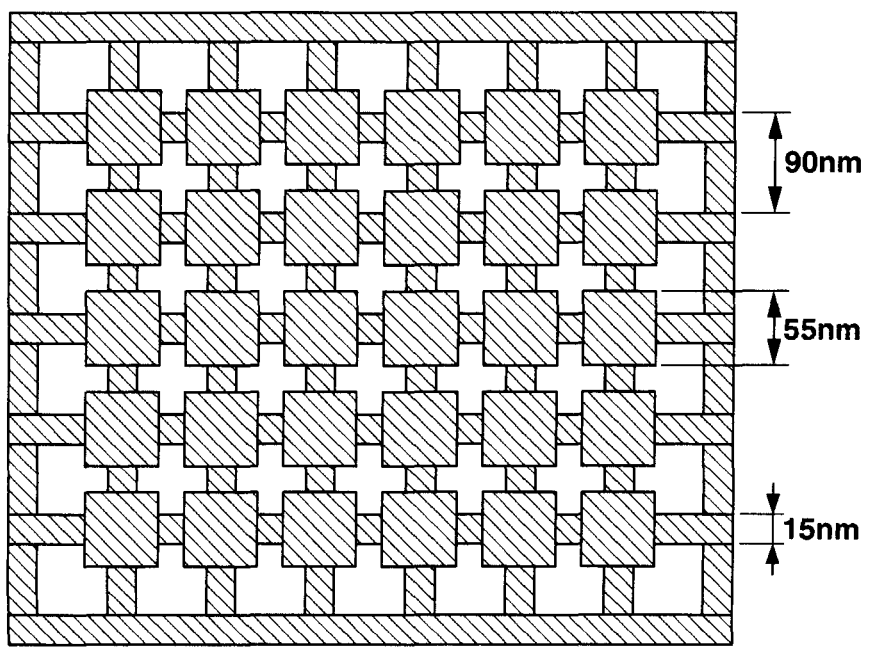
FIG. 16 illustrates a mask bearing a lattice-like pattern with dots disposed at intersections, used in ArF lithography patterning tests 2 and 4.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a lattice-like pattern with a pitch of 90 nm and a line width of 15 nm (on-wafer size) having dots disposed at intersections, whose layout is shown in FIG. 16, while the dose and focus were varied. After the exposure, the wafer was baked (PEB) at the temperature shown in Table 4 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 4.

TABLE 4

| | Resist | PEB temp. (° C.) | Dose (mJ/cm$^2$) | DOF (nm) | Hole size variation 3σ (nm) |
|---|---|---|---|---|---|
| Example 2-1 | Resist 1 | 95 | 62 | 120 | 2.0 |
| Example 2-2 | Resist 2 | 95 | 68 | 130 | 2.1 |
| Comparative Example 2-1 | Comparative Resist 1 | 110 | 66 | 40 | 4.6 |
| Comparative Example 2-2 | Comparative Resist 2 | 105 | 68 | 30 | 5.0 |
| Comparative Example 2-3 | Comparative Resist 3 | 110 | 66 | 90 | 3.7 |

ArF Lithography Patterning Test 3

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 5 was spin coated, then baked on a hot plate at 100° C. for 60 seconds to form a resist film of 100 nm thick. The protective film-forming composition TC-1 shown in Table 2 was spin coated on the resist film and baked at 90° C. for 60 seconds to form a protective film (or topcoat) of 50 nm thick.

Figure 17:
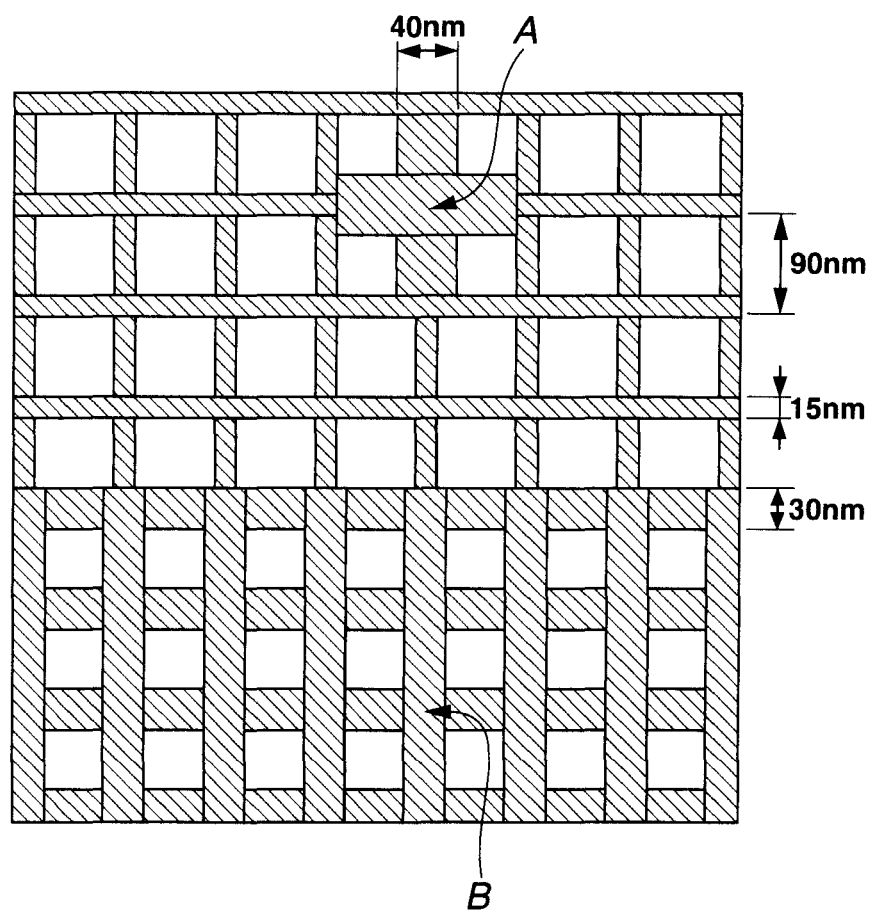
FIG. 17 illustrates a mask bearing a lattice-like pattern with thick gratings disposed on gratings, used in ArF lithography patterning test 3.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a lattice-like pattern with a pitch of 90 nm (on-wafer size) having thick gratings disposed on gratings whose layout is shown in FIG. 17, while the dose was varied. After the exposure, the wafer was baked (PEB) at the temperature shown in Table 5 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes at positions A and B on the mask (FIG. 17) was measured. The results are shown in Table 5.

TABLE 5

| Resist | PEB temp. (° C.) | Dose (mJ/cm²) | Hole size at A (nm) | Hole size at B (nm) |
|---|---|---|---|---|
| Example 3-1 | Resist 1 | 95 | 62 | 40 | 41 |
| Example 3-2 | Resist 2 | 95 | 66 | 39 | 40 |
| Comparative Example 3-1 | Comparative Resist 1 | 110 | 66 | 25 | 51 |
| Comparative Example 3-2 | Comparative Resist 2 | 105 | 69 | 22 | 50 |
| Comparative Example 3-3 | Comparative Resist 3 | 110 | 65 | 30 | 46 |

ArF Lithography Patterning Test 4

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 6 was spin coated, then baked on a hot plate at 100° C. for 60 seconds to form a resist film of 100 nm thick. The protective film-forming composition TC-1 shown in Table 2 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a lattice-like pattern with a pitch of 90 nm and a line width of 15 nm (on-wafer size) having dots disposed at intersections, whose layout is shown in FIG. 16, while the dose was varied. The same area was subjected to two consecutive exposures by X and Y dipole illuminations. After the exposure, the wafer was baked (PEB) at the temperature shown in Table 6 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 6.

TABLE 6

| Resist | PEB temp. (° C.) | Dose (mJ/cm²) | DOF (nm) | Hole size variation 3σ (nm) |
|---|---|---|---|---|
| Example 4-1 | Resist 1 | 95 | 22 | 140 | 1.8 |
| Example 4-2 | Resist 2 | 95 | 24 | 140 | 1.9 |
| Comparative Example 4-1 | Comparative Resist 1 | 110 | 33 | 30 | 3.6 |
| Comparative Example 4-2 | Comparative Resist 2 | 105 | 35 | 20 | 3.0 |
| Comparative Example 4-3 | Comparative Resist 3 | 110 | 38 | 80 | 2.9 |

ArF Lithography Patterning Test 5

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 7 was spin coated, then baked on a hot plate at 100° C. for 60 seconds to form a resist film of 100 nm thick. The protective film-forming composition TC-1 shown in Table 2 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ 0.98/0.78, cross-pole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. After the exposure, the wafer was baked (PEB) at the temperature shown in Table 7 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 7.

TABLE 7

| Resist | PEB temp. (° C.) | Dose (mJ/cm²) | DOF (nm) | Hole size variation 3σ (nm) |
|---|---|---|---|---|
| Example 5-1 | Resist 1 | 95 | 48 | 100 | 2.9 |
| Example 5-2 | Resist 2 | 95 | 52 | 95 | 2.9 |
| Comparative Example 5-1 | Comparative Resist 1 | 110 | 59 | 15 | 5.6 |
| Comparative Example 5-2 | Comparative Resist 2 | 105 | 62 | 10 | 5.0 |
| Comparative Example 5-3 | Comparative Resist 3 | 110 | 65 | 60 | 4.9 |

ArF Lithography Patterning Test 6

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 8 was spin coated, then baked on a hot plate at 100° C. for 60 seconds to form a resist film of 100 nm thick. The protective film-forming composition TC-1 shown in Table 2 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two consecutive exposures by X and Y dipole illuminations. After the exposure, the wafer was baked (PEB) at the temperature shown in Table 8 for 60 seconds and developed. Specifically, butyl acetate was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid.

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 8.

TABLE 8

| | Resist | PEB temp. (° C.) | Dose (mJ/cm$^2$) | DOF (nm) | Hole size variation 3σ (nm) |
|---|---|---|---|---|---|
| Example 6-1 | Resist 1 | 95 | 21 | 105 | 2.0 |
| Example 6-2 | Resist 2 | 95 | 23 | 100 | 2.0 |
| Comparative Example 6-1 | Comparative Resist 1 | 110 | 28 | 20 | 3.4 |
| Comparative Example 6-2 | Comparative Resist 2 | 105 | 30 | 15 | 2.9 |
| Comparative Example 6-3 | Comparative Resist 3 | 110 | 31 | 70 | 2.8 |

ArF Lithography Patterning Test 7

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 9 was spin coated, then baked on a hot plate at 100° C. for 60 seconds to form a resist film of 100 nm thick. The protective film-forming composition TC-1 shown in Table 2 was spin coated on the resist film and baked at 90° C. for 60 seconds to form a protective film (or topcoat) of 50 nm thick.

Using an ArF excimer laser immersion lithography scanner NSR-610C (Nikon Corp., NA 1.30, σ 0.98/0.78, dipole opening 20 deg., azimuthally polarized illumination), exposure was performed through a 6% halftone phase shift mask bearing a dot pattern with a pitch of 90 nm and a width of 55 nm (on-wafer size) whose layout is shown in FIG. 7, while the dose was varied. The same area was subjected to two consecutive exposures by X and Y dipole illuminations. After the exposure, the wafer was baked (PEB) at the temperature shown in Table 9 for 60 seconds and developed. Specifically, the solvent shown in Table 9 was injected from a development nozzle while the wafer was spun at 30 rpm for 3 seconds, which was followed by stationary puddle development for 27 seconds. The wafer was rinsed with diisoamyl ether, spin dried, and baked at 100° C. for 20 seconds to evaporate off the rinse liquid. In Example 7-9, the developer contained 200 ppm of a fluorochemical surfactant FC-4430 (3M-Sumitomo Co., Ltd.).

A hole pattern resulted from image reversal by solvent development. By observation under TDSEM S-9380, the size of holes was measured, from which a focus margin affording a size of 40 nm±5 nm was determined as DOF. The size of 50 holes within a shot of the same dose and the same focus was measured, from which a size variation 3σ was determined. The results are shown in Table 9.

TABLE 9

| | | Resist | PEB temp. (° C.) | Dose (mJ/cm$^2$) | Developer | DOF (nm) | Hole size variation 3σ (nm) |
|---|---|---|---|---|---|---|---|
| Example | 7-1 | Resist 1 | 95 | 22 | 2-heptanone | 105 | 2.0 |
| | 7-2 | Resist 1 | 95 | 23 | methyl benzoate | 110 | 1.9 |
| | 7-3 | Resist 1 | 95 | 21 | ethyl benzoate | 105 | 2.2 |
| | 7-4 | Resist 1 | 95 | 22 | phenyl acetate | 100 | 2.1 |
| | 7-5 | Resist 1 | 95 | 23 | benzyl acetate | 100 | 2.3 |
| | 7-6 | Resist 1 | 95 | 23 | methyl phenylacetate | 100 | 2.2 |
| | 7-7 | Resist 1 | 95 | 23 | methyl benzoate:butyl acetate = 6:4 | 100 | 2.3 |
| | 7-8 | Resist 1 | 95 | 23 | methyl benzoate:2-heptanone = 5:5 | 100 | 2.1 |
| | 7-9 | Resist 1 | 95 | 22 | methyl benzoate (FC-4430 200 ppm) | 110 | 1.9 |

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application Nos. 2011-005442 and 2011-186781 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A pattern forming process comprising the steps of applying a resist composition comprising a polymer comprising recurring units having a nitrogen atom bonded to an acid labile group, an acid generator, and an organic solvent onto a substrate, heat treating the composition to form a resist film, exposing the resist film to high-energy radiation to define exposed and unexposed regions, heat treating, and developing the exposed film with an organic solvent developer to form a negative pattern wherein the unexposed region of film is dissolved and the exposed region of film is not dissolved, wherein said polymer comprises recurring units (a1) represented by the general formula (1):

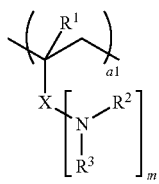
(1)

wherein $R^1$ is hydrogen or methyl,
$R^2$ is hydrogen, an acid labile group or a straight, branched or cyclic $C_1$-$C_{16}$ alkyl group,
$R^3$ is an acid labile group,
X is —C(=O)—O—$R^4$—,
$R^4$ is a cyclic $C_3$-$C_{10}$ alkylene group or $R^4$ is a naphthylene group,
m is 1 and a1 is a number in the range: 0<a1≤1.0.

2. The process of claim 1 wherein the nitrogen atom bonded to an acid labile group constitutes a carbamate group.

3. The process of claim 1 wherein in addition to the recurring units having a nitrogen atom bonded to an acid labile group, the polymer comprises recurring units having an acid labile group-substituted carboxyl group and/or an acid labile group-substituted hydroxyl group.

4. The process of claim 1 wherein in addition to the polymer comprising recurring units having a nitrogen atom bonded to an acid labile group, the composition comprises another polymer comprising recurring units having an acid labile group-substituted carboxyl group and/or an acid labile group-substituted hydroxyl group.

5. The process of claim 3 wherein the recurring units having an acid labile group-substituted carboxyl group or an acid labile group-substituted hydroxyl group are recurring units (b) or (c) represented by the general formula (2):

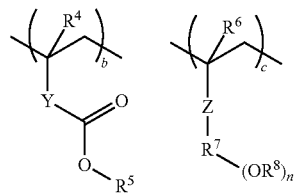
(2)

wherein $R^4$ and $R^6$ each are hydrogen or methyl,
$R^5$ and $R^8$ each are an acid labile group,
Y is a single bond or —C(=O)—O—$R^9$—,
$R^9$ is a straight, branched or cyclic $C_1$-$C_{10}$ alkylene group which may contain an ether or ester moiety, or a naphthylene group,
Z is a single bond or —C(=O)—O—,
$R^7$ is a straight, branched or cyclic $C_1$-$C_{15}$ alkylene group or a trivalent form of the alkylene group with one hydrogen eliminated, which may contain an ether or ester moiety, or a naphthylene group or a trivalent form of the naphthylene group with one hydrogen eliminated,
n is 1 or 2, b and c are numbers in the range: 0≤b<1.0, 0≤c<1.0, and 0<b+c<1.0.

6. The process of claim 1 wherein the developer comprises at least one solvent selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

7. The process of claim 1 wherein the step of exposing the resist film to high-energy radiation includes ArF excimer laser lithography of 193 nm wavelength or EUV lithography of 13.5 nm wavelength.

8. The process of claim 7 wherein the pattern formed by development is a trench pattern.

9. The pattern forming process of claim 1, comprising the steps of applying the resist composition onto a substrate, heat treating the composition to form a resist film, forming a protective film on the resist film, exposing the resist film to high-energy radiation to define exposed and unexposed regions, heat treating, and applying a developer to the coated substrate to dissolve away the protective film and to form a negative pattern wherein the unexposed region of resist film is dissolved and the exposed region of resist film is not dissolved.

10. A resist composition comprising a polymer, an acid generator, and an organic solvent, said polymer comprising recurring units (a1) having a nitrogen atom bonded to an acid labile group, represented by the general formula (1):

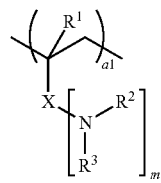
(1)

wherein R¹ is hydrogen or methyl, R² is hydrogen, an acid labile group or a straight, branched or cyclic $C_1$-$C_{16}$ alkyl group, R³ is an acid labile group, X is —C(=O)—O—R⁴—, R⁴ is a cyclic $C_3$-$C_{10}$ alkylene group, or R⁴ is a naphthylene group, m is 1 and a1 is a number in the range: 0<a1≤1.0, said resist composition forming a resist film which is subject to exposure and development with at least one developer selected from the group consisting of 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate.

11. The resist composition of claim 10 wherein said polymer further comprises recurring units (b) or (c) represented by the general formula (2):

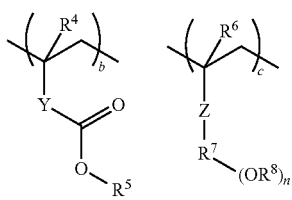

(2)

wherein R⁴ and R⁶ each are hydrogen or methyl,

R⁵ and R⁸ each are an acid labile group,

Y is a single bond or —C(=O)—O—R⁹—,

R⁹ is a straight, branched or cyclic $C_1$-$C_{10}$ alkylene group which may contain an ether or ester moiety, or a naphthylene group, Z is a single bond or —C(=O)—O—, R⁷ is a straight, branched or cyclic $C_1$-$C_{15}$ alkylene group or a trivalent form of the alkylene group with one hydrogen eliminated, which may contain an ether or ester moiety, or a naphthylene group or a trivalent form of the naphthylene group with one hydrogen eliminated, n is 1 or 2, b and c are numbers in the range: 0≤b<1.0, 0≤c<1.0, and 0<b+c<1.0.

12. A pattern forming process comprising the steps of applying a resist composition comprising a polymer comprising recurring units having a nitrogen atom bonded to an acid labile group, an acid generator, and an organic solvent onto a substrate, heat treating the composition to form a resist film, exposing the resist film to ArF excimer laser of 193 nm wavelength by using a mask bearing a dotted-shielding pattern to define exposed and unexposed regions, heat treating, and developing the exposed film with an organic solvent developer to form a negative pattern wherein the unexposed region of film is dissolved and the exposed region of film is not dissolved, whereby a pattern of holes is formed at the dots after development, wherein said polymer comprises recurring units (a1) represented by the general formula (1):

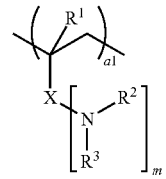

(1)

wherein R¹ is hydrogen or methyl,

R² is hydrogen, an acid labile group or a straight, branched or cyclic $C_1$-$C_{16}$ alkyl group, or may bond with X to form a non-aromatic ring, R³ is an acid labile group, X is a single bond, or —C(=O)—O—R⁴—, R⁴ is a cyclic $C_3$-$C_{10}$ alkylene group or R⁴ is a naphthylene group, m is 1 and a1 is a number in the range: 0<a1≤1.0.

13. The process of claim 12 wherein the mask bearing a dotted-shielding pattern is a halftone phase shift mask having a transmittance of 3 to 15%.

14. The process of claim 12 wherein the mask used is a phase shift mask including a lattice-like first shifter having a line width equal to or less than a half pitch and a second shifter arrayed on the first shifter and consisting of dots whose on-wafer size is 2 to 100 nm thicker than the line width of the first shifter, whereby a pattern of holes is formed only where the thick shifter is arrayed.

15. A patern forming process comprising the steps of applying a resist composition comprising a polymer comprising recurring units having a nitrogen atom bonded to an acid labile group, an acid generator, and an organic solvent onto a substrate, heat treating the composition to form a resist film, exposing the resist film to ArF excimer laser of 193 nm wavelength by using a mask bearing a lattice-like light-shielding pattern to define exposed and unexposed regions, heat treating, and developing the exposed film with an organic solvent developer to form a negative pattern wherein the unexposed region of film is dissolved and the exposed region of film is not dissolved, whereby a pattern of holes is formed at the intersections between gratings of the pattern, wherein said polymer comprises recurring units (a1) represented by the general formula (1):

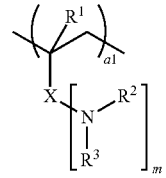

(1)

wherein R¹ is hydrogen or methyl,

R² is hydrogen, an acid labile group or a straight, branched or cyclic $C_1$-$C_{16}$ alkyl group, or may bond with X to form a non-aromatic ring, R³ is an acid labile group, X is a single bond, or —C(=O)—O—R⁴—, R⁴ is a cyclic $C_3$-$C_{10}$ alkylene group or R⁴ is a naphthylene group, m is 1 and a1 is a numbers number in the range: 0<a1 ≤1.0.

16. The process of claim 15 wherein the mask bearing a lattice-like light-shielding pattern is a halftone phase shift mask having a transmittance of 3 to 15%.

17. The process of claim 15 wherein the mask used is a phase shift mask including a lattice-like first shifter having a line width equal to or less than a half pitch and a second shifter arrayed on the first shifter and consisting of lines whose on-wafer size is 2 to 30 nm thicker than the line width of the first shifter, whereby a pattern of holes is formed only where the thick shifter is arrayed.

* * * * *